United States Patent [19]

Allison et al.

[11] Patent Number: 5,182,055
[45] Date of Patent: Jan. 26, 1993

[54] METHOD OF MAKING A THREE-DIMENSIONAL OBJECT BY STEREOLITHOGRAPHY

[75] Inventors: Joseph W. Allison, Valencia; Jan Richter, Los Angeles; Craig M. Childers, Santa Clarita; Dennis R. Smalley, Baldwin Park; Charles W. Hull, Santa Clarita; Paul F. Jacobs, La Crescenta, all of Calif.

[73] Assignee: 3D Systems, Inc., Valencia, Calif.

[21] Appl. No.: 702,031

[22] Filed: May 17, 1991

Related U.S. Application Data

[63] Continuation-in-part of Ser. No. 516,145, Apr. 27, 1990, abandoned, which is a continuation-in-part of Ser. No. 429,435, Oct. 30, 1989, Pat. No. 5,130,064, which is a continuation-in-part of Ser. No. 331,644, Mar. 31, 1989, which is a continuation-in-part of Ser. No. 269,801, Nov. 8, 1988, abandoned, which is a continuation-in-part of Ser. No. 182,830, Apr. 18, 1988, Pat. No. 5,059,359.

[51] Int. Cl.$^5$ .................. B29C 35/08; B29C 41/02
[52] U.S. Cl. ................ 264/22; 156/273.3; 156/273.5; 156/275.5; 156/290; 156/307.1; 250/492.1; 264/308; 264/DIG. 59; 395/119; 364/476; 364/522; 365/106; 365/107; 427/510; 427/581; 427/586
[58] Field of Search ............ 264/22, 308, DIG. 59; 156/272.8, 273.3, 273.5, 275.5, 290, 307.1; 427/53.1, 54.1; 250/492.1; 364/468, 476, 522; 365/106, 107, 119, 120, 126, 127; 430/327, 328, 394, 396

[56] References Cited

U.S. PATENT DOCUMENTS

| | | | |
|---|---|---|---|
| 4,575,330 | 3/1986 | Hull | 264/22 X |
| 4,863,538 | 9/1989 | Deckard | 156/272.8 X |
| 4,961,154 | 10/1990 | Pomerantz et al. | 364/522 |

FOREIGN PATENT DOCUMENTS

| | | |
|---|---|---|
| 322257 | 12/1988 | European Pat. Off. . |
| 388129 | 3/1990 | European Pat. Off. . |
| 61-225012 | 10/1986 | Japan . |
| 63-145015 | 6/1988 | Japan . |

OTHER PUBLICATIONS

Kodama, Rev. Sci. Instrum. 52(11), Nov. 1981, "Automatic Method For Fabricating A Three Dimension Plastic Model with Photo-Hardening Polymer" pp. 1770-1773.

Herbert, A. J., Journal of Imaging Technology, vol. 15, No. 4, Aug. 1989, "A Review of 3D Solid Object Generation", pp. 186-190.

Herbert, A. J. Journal of Applied Photographic Engineering, vol. 8, No. 4 pp. 185-188, Aug. 1982, "Solid Object Generation".

Requicha, A. A. G. et al. "Solid Modeling: a historical summary and contemporary assessment". Institute of Electrical and Electronics Engineers Computer Graphics and Applications. (1982, pp. 9-24).

*Primary Examiner*—Leo B. Tentoni
*Attorney, Agent, or Firm*—Lyon & Lyon

[57] ABSTRACT

An improved method for stereolithographically making an object by alternating the order in which similar sets of vectors are exposed over two or more layers. In another method, a pattern of tightly packed hexagonal tiles are drawn. Each tile is isolated from its neighboring tiles by specifying breaks of unexposed material between the tiles. Using an interrupted scan method, vectors are drawn with periodic breaks along their lengths. In another method, modulator and scanning techniques are used to reduce exposure problems associated with the acceleration and deceleration of the scanning system when jumping between vectors or changing scanning directions.

18 Claims, 23 Drawing Sheets

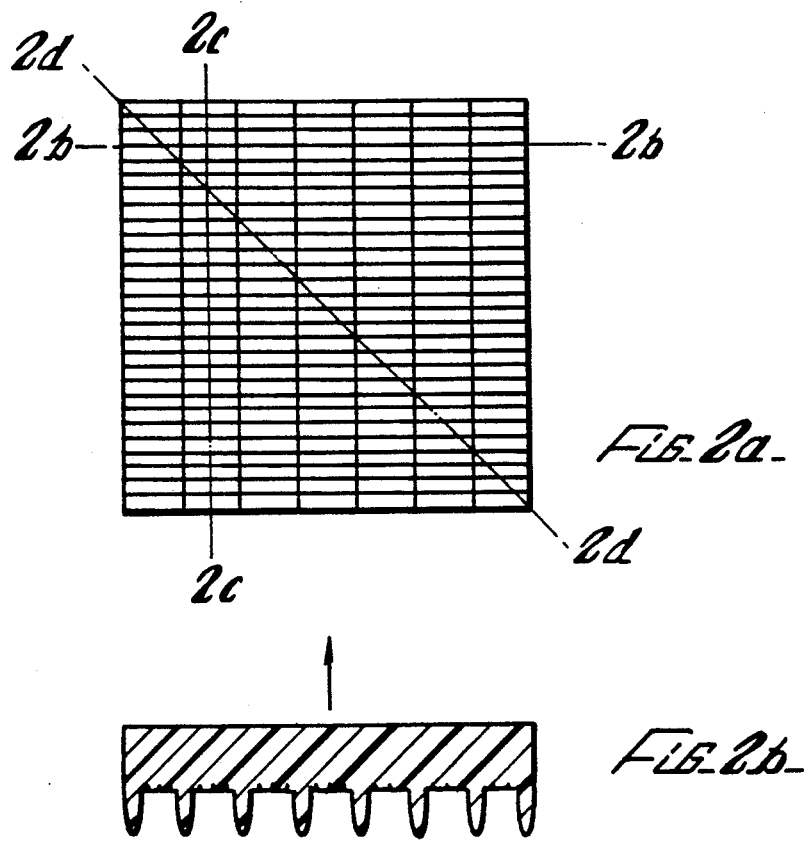
Fig. 2a.
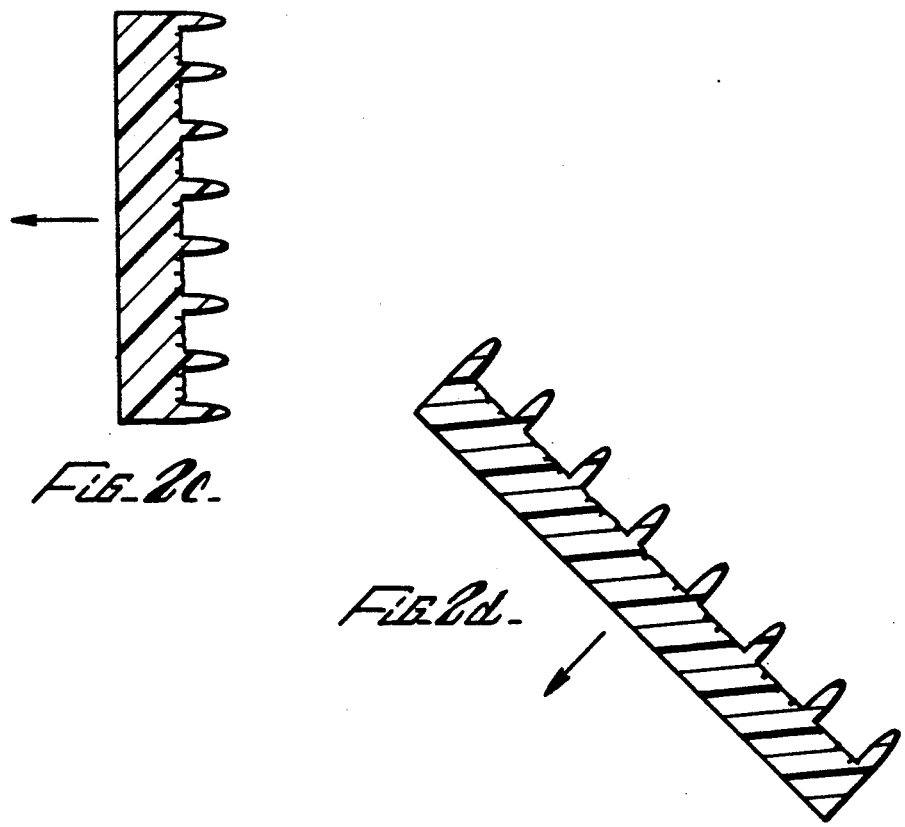
Fig. 2b.
Fig. 2c.
Fig. 2d.

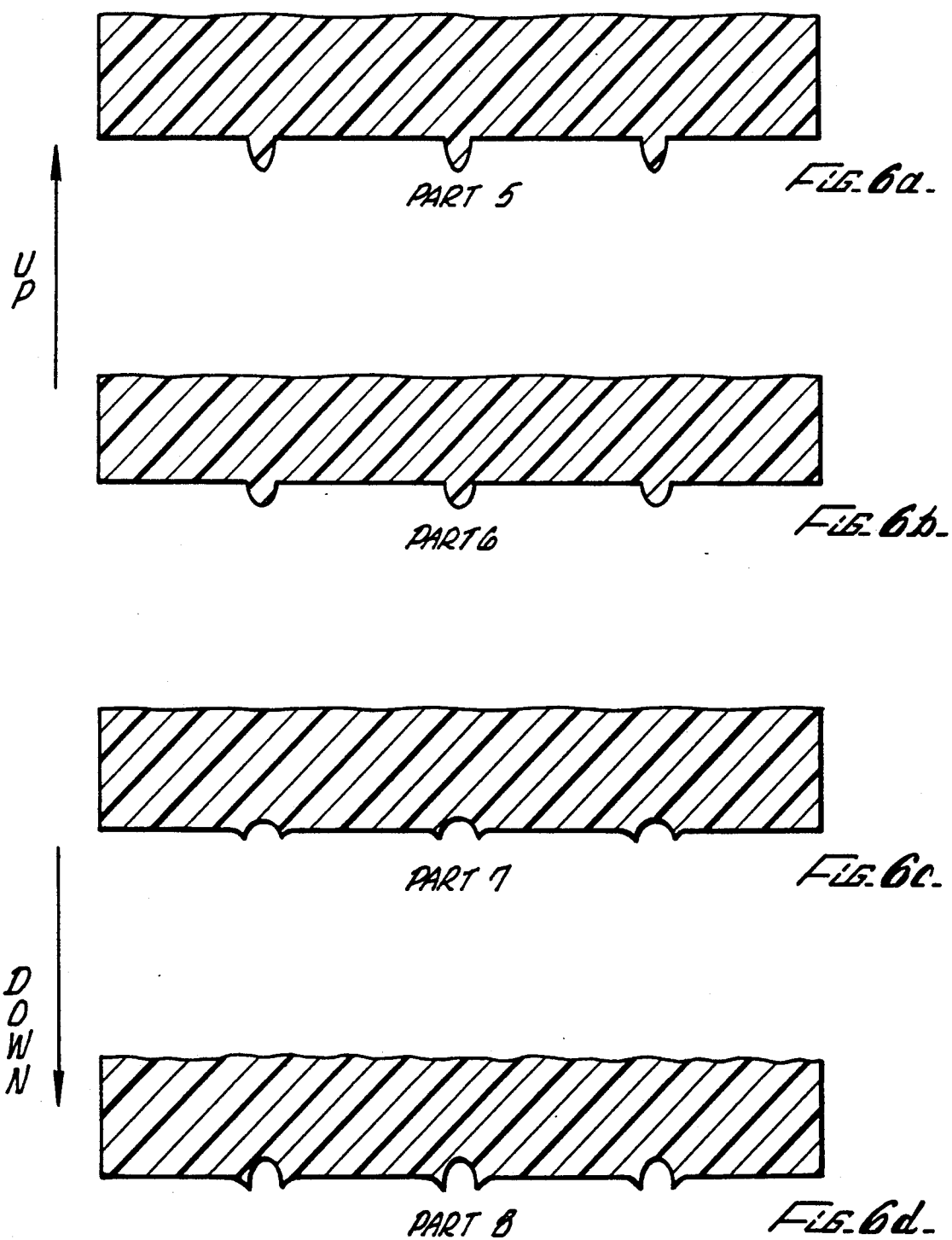

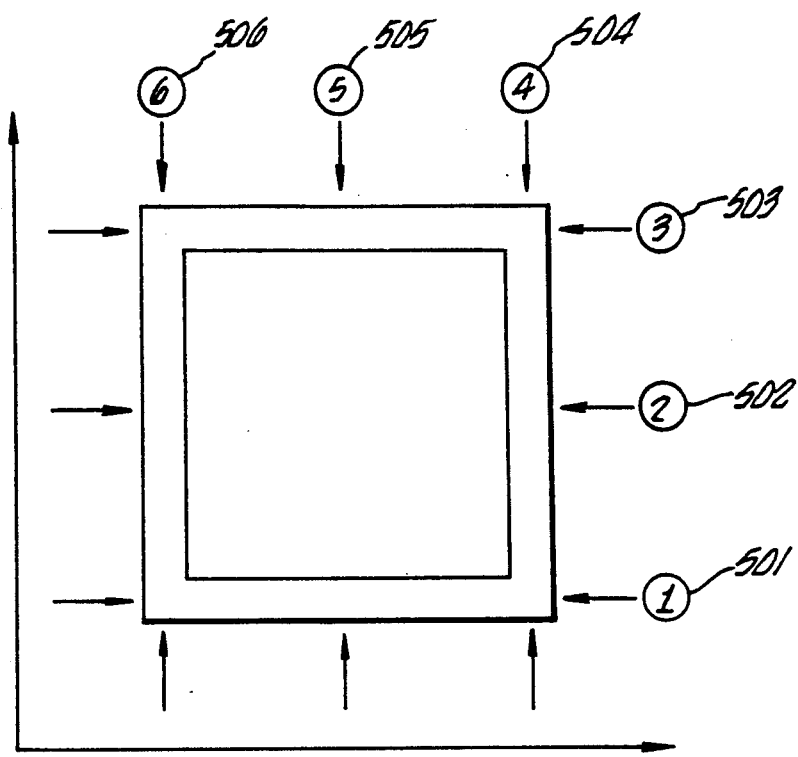
FIG. 13
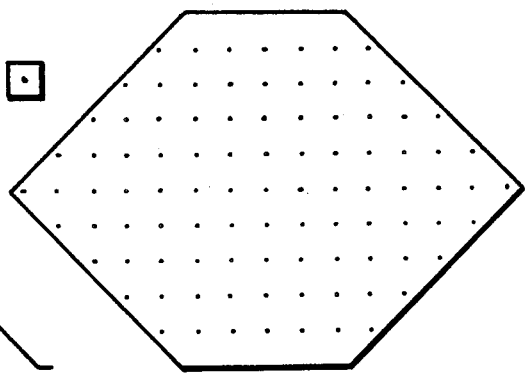
INDICATES SOLID REGIONS ▫
FIG. 14a.
FIG. 14b.
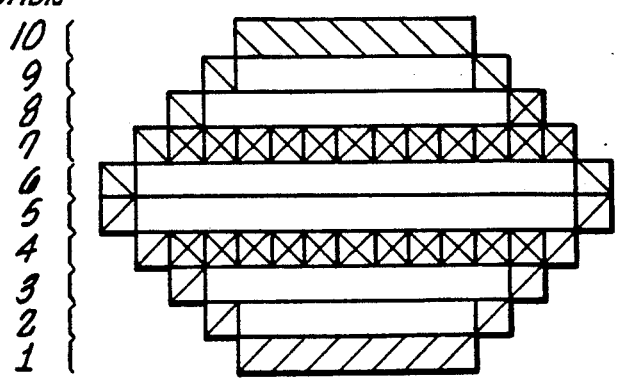
CROSS SECTION #
10
9
8
7
6
5
4
3
2
1
◨ DOWN FACING SKINNED REGIONS
◨ UP FACING SKINNED REGIONS
⊠ REGIONS SKINNED ACCORDING TO THIS EMBODIMENT

METHOD OF MAKING A THREE-DIMENSIONAL OBJECT BY STEREOLITHOGRAPHY

BACKGROUND OF THE INVENTION

This application is a continuation-in-part of PCT patent application No. PCT/US90/06293 filed Oct. 30, 1990, which is a continuation-in-part of U.S. patent application Ser. No. 07/516,145 now abandoned, which is a continuation-in-part of U.S. patent application Ser. No. 07/429,435, filed Oct. 30, 1989, now U.S. Pat. No. 5,130,064; which is in turn a continuation-in-part of U.S. patent application Ser. No. 07/331,644, filed Mar. 31, 1989, now U.S. Pat. No. 5,184,307 which is in turn a continuation-in-part of U.S. patent application Ser. No. 07/269,801, filed Nov. 8, 1988, now abandoned, which is in turn a continuation-in-part of U.S. patent application Ser. No. 07/182,830 filed Apr. 18, 1988, now U.S. Pat. No. 5,059,359.

FIELD OF THE INVENTION

This invention relates to the field of stereolithography, which is a technique for making solid, three-dimensional objects (or "parts") from solidifiable materials (e.g. fluid or fluid-like material such as photopolymers, sinterable powders, and bindable powders).

In recent years, stereolithography systems, such as those described in U.S. Pat. No. 4,575,330, issued Mar. 11, 1986 and entitled "Apparatus for Production of Three-Dimensional Objects by Stereolithography," have come into use. Basically, stereolithography is a method for automatically building complex three-dimensional parts by successively solidifying thin cross-sectional layers. These layers may be composed of photopolymer resin, powdered materials, or the like. Some types of powder materials are converted from a fluid-like medium to a cohesive cross-section by melting and solidification. The layers are solidified on top of each other consecutively until all of the thin layers ar joined together to form a whole part. Photocurable polymers change from liquid to solid upon exposure to synergistic stimulation. Many photopolymers exist whose photospeed (rate of transformation from liquid to solid) upon irradiation with ultraviolet light (UV) is fast enough to make them practical model building materials. In a preferred system, a radiation source (e.g., an ultraviolet laser) generates a beam which is focused to a small intense spot which is moved across the liquid photopolymer surface by galvanometer or servo type mirror x-y scanners. The scanners are driven by computer generated vectors or the like. The material that is not polymerized when a part is made is still functionable and remains in the vat for use as successive parts are made. With this technology, the parts are literally grown from a vat of fluid-like material (e.g. resin or powder). Specifically, the parts are grown from a thin layer near a surface of the vat of fluid-like material. In this manner precise complex three dimensional patterns can be rapidly produced. This method of fabrication is extremely powerful for quickly reducing design ideas to physical form for making prototypes.

This technology typically utilizes a stereolithography apparatus, referred to as an "SLA," which generally includes a laser and scanner, a photopolymer vat, an elevator, and a controlling computer. The SLA is programmed to automatically make a three-dimensional part by forming it as a sequence of built-up cross-sectional layers.

Stereolithography represents an unprecedented way to quickly make complex or simple parts without tooling. Since this technology depends on using a computer to generate its cross-sectional patterns, there is a natural data link to computer aided design and manufacture (CAD/CAM). However, such systems have presented challenges relating to structural stress, shrinkage, curl and other distortions, as well as resolution, speed, accuracy and difficulties in producing certain object shapes.

RELATED PATENTS AND APPLICATIONS

The following U.S. patents and U.S. Patent applications are incorporated by reference (except for material incorporated in them by reference) into this disclosure though fully set forth herein:

4,575,330
07/331,644
07/269,801, abandoned
5,059,359
07/339,246, allowed
4,999,143
5,015,424
07/429,911

U.S. patent application Ser. No. 07/331,644 describes in great detail the presently preferred stereolithographic apparatus, as well as various methods to form parts therewith. This application is incorporated herein by reference, including its appendices, as though fully set forth herein to facilitate handling due to its relatively lengthy disclosure.

U.S. Pat. No. 4,575,330 to Hull discusses stereolithography in general. It teaches complete polymerization of each cross-section in the formation of a stereolithographically-formed object.

U.S. patent application Ser. No. 07/339,246 describes several methods of reducing curl distortion.

U.S. Pat. No. 4,999,143 describes the use of web supports to support and minimize curl in a part being formed.

U.S. Pat. No. 5,015,424 describes the use of "smalleys" to minimize curl.

U.S. patent application Ser. No. 07/429,911 describes the use of multiple penetration depths in the stereolithographic process, along with the use of beam profile characteristics in combination with resin parameters to predict various cure parameters associated with the creation of stereolithographic parts. This application also describes the role of beam profile information in the creation of skin fill and discusses various multiple wavelength curing methods for reducing part distortion.

In the normal practice of stereolithography, objects or "parts" are built on a layer-by-layer basis, where each layer represents a thin cross-section of the part to be formed. Initial approaches to stereolithographic part building were based on the complete filling (e.g. substantial polymerization of all regions of a cross-section to a thickness at least as deep as the layer thickness) of layers. This filling was either done by the scanning of a pencil of light, by a focused or defocused pencil of light, or by flood exposure of an appropriate cross-sectional image. The pencil of light approach strictly used complete filling of cross-sections based on the scanning of adjacent overlapping vectors until the entire cross-sectional pattern was cured. These initial approaches suffered from several drawbacks, including distortion, curl, inaccurate sizing, lack of structural integrity, and lack of uniformity in down-facing surface appearance.

Later stereolithographic techniques used an internal lattice of partially cured building material ("cross-hatch" or "hatch") in place of completely filling the successive cross-sections. The internal structures primarily consisted of cross-hatch separated by untransformed building material (e.g. liquid photopolymer or the like). In this approach, the outer and inner edges of each layer are solidified by scanning of what are called "boundary vectors" (also termed, "boundaries" or "border vectors" or "borders"). These vectors separate the interior solid regions of a cross-section from exterior untransformed building material. Cross-sections or portions of cross-sections that bound external regions of the part are completely filled with skin fill (termed "fill" or "skin") after being cross-hatched. The hatch insured adequate support for the "skin" as it is being created, thereby minimizing distortion.

The skin, crosshatch, and borders trap untransformed building material (e.g. liquid photopolymer) internally in the part structure and hold it in place while the part is being created. The trapped untransformed building material (e.g. liquid photopolymer) and at least partially transformed building material (e.g. at least partially cured polymer) which forms the boundaries, hatch, and skin are brought to full transformation (e.g. polymerization) in a later process known as "post curing".

Fairly extensive post-curing can be required when the internal cross-hatch lattice only defines discrete x-z and y-z, planes, or the like, which are separated from each other by more than the width cured by a beam, as in such cases long vertical corridors of unpolymerized material remain substantially uncured until post-processing. It is an object of the invention to provide a method of reducing or eliminating post-processing time and associated distortions while increasing structural integrity of the stereolithographically formed part.

Stereolithographic building techniques have upon occasion resulted in down-facing features having a "wafflish" appearance and texture. This appearance and texture are due to inappropriate curing techniques being used on regions of layers that contain down-facing features. When down-facing features are given both hatch and skin fill, there can be overexposure of the regions where the hatch and fill coincide. Similarly, overexposure can occur at the points of intersection of cross-hatch vectors. In the past, it has been possible to ignore the requirement of uniform cure depth for down-facing features, since other accuracy-related errors overshadowed this effect. However, as the stereolithography art strives for and attains increasingly higher levels of accuracy, imperfections such as these can no longer be overlooked. It is an object of the invention to correct these imperfections in combination with improved building techniques.

It is also an object of the invention to obtain accurate skin thicknesses without the need of periodically building test parts and without the need of being concerned with energy distribution in the beam (beam profile). Traditionally, the methods used to estimate skin depth were only guesses that had a remote connection to actual experimental data or theoretical expectations. The actual skin thicknesses obtained by these traditional approaches were strongly dependent upon beam profile characteristics, skin vector spacing, drawing speed, and resin characteristics. However, these parameters were not coordinated to yield a particular skin thickness. For example, skin thicknesses intended to be 20 mils could easily range from 15 to 25 mils. In the past, this type of thickness range has been tolerated, but as the art of stereolithography advances, there is an increasing need for more accurate and less cumbersome methods of predicting the required exposure to obtain a desired skin thickness.

SUMMARY OF THE INVENTION

To these ends, a stereolithographic method comprises the steps of constructing stacked layers to form an object having external boundaries, internal cross hatch, and skinned up- and down-facing features. Skin fill is provided in less than all regions of the stacked layers, but in association with more than the up- and down-facing features of the object.

To these ends, all cross-sectional layers may be provided with skin fill and crosshatch.

According to another aspect of the invention, a method provides all cross-sectional layers with boundaries and unidirectional fill or multidirectional fill and no cross hatch.

According to another aspect of the invention, a method provides boundaries appropriate to each cross-section and provides cross-sections with at least two types of non-parallel hatch vectors wherein effective adhesion (that capable of transmitting significant curl) only occurs at the overlapping points between the vectors of the two hatch types. Additionally the hatch vectors of each type are spaced as close together as possible without being spaced so close that they can induce curl into adjacent vectors or have curl induced in them by adjacent vectors.

According to another aspect of the invention, a method comprises the steps of providing boundaries appropriate to each cross-section and providing cross-sections with at least two types of non-parallel hatch vectors that are offset from their corresponding types on the previous layer wherein effective adhesion between cross-sections (that capable of transmitting significant curl) only occurs near the overlapping points between the vectors of the two hatch types of the present layer. Additionally, the hatch vectors of each type are spaced as close together a possible without being spaced so close that they can induce curl into or have curl induced in them by adjacent vectors or transmit curl from one vector to another vector.

According to another aspect of the invention, each region of a cross-section that is internal to the object (i.e. not forming a down-facing or up-facing region), is cured in the form of point exposures, "bullets". The point exposures on successive layers are offset one from another, and the bullets are cured to approximately a depth of one layer thickness. The spacing of the point exposures on a single layer are as close together as is reasonable without the material cured in association with each bullet affecting the material cured in association with adjacent bullets. In this approach the up-facing and down-facing features may be formed by a variety of techniques.

According to yet another aspect of the invention, each region of a cross-section that is internal to the object (i.e. not forming a down-facing or up-facing region), is cured in the form of point exposures, "bullets", wherein the bullets are cured to a depth substantially equal to two layer thicknesses, and wherein bullets on successive layers are offset one from another. The positioning pattern is repeated every other layer, and the spacing of the bullets on each cross-section is such that their cured separation is greater than zero but less than their cure width one layer thickness below their upper surface. The bullets cured on the present layer substantially fill in the gaps left in the previous cross-section when it was formed. In this approach the up-facing and down-facing features may be formed by a variety of techniques.

According to another aspect of the invention, each region of a cross-section that is internal to the object and exists on the present cross-section as well as the $N-1$ succeeding cross-sections, is cured in the form of point exposures, "bullets". Each cross-section is divided into a pattern of slightly over-lapping bullets. These bullets are divided up into N groups where the bullets associated with successive groups are used to expose material in association with the successive cross-sections beginning with the present cross-section. Each bullet is cured to a depth substantially equal to N layer thicknesses. In this approach, regions of cross-sections within $N-2$ layers of a down-facing feature are handled by modified techniques similar to those described above, and the up-facing and down-facing features may be formed by a variety of techniques.

According to yet another aspect of the invention, at least up- and down- facing features are provided with skin fill that is created by scanning in a first pas using nonconsecutive fill vectors, followed by scanning in at least one additional pass that completes the exposing process by filling in between the originally drawn vectors.

In another aspect of the invention, regions of intersecting vectors at least in down-facing surfaces are determined, and exposure of one or more of the respective intersecting vectors at these intersecting regions is reduced, such that at least the down-facing features have a uniform exposure.

In another aspect of the invention, a region that contains a combination of hatch and fill vectors is created and cured to a uniform depth. The creation of this region comprises the steps of creating the desired hatch vectors, and then creating corresponding skin fill types that do not contribute to additional exposure of the regions of their corresponding hatch vectors.

In another aspect of the invention, an improved stereolithographic method comprises determining necessary exposure and vector spacing and scanning parameters in order to obtain a known thickness of skin fill.

In still another aspect of the invention, a stereolithographic method comprises the steps of constructing stacked layers to form an object having external boundaries, internal cross hatch, and skinned up- and down-facing features. Specifically, this method comprises the steps of: (a) selecting layers to be provided with skinned surfaces; (b) providing means for calculating the amount of total exposure required to obtain skin curing of a preselected depth at the layers selected to have skinned surfaces; (c) providing means for determining the number of vectors that will be exposing each region in the layers, and (d) providing means for at least partially transforming (e.g. polymerizing) the layers by exposing them first to boundary vectors, then to hatch vectors, and then to skin vectors, each vector providing an exposure sufficient to cure to the preselected depth calculated in step (b), divided by the number of other vectors that will intersect the vector at a given region as determined in step (c).

According to other aspects of the invention, these improvements are used in combination with one another and/or in combination with curl reduction techniques as described in: U.S. patent application Ser. No. 07/339,246; U.S. Pat. No. 5,015,424; U.S. Pat. No. 4,999,143 and the other applications cited previously all of which are fully incorporated herein by reference. For example, according to yet another aspect of the invention, an improved stereolithographic method is disclosed comprising the combined use of hatch with nonconsecutive skin fill in more than the up- and down-facing features. As another example, an improved stereolithographic method is disclosed comprising the method of reducing exposure where vectors intersect and providing discontinuities in skin fill to avoid multiple vector exposure in regions where hatch vectors have been provided.

Other aspects of the invention, together with objects and attendant advantages of the various embodiments, will best be understood from an examination of the drawings along with the detailed description below.

BRIEF DESCRIPTION OF THE DRAWINGS

FIGS. 1a-1d represent respectively: a) boundaries only; b) crosshatch only; c) skin only; and d) combined vectors.

FIGS. 2a-2d collectively show a side view of FIG. 1d as intersected by various vertical planes. FIGS. 2a-2d represent, respectively: a) repeat of FIG. 1d with vertical planes; b) a view of the edge of the layer along plane 1 showing the various depths obtained in different regions; c) a view of the edge of the layer along plane 2 showing the various depths obtained in different regions; and d) a view of the edge of the layer along plane 3 showing the various depths obtained in different regions.

FIGS. 3a-3e represent respectively: a) boundaries only; b) crosshatch only; c) skin type 1; d) skin type 2; and e) combined vectors.

FIGS. 4a-4d represent, respectively: a) repeat of FIG. 3e with vertical planes; b) a view of the edge of the layer along plane 1 showing the various depths obtained in different regions; c) a view of the edge of the layer along plane 2 showing the various depths obtained in different regions; and d) a view of the edge of the layer along plane 3 showing the various depths obtained in different regions.

FIGS. 6a-6d show down-facing surface profiles of parts made in accordance with Example IX below.

FIGS. 7a-7c show a comparison between traditional vector ordering techniques and examples of various vector ordering techniques of some of the preferred embodiments of the present invention. FIG. 7a depicts a top view of a cross-section of an object showing a consecutive drawing order for the vectors. FIG. 7b depicts the same cross-section but filled using a nonconsecutive order that fills the cross-section in two passes. FIG. 7c depicts the same cross-section but filled using a non-consecutive order that fills the cross-section in three passes.

FIGS. 8a, 8c, and 8e respectively represent top views of boundary vectors, X hatch vectors, and Y hatch vectors. FIGS. 8b, 8d, and 8f depict side views of the material cured in association with FIGS. 8a, 8c, and 8e respectively. FIG. 8g represents a top view of the combination of material cured by the individual vector types of FIGS. 8a, 8c, and 8f. FIGS. 8h and 8i represent side view of the cure depths associated with two different vertical planes intersecting the cross-section of FIG. 8g.

FIG. 9a depicts a side view of hatch being stacked on top of each other from layer to layer. FIG. 9b depicts a side view of hatch being staggered from layer to layer.

FIG. 10a depicts a top view of the boundary and bullets cured on a first cross-section. FIG. 10b depicts a top view of the boundary and bullets cured on a second cross-section. Comparison of FIGS. 10a and 10b indicate that the bullets are staggered from the first to the second layer. FIG. 10c depicts a side view of the boundaries and bullets of five cross sections stacked one on top of the other.

FIG. 13 depicts a top view of the uppermost cross-section of the part of FIG. 12, along with indications as to what measurements were made on the part; and FIGS. 14a and 14b collectively depict a side view of a CAD designed object and the object as reproduced according to the teaching of the first preferred embodiment of the present invention. FIG. 14a depicts the CAD designed object, and FIG. 14b depicts the reproduction.

FIG. 15a depicts a three-dimensional view of the part. FIG. 15b depicts a top view of the part. FIG. 15c depicts an exaggerated top view of the distortion of the part after post curing.

FIG. 16a depicts a top view of the bounded and unbounded regions of a single sample cross-section. FIG. 16b depicts a side view of three sample cross-sections of an object. FIG. 16b' depicts a side view of the subregions of the middle cross-section.

FIGS. 17a–g illustrate various patterns and shapes for tiling and the weak bending axes, if any, associated with each pattern/shape combination.

DETAILED DESCRIPTION OF THE PREFERRED EMBODIMENTS

The instant invention addresses alone or in combination four improvements in stereolithographic methods. These are, first: methods of increasing structural integrity while reducing the need for post-curing; second: methods of obtaining uniform exposure in regions of intersecting vectors of different types; third: methods of determining cure depth; and fourth: methods intended to reduce distortion due to shrinkage, curl, and post cure. Although these three aspects of the invention are closely inter-related and are often cross-dependent, they will be addressed in sequence in this detailed description, and will also be illustrated in the examples below.

DEFINITIONS

"Beam Profiles" represent the energy distribution of irradiation in a beam of ultraviolet light or the like, used to cure photopolymer or other curable material in accordance with stereolithography practices.

"Building materials" are materials that can be used in the present invention for forming three-dimensional parts. The acceptable building materials are materials that can transform from one state to another state in response to exposure to synergistic stimulation. The two states are then separable after exposure of a single layer to synergistic stimulation or separable after completion of a plurality of layers. The most preferred materials are materials that transform from a fluid-like state to a cohesive state or solid state. These materials include liquid photopolymers, sinterable powders, bindable powders or the like. Prior to exposure to appropriate synergistic stimulation (e.g. IR radiation from a Carbon Dioxide laser or the like) the sinterable powders are in a fluid-like state since the powder particles can flow past one another whereas after sintering the powder particles are joined to form a cohesive mass. Similarly the bindable powders are in a fluid-like state prior to exposure to appropriate synergistic stimulation (e.g. a chemical binder dispensed into the powder in a selective and controlled manner) whereas after exposure the binder sets and the powder (and binder) form a cohesive mass. The most preferred of the above materials for the present invention are the photopolymer type materials. Other acceptable materials include relatively solid sheets of material that are transformable from one state to another. These sheet like materials include "dry film" type photopolymer materials that can be solidified upon exposure to appropriate synergistic stimulation wherein after exposure the exposed and unexposed materials can be separated by differential solubility in an appropriate solvent.

Figure 5A:
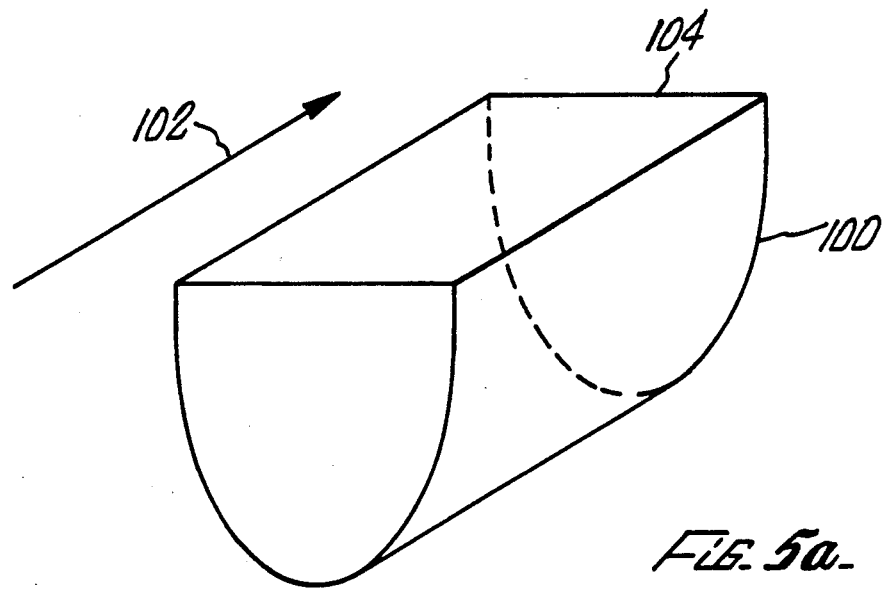
FIGS. 5a and 5b illustrate the profiles of a cured "string," corresponding to the cure produced by a single vector.
Figure 5B:
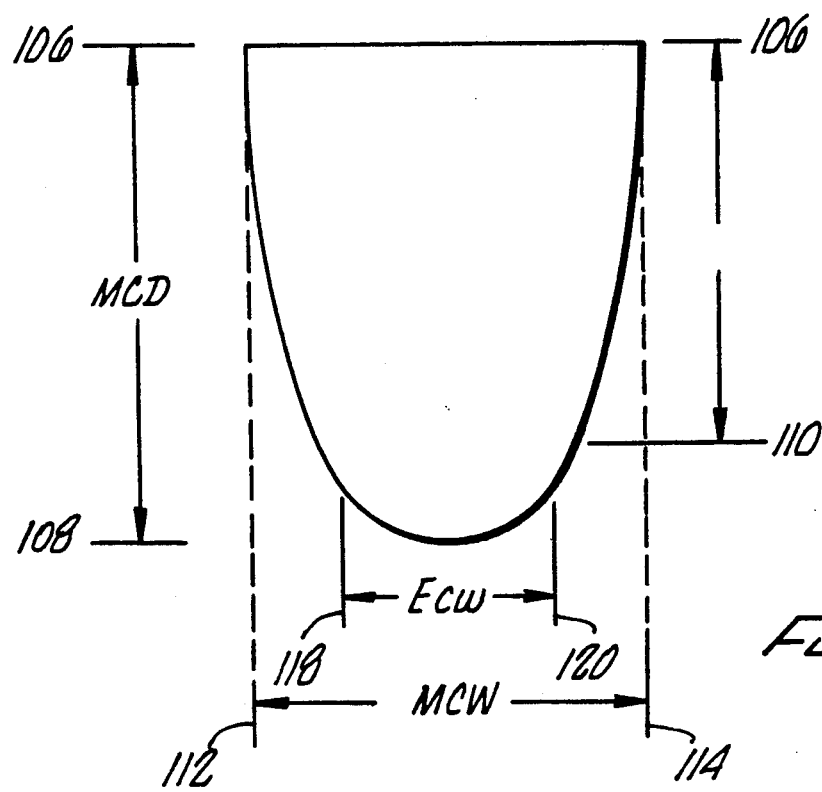
Figure 1A:
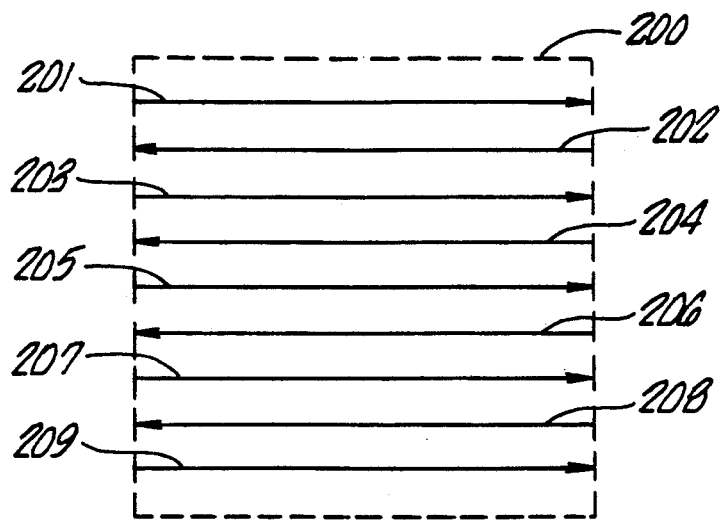
Figure 1B:
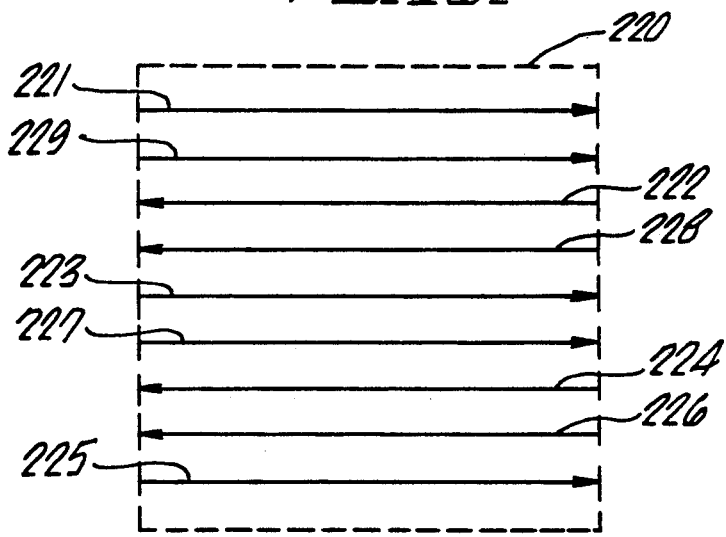
Figure 1C:
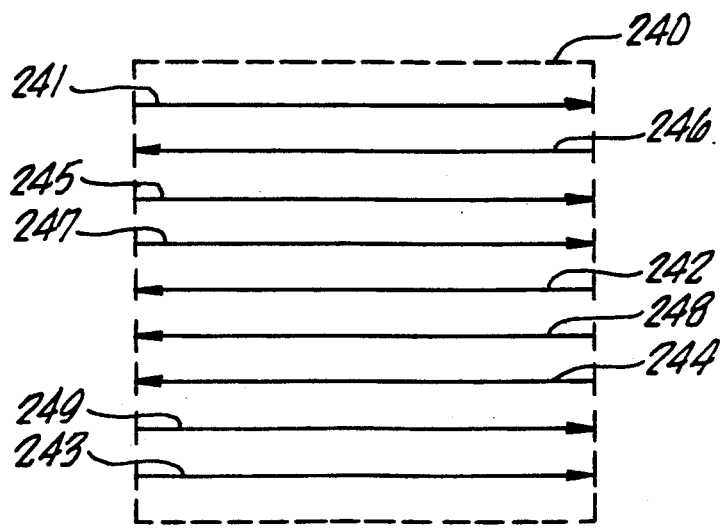

"Bullets" are volumes of a building material which are solidified in response to a beam of synergistic stimulation exposing the material in substantially single non-overlapping point irradiations. The usual shape of the cured material is similar to that of a bullet. FIG. 5b depicts a cross-sectional view of a line or vector of material cured by a beam of radiation. It can equally well be interpreted as depicting a two dimensional view of a bullet, wherein the three-dimensional bullet would be the volume of revolution formed by rotating the object about a vertical axis through its center.

"Effective Cure Width" (ECW) is a distance equal to twice the closest possible spacing of two vectors from one another that will render a given individual cure depth (i.e., a cure depth associated with each vector) without measurably increasing the cure depth of the combination. For the preferred beam profiles and cures, the Effective Cure Width (ECW) is always less than the Maximum Cure Width (MCW) (i.e., the width of the solidified string at the building material surface), such that different lines of solidified material can be adhered without an increase in cure depth. For example, in FIG. 5b, the horizontal separation between lines 118 and 120 might represent the ECW for string 100. Typically, one half the ECW represents the closest point that a similar line of material can approach string 100 without measurably increasing its maximum cure depth. More generally, the ECW is a zone that surrounds the center line of a string, such as string 100, that represents the closest position that another string (of arbitrary thickness and direction) of solidified material or set of strings of material can approach the first string without resulting in the maximum cure thickness of the combination being measurably greater than the maximum thickness of either string. As two non-parallel vectors approach an intersection point, the excess exposure point, "EEP" (the point at which the combination will cause a measurable increase in cure depth) is determined by the beam profile and angle of approach of the two vectors. If the vectors are perpendicular the excess exposure point is the ½ the ECW. If the vectors approach each other at a 45 degree angle the excess exposure point is at ½×1.414×ECW. An approximate relationship between ECW, the angle of approach, and the EEP is $$EEP = (\tfrac{1}{2}) \times ECW/SIN(A),$$

where A is the angle between the vectors. A more accurate relationship can be derived from information regarding the beam profile, the depth of cure, the building material response characteristics, and the intersection direction of the vectors.

"Layers" are the incremental thicknesses between successive cross-sections into which an object is divided. These layers form the basis for the thicknesses of building material (e.g. photopolymer). They must receive sufficient exposure to synergistic stimulation (e.g. ultraviolet light or other polymerizing radiation) to transform from their fluid-like state into a cohesive structure. The layers are constructed to adhere to one another and collectively form a solidified (e.g. polymerized or partially polymerized) stereolithographically produced part.

"Maximum Cure Depth (MCD)" and "Maximum Cure Width (MCW)" refer, respectively, to the deepest and widest cure that is obtained when exposing a single line or bullet of uncured building material to synergistic stimulation. The maximum cure depth is generally what is referred to as the cure depth of boundary and hatch lines. Since a beam of light is not generally of constant intensity across its width, the cure depth and width caused by a beam tracing across a line one or more times does not produce a uniform depth and width of cure. The maximum depth of cure generally occurs near the middle of a cross-section of the trace but it can actually occur anywhere depending on the distribution of intensity in the beam. It may also depend on the direction of scanning of the beam in forming the trace. The maximum width of cure generally occurs at the top (surface) of the cured line of material. An example of the maximum depth and width of cure are depicted in FIG. 5a which shows a line (sometimes called a string) of cure material 100. Vector 102 indicates the scanning direction used in creating the string of material 100. Surface 104 represents the solidified material that was created from the fluid-like material that formed part of the surface of the curable material. FIG. 5b represents an end-on view of string 100. Line 106 indicates the position of the top of the cured string 100, while line 108 represents the bottom of cured string. The vertical distance between 106 and 108 is the maximum cure depth of string 100. Line 112 represents the left-most edge of string 100, while line 114 represents the right-most edge of string 100. The horizontal separation between 112 and 114 is the maximum cure width of string 100. Such a string 100 of solidified building material may be used for several purposes: 1) to insure adhesion between the layer associated with its creation and the preceding layer, 2) to form a down-facing feature of a part being created, or 3) as an element of a series of such strings of cured material, where the series will be used for one of the above two purposes. An up-facing feature is not included in the above since it can be fit into one of the above categories depending on the situation. For the first purpose listed above, maximum cure depth may preferably be greater than the layer thickness. The vertical separation between line 106 and line 110 represents the layer thickness in such a case. For the second purpose the MCD represents the layer thickness, and for the third purpose the vertical separation between line 106 and line 116 might represent the layer thickness since the net thickness of the cured material might increase from the segments overlapping each other.

"Overlapping" refers to two or more exposures being given to a region so that an increase in maximum cure depth occurs. Since cure profiles are not necessarily step functions, two separately exposed areas can touch and bind to one another without changing the maximum cure depth of either. When two lines are exposed beside one another their maximum widths may overlap resulting in a larger exposure in this region, and a corresponding increase in depth. But if this additional exposure does not occur in the region near the maximum cure depth of the individual lines, their combined maximum cure depth will not generally be measurably deeper than their individual maxima. Overlapping sometimes refers to situations when two side by side exposures affect the curing of each other whether or not they result in an increase in the maximum cure depth of either one. The context in which the term "overlapping" is used will generally make its meaning clear.

"Step Period" (SP) is a part-building parameter that defines the period of time between each laser step.

"Step Size" (SS) is a part-building parameter that defines the spatial size of the step moved by the laser spot on the building material surface.

"Vectors" are data that represent the length and the direction and maybe the period of irradiation (exposure) in the process of solidifying the building material in the preferred embodiment of the present invention (e.g. a scanning beam of ultraviolet radiation, on a liquid photopolymer, or other fluid-like solidifiable medium).

"Skin" vectors are horizontal surface vectors that are typically traced from one boundary to an opposing boundary at relatively high speed and with a substantial overlap between successive vectors which are generally traced in opposite directions, and typically form "skin fill" which defines at least the upper and lower horizontal exterior surfaces of a stereolithographically-formed part in traditional stereolithography and in several of the preferred embodiments of the present invention. Typically, skin vector spacing is from about 1 to about 4 mils with a maximum cure width of a single exposed skin vector being about 14 to 15 mils. Of course, these exemplary and illustrative parameters can be varied as needed based upon such considerations as the desired smoothness of the layers, the power of the laser, the possible speed range of the irradiating source (i.e., the maximum drawing speed), the layer thickness desired, and the number of vectors that are desired to be stored. According to certain aspects of this invention, however, skin fill is provided in more than the exterior surfaces of the part. According to other aspects of the invention, skin vectors can be drawn non-consecutively and/or nonoverlapping (e.g., a first pass at 7-8 mil intervals and a subsequent pass at intervening intervals). These aspects and others are described in detail below.

"Boundary" vectors are traced to define the vertical exterior surfaces of the stereolithographically-formed part (therefore to define the range of each cross-section). These vectors generally are scanned more slowly than skin vectors such that a greater cure depth is obtained. Boundaries, unlike skin fill, generally do not rely on overlapping offset passes to attain their full cure depth. In situations where regions on a given layer overlap regions of the previously formed layer (non-down-facing regions), it is preferred that the cure depth exceed the layer thickness, so that improved adhesion between layers results. In regions of down facing features, it is preferred that net cure depth be substantially equal to the layer thickness.

"Hatch" vectors are similar to boundary vectors, except that they are traced in a substantially uniform, criss-cross type pattern, to define the internal lattice structure of the stereolithographically-formed part. Again, it is preferred that the cure depth exceed the layer thickness, if being drawn in a non-down-facing region, so that improved adhesion between layers results. If being drawn in a down-facing region, then layer thickness cure depth is preferred. In several preferred embodiments of the present invention, adhesion between layers is obtained by the extra cure depth that is obtained from the intersections of two or more crosshatch vectors wherein the cure depth of the individual hatch lines is insufficient to cause curl inducing adhesion between the layers.

"Skintinuous" in general terms describes any building technique which generates a substantially solid fill pattern over a substantial portion of the cross-sectional area of a part.

"Multipass" refers to a drawing technique which utilizes more than one pass to expose a region (e.g. a line) so that the material is substantially reacted before direct adhesion with surrounding structures takes place. The purpose of this method is to minimize pulling forces between layers and therefore to reduce curl.

"Interrupted Scan" or "Bricking" refers to scanning a vector with recurring gaps to relieve transmitted stress.

"Tiling" is an interrupted scanning technique that applies to relatively wide regions as opposed to vectors (the wide regions may be made up of vectors). This scanning results in distinct shapes which fit together very snugly but are not adhered to each other. The intention of this method is to maximize percentage of build process curing while reducing transmitted stresses that generate curl.

"Log Jam" refers to a scanning technique where some internal hatch (or fill) vectors are retracted from the layer borders to avoid adhesion, wherein after exposure of the hatch or fill an offset border or the like is scanned to attach the hatch and original border.

"Quilting" refers to a drawing technique which first partitions each layer into patches by scanning a relatively large crosshatch structure. Each patch is then treated as an individual region to be scanned. This method relieves problems that can arise when drawing relatively large regions with floating material techniques (e.g. log jam).

"Strongarm" refers to a scanning technique wherein a downfacing region is given extra exposure to make it extra rigid thereby increasing its ability to resist distortion caused by adhesion with material from the next higher layer.

"Weave" generally refers to any drawing pattern which generates a near solid fill pattern, wherein vectors on the first pass (threads) are spaced slightly further apart than the maximum cure width (MCW) and have exposures that are less than that necessary for adhesion (i.e. under cured). Adhesion is obtained on a second pass or higher order pass by cumulative exposure resulting at the intersecting regions of threads. These intersecting regions are sometimes called stitches.

"Interlace" is a particular type of "non-consecutive scanning" wherein every other vector is scanned on a first pass of a region and the other vectors are scanned on a second pass.

"Staggered" refers to a building method where different drawing patterns are used on alternating layers. For example staggered hatch refers to offsetting or shifting the hatch vectors on every other layer so that the hatch vectors on adjacent layers do not overlay each other. The intended purpose of this method is to produce a more homogeneous structure and possibly to reduce curl in some instances.

"Smalleys" refer to a building technique where holes or gaps are placed at critical locations on a given cross-section (generally implemented through the CAD design but they can be implemented from a Slice type program onto individual cross-sections). They reduce curling by interrupting the propagation of stresses from one region of a layer to another region of the layer.

"Riveting" or "Stitching" refers to an exposure technique that applies different levels of exposure to a given layer, wherein some of the exposures are less than that necessary for adhesion and some of the exposures are sufficient to cause adhesion thereby creating discrete locations of adhesion which might resemble rivets.

"Webs" are support structures that are not a portion of a desired final reproduction of a CAD designed object but they are formed along with the object by the stereolithography apparatus to give support to various features of the object and to allow easy separation of the object from the building platform.

"Up-facing and Down-facing Features of an Object" are regions or subregions on particular cross-sections that represent an upper or lower extent of the object.

Figure 16A:
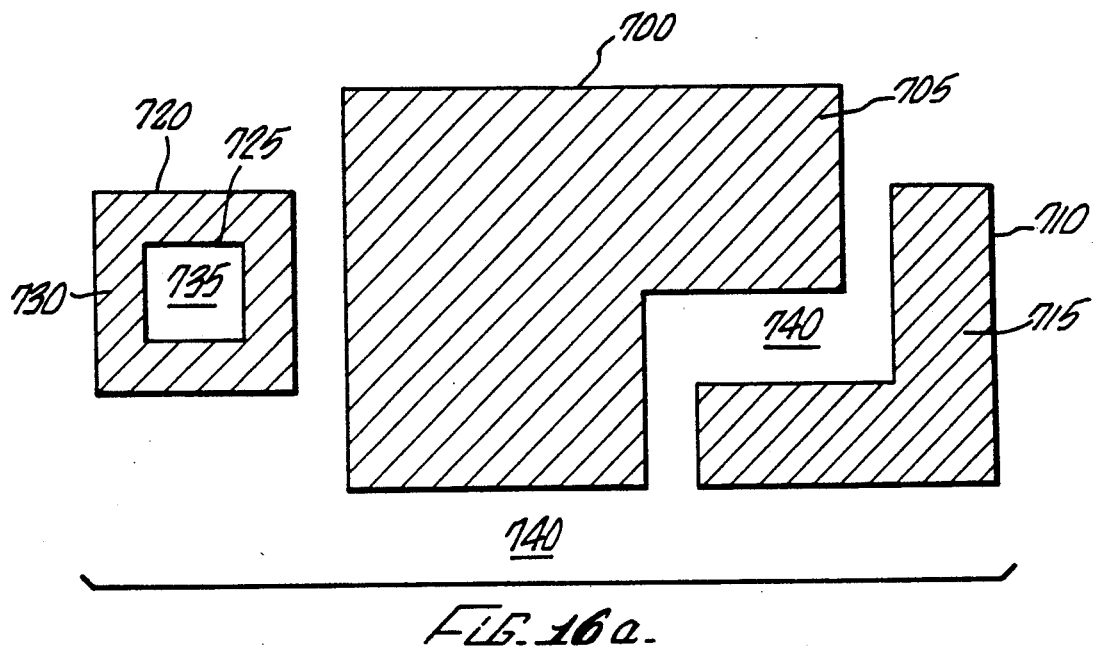
FIGS. 16a, 16b, and 16b' collectively depict sample cross-sections of an object for the purpose of distinguishing up-facing and down-facing features of an object and the relationship of such features to subregions of each cross-section.

Each cross-section is formed from a combination of bounded and unbounded regions. Bounded regions are those that form a portion of the solid structure of an object (regardless of whether the region is formed as a completely solidified region or as a cross-hatched region). Unbounded regions are those that form an empty or hollow portion of an object. These concepts are depicted in the example of FIG. 16a. FIG. 16a depicts a top view of a sample cross-section of an object. This sample cross-section can be divided into three bounded regions and two unbounded regions. Boundary 700 bounds region 705, boundary 710 bounds region 715, and boundary 720 and 725 bound region 730. Regions 735 and 740 are unbounded regions.

Figure 16B:
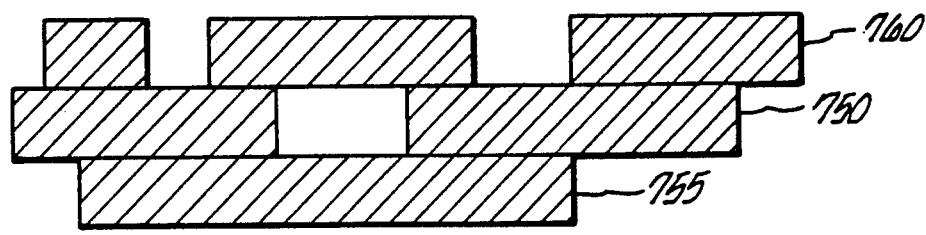
Figure 16B:
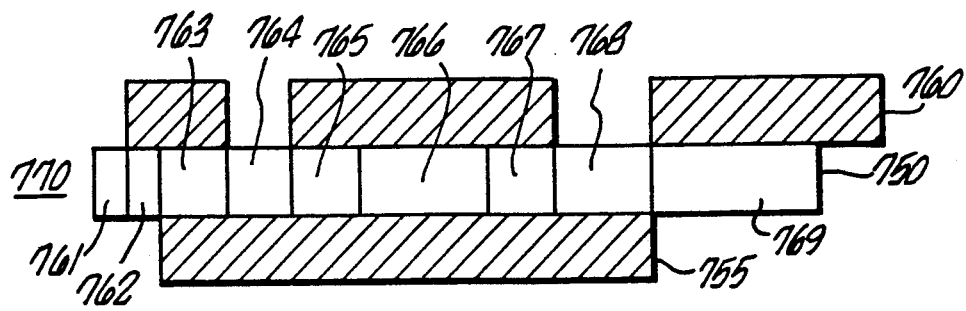
Figure 11A:
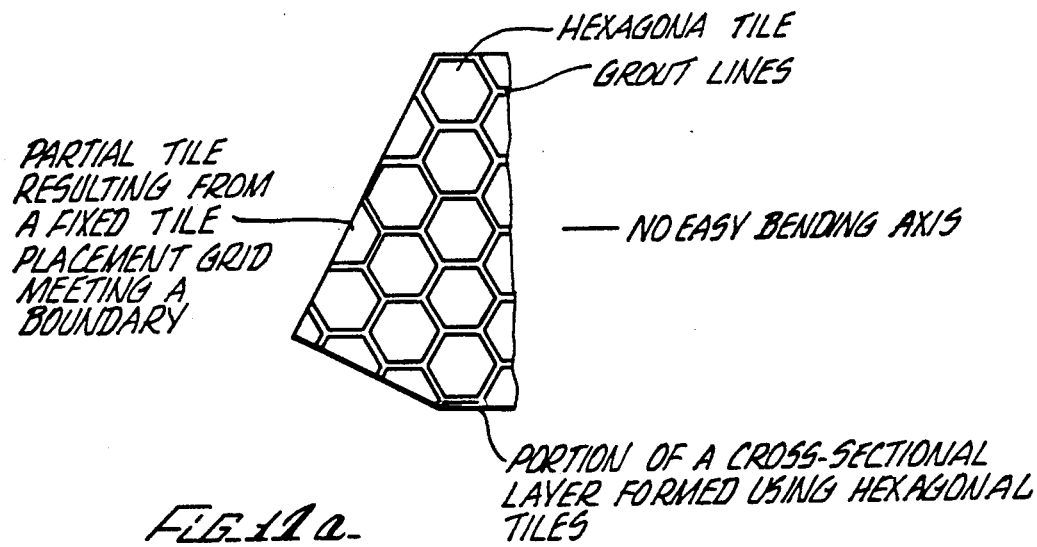
Figure 11B:
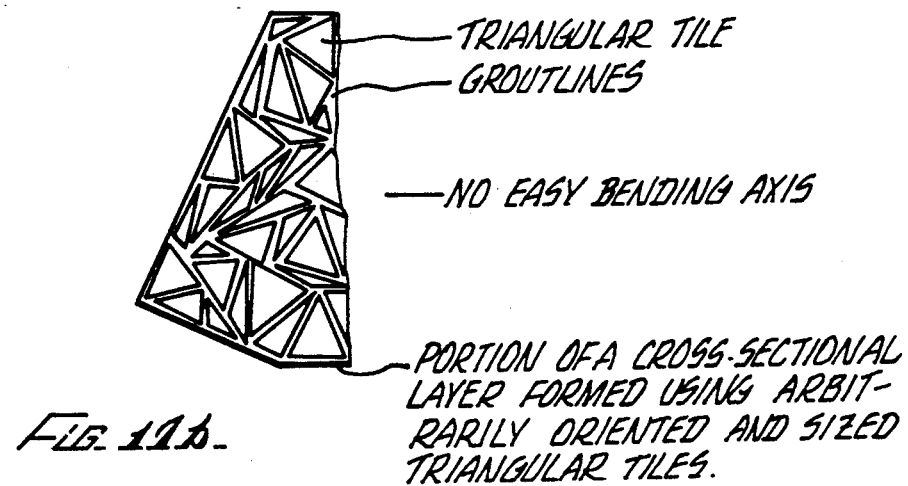
Figure 11C:
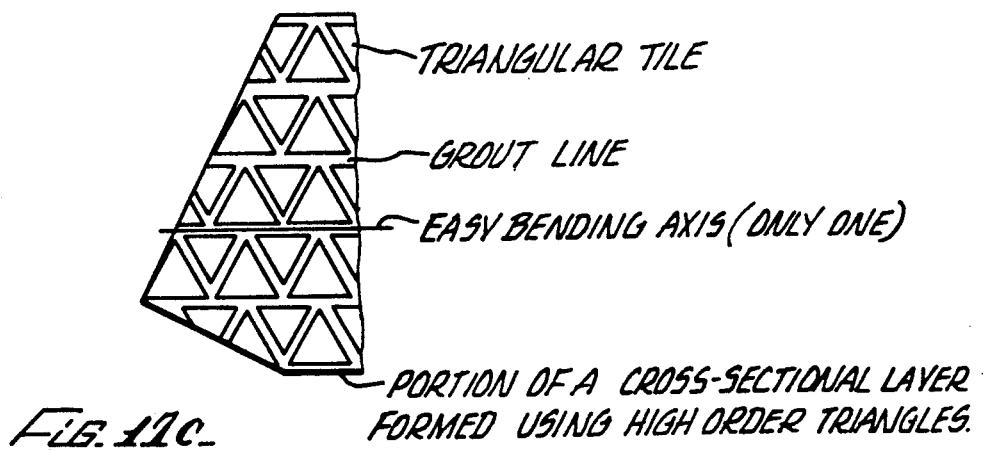
Figure 11D:
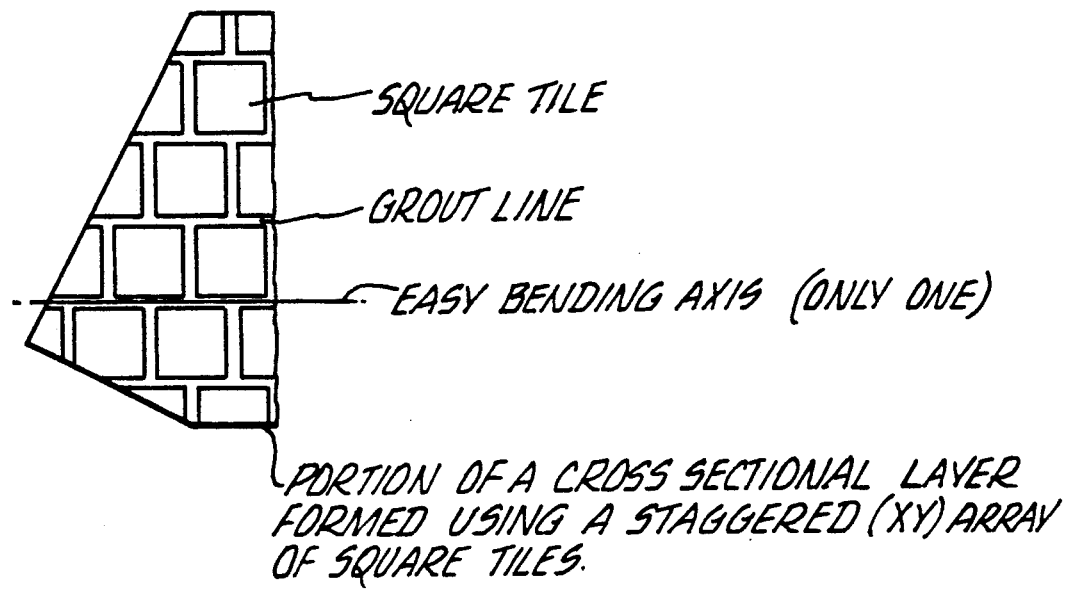
Figure 11E:
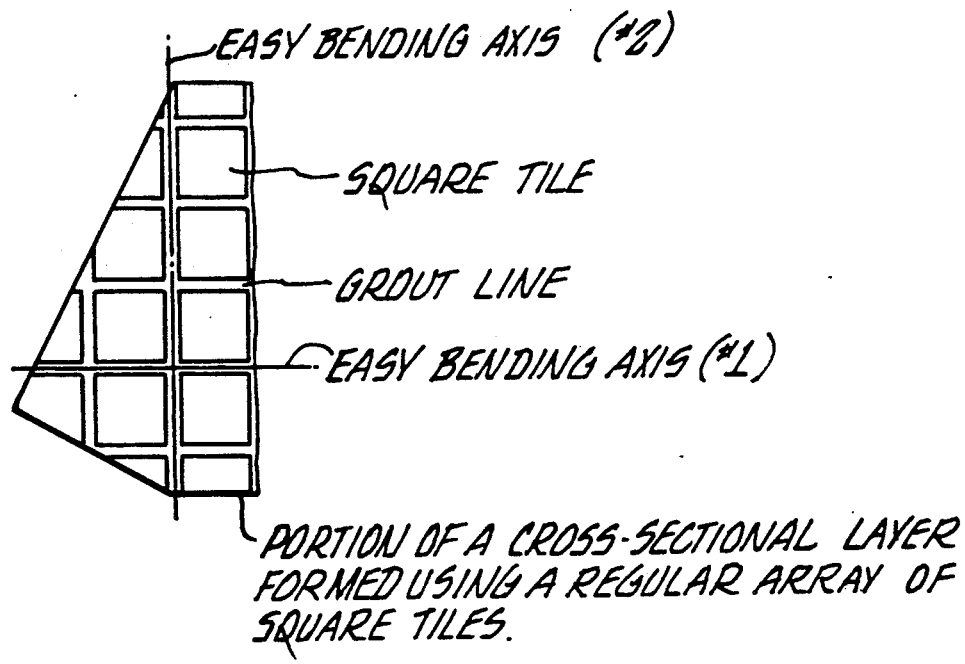
Figure 11F:
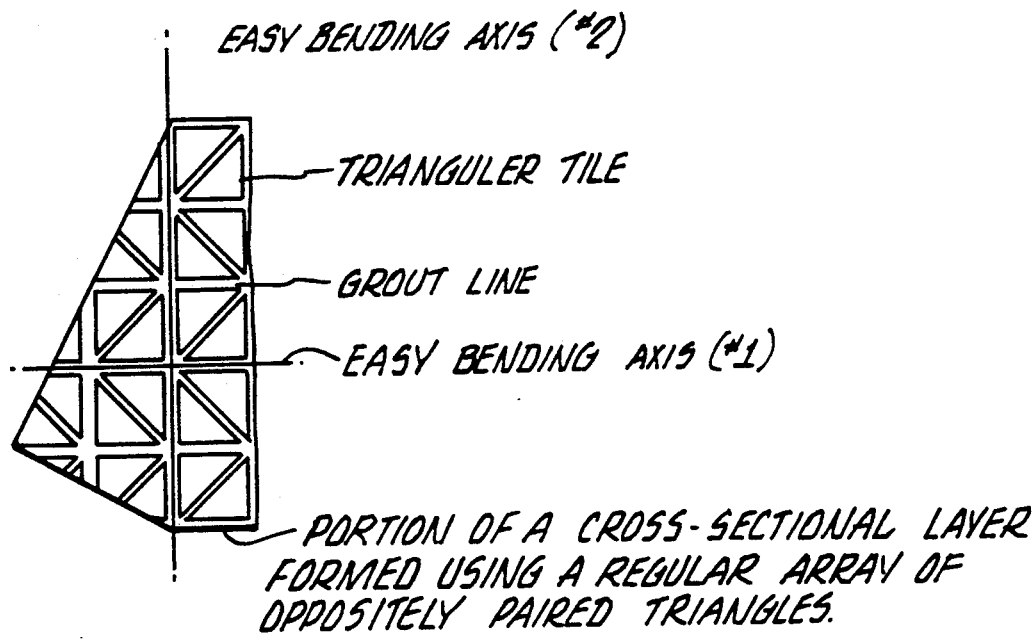
Figure 11G:
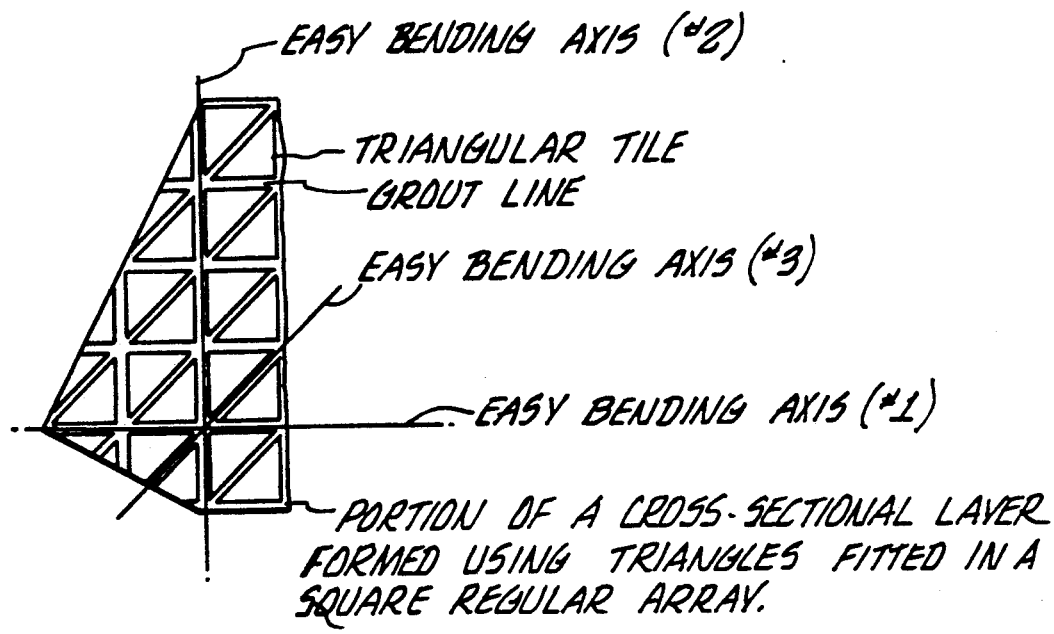

Each of the bounded regions of a cross-section may be divided into subregions, which are determined by relationships between bounded regions on a given cross-section and bounded and unbounded regions o the two adjacent (one higher and one lower) cross-sections. Up-facing regions of cross-section "i" are those bounded subregions of cross-section "i" that are underneath unbounded subregions of cross-section "i+1". The down-facing subregions of cross-section "i" are the bounded subregions of cross-section "i" which overlay unbounded subregions of cross-section "i−1". Some subregions may represent both up-facing and down-facing features; in this case the subregion is generally considered to be a down-facing subregion since appropriate curing of down-facing features is generally more critical than curing of up-facing features. This concept is depicted in the example of FIG. 16b and 16b'. Cross-section "i", 750, is above cross-section "i−1", 755, and is below cross-section "i+1", 760. FIG. 16b is a repeat of FIG. 16b but with cross-section "i", 750, divided into subregions. The up-facing bounded subregions of cross-section "i" are labeled as 761, 764 and 768. The down-facing bounded subregions of cross-section "i" are 761, 762, and 769. The bounded subregions that are neither up-facing nor down-facing are 763, 765, and 767. The unbounded regions of cross-section "i" are subregions 766 and 770. It can be seen that subregion 761 is both up-facing and down-facing and thus it would generally be processed as a down-facing feature. If a cross-section "j" is above a completely unbounded cross-section, then all of cross-section "j" is a down-facing feature (e.g., the bottom of the part). If a cross-section "j" is below a completely unbounded cross-section, cross-section "j" is an up-facing feature (e.g. the top of the part).

PREFERRED METHODS OF OBTAINING IMPROVED STRUCTURAL INTEGRITY

Several preferred embodiments of this invention relate to methods of obtaining improved structural integrity, lower post cure distortion, lower overall horizontal distortion, and in many cases overall lower vertical distortion (e.g. vertical curl) by effectively providing skin on more than just the up- and down-facing surfaces of the part being formed. For example, the effect of providing skin at only the up- and down-facing surfaces, and supplying cross hatch in x-z (X hatch) and y-z (Y hatch) planes, is to create an internal structure consisting essentially of relatively long columns of substantially untransformed material trapped by at least partially transformed crosshatch and boundary material on the sides and skin on the up-facing and down-facing surfaces. Accordingly, a leak in any portion of a down-facing or up-facing skin or cross hatch would have the potential to cause distortion and unwanted drainage of untransformed building material. However, if skin is provided in the x-y (horizontal) plane, at more than the up- and down-facing surfaces, then the compartments of untransformed material trapped by cross-hatch, boundary, and skin would be much smaller and better-contained. Other advantages emanating from providing additional skinned surfaces within the internal structure of the part can include improved structural integrity, less distortion during formation, reduced post-curing times, and reduced post-cure distortion. Additionally, surface finishing can be performed before post-curing, and in some circumstances, post curing can be completely avoided. There are various preferred embodiments that employ different approaches in obtaining this additional fill.

A first group of embodiments utilize exposures analogous to traditional skin filling techniques in that the fill is generated by a series of overlapping exposures. These embodiments may or may not employ the use of what is traditionally known as cross-hatch and fill in the same region of a cross-section.

In a first preferred embodiment an object is formed on a layer by layer basis initially by the exposure of building material to boundary vectors on a cross-section, followed by exposure of crosshatch vectors on the cross-section, and finally followed by exposure of skin fill vectors on any up-facing and down-facing regions on the cross-section. Additionally, on periodic or random (with a certain probability of occurrence) cross sections even in non-down-facing and in non-up-facing regions skin fill vectors are provided and exposed. For example, at every ½ inch vertical interval through the part, which at 10 mil layers corresponds to every fifty layers, skin vectors are generated that provide for skinning of the entire cross-section. These skin vectors are provided in a form in which areas that are down facing can be distinguished from areas that are not down-facing so that different cure parameters can be used if necessary. It is possible to distinguish other regions but it has been found unnecessary to do so. The advantages of this approach have been previously described.

Of course other vertical spacings of skin fill are possible including geometry selective spacing. That is some geometric features may be better handled by one spacing of skins while others require a different spacing of skins. In this embodiment the boundary vectors and crosshatch vectors that are used to achieve adhesion between layers are generally given some overcure to insure adequate adhesion. However, the skin vectors that are used in non-downfacing regions can be given a cure depth that is less than, equal to, or greater than the layer thickness. It has generally been found that a skin depth greater than the layer thickness causes excessive curl and therefore isn't optimal. The skin vectors (combined with all other vector types) in a down facing region are, on the other hand given, only a one layer thickness cure depth. This embodiment can be combined in all, or in part, with the uniform skin thickness methods to be described hereinafter.

This method of building can be substantially implemented by Slicing the desired CAD object file, or the like, twice and then editing and Merging the resulting .sli files together. The first Slice is done with normal Slicing parameters. For example by using X and 60/120 crosshatch with a 50 mil spacing and using X skin fill with a 3 mil spacing. The second Slice is done without the use of skin fill but with the use of closely spaced cross-hatch (which will function as skin fill) of type and spacing equivalent to the skin spacing of the first Slice. For example, continuing with the previous example, the second Slice would be done with the same layer thickness but with only X type cross-hatch spaced at 3 mils. After creation of the second Slice file, it is edited by hand or by a program that can go in and remove the skinning cross-hatch associated with the cross-sections not using fill in the non-down-facing and non-up-facing regions. Next the two files are Merged together using merging options that keep all the vectors from the first Slice and that keep only the remaining X layer cross-hatch vectors from the second Slice (all other vector types are removed including near-flat down-facing crosshatch). These hatch and fill vectors are still distinguished by block headers that indicate which Merge object they came from. Therefore the combined file can be built as a single object.

One must be sure to give the proper exposure values to each vector type. Therefore, the hatch vectors from the second slice object are given associated exposure values equivalent to skin fill. This procedure will produce an object substantially like that described above. However, there are several differences between this implementation and that desired. First the regions of down-facing features and up-facing features might be given a double exposure (and therefore extra undesired cure depth) depending on whether the crosshatch from the second Slice of the object is still included in the combined file or not. Second, since the present Slice program doesn't generally separate non-down facing hatch from down-facing hatch (except in the near-flat regions), there will be an additional cure in the down-facing regions since the crosshatch must be overcured somewhat to insure adhesion between cross-sections.

FIGS. 14a and 14b depict a side view of an object according to the techniques of this first embodiment. FIG. 14a represents a side view of the CAD designed object. The dotted regions indicate solid regions. FIG. 14b represents a side view of the object as built according this first preferred embodiment wherein every third layer is skinned to help increase the structural integrity of the object. The regions labeled with forward slashes, "/", indicated regions that are skinned because they are down-facing. The regions labeled with back slashes, "\", indicate regions that are skinned because they are up-facing. The regions that are labeled with X's indicate regions that are to be skinned according to the teaching of the present embodiment that would not otherwise be skinned. Layers 1, 4, 7, and 10 are to be skinned according to this embodiment.

In a second preferred embodiment an object is built by providing and exposing boundary vectors on each layer, crosshatch on each layer and skin fill vectors on each portion of each layer. As with the previous embodiment and the following embodiments, this second embodiment is not restricted to part building with the use of vector data. The vector data is simply used as an implementation of the concepts of the invention and other methods of implementation could be used. Certain concepts of the invention deal with amount of solidification on each cross-section and/or the order of material solidification on each cross-section and/or the depth of solidification of each region on each cross-section. This second embodiment is similar to the first described embodiment except that now skin-fill is supplied on every region of every cross-section not just with down-facing features, up-facing features, and with periodic cross-sections. This second embodiment therefore results in green parts that have little or no substantially untransformed material trapped internal to their boundaries. There will be no substantially untransformed material if the effective skin depth thickness is equal to or greater than the layer thickness. There will be, to a greater or lesser extent, some substantially untransformed material if the effective skin cure depth is less than the layer thickness. As with the previous embodiment, it is desired to get some net overcure between regions of a cross-section that overlap with regions of the previous cross-section to insure adequate adhesion, but it is desired in down-facing regions that the net cure depth be uniform and be of only a one layer thickness depth. It has been found that with embodiments like the present one, where substantially all material on each cross-section is substantially transformed, that vertical curl can and generally does go up significantly but that horizontal distortion goes down significantly. It is known that the amount of curl (both horizontal and vertical) can vary tremendously depending on the amount of overcure between layers; the amount of overcure between adjacent lines on the same cross-section; the extent of the area over which the overcure takes place; the thickness of the layers; and the order of intercross-sectional solidification as well as the order of intracross-sectional solidification. If parts are to be built that contain few unsupported critical features, or in which the unsupported features can be supported by Webs, the direct application of this embodiment can lead to substantial improvements in part accuracy.

If the part to be built does contain critical regions that cannot be well supported then modifications to this embodiment can be helpful in reducing the vertical "curl" type distortion that may result. These modifications might include the use of the techniques of this embodiment (or "continuous skinning" or "skintinuous") on only the regions that are or can be adequately supported and continuing to use the standard building methods of boundaries, widely spaced crosshatch, down-facing feature skinning routines, and up-facing feature skinning routines on the other regions of the part. "Strongarm" building techniques can be effectively used in these other regions of the part. The result of this modified approach would be substantially increased horizontal accuracy in the supported regions with no sacrifice in vertical accuracy in the unsupported regions.

Other modifications, to avoid increased vertical distortion include the use of Smalleys, described in copending U.S. Pat. No. 5,015,424; the use of Multipass drawing techniques, described in copending U.S. patent application and 339,246; the use of Rivet type layer to layer adhesion techniques, described in copending U.S. patent application and 339,246; the use of "strongarm", "log jam", "quilting"; as well as other techniques to be described hereinafter; and similar techniques; and combinations thereof.

As with the previously described first embodiment method of building, this method of building can be substantially implemented by Slicing the desired CAD object file, or the like, twice and then Merging the files together. The first Slice is done with relatively normal Slicing parameters, except no skin fill is used. One example is by using X and 60/120 crosshatch with a 50 mil spacing. The second Slice is done, again, without the use of skin fill but with the use of closely spaced crosshatch of type and spacing equivalent to that which is desired for forming skin fill on each layer. For example the second Slice may be done with the same layer thickness but with only X type crosshatch spaced at 3 mil. After creation of the second Slice file, the two files are Merged together using Merging options that keep all the vectors from the first Slice (except any skin fill vectors that were used) and that keep only the X crosshatch (including near-flat down-facing cross-hatch) from the second Slice file (all other vector types are removed). The hatch from the first Slice and the fill vectors from the second Slice (actually hatch vectors from the second Slice) are still distinguished by block headers that indicate which Merge object they are from. Therefore the combined file can be built as a single object being sure to give the proper exposure values to each vector type. Therefore the hatch vectors from the second slice object are given associated exposure values equivalent to skin fill. This procedure will produce an object substantially like that described above as the preferred method of this embodiment. However, there is a difference between this implementation and the desired one described above. Since the present Slice program doesn't generally separate non-down facing hatch from down-facing hatch (except in the near-flat regions), there will probably be an additional cure in the down-facing regions since the crosshatch may need to be somewhat overcured to insure adhesion between cross-sections.

With the second embodiment and the first embodiment as well as with embodiments described hereinafter, there are many ways to use the existing commercial software or to modify the outputs from the present commercial software to at least partially implement the various embodiments. The implementations herein are only meant to be examples of such techniques.

In a third preferred embodiment each cross-section is supplied with boundaries and skin fill vectors only (this embodiment does not utilize crosshatch. In this third embodiment the boundaries may be cured to an effective depth equal to the layer thickness or greater than the layer thickness depending on whether they are to be used to obtain adhesion with the previous cross-section or whether they are to be used to form a down-facing feature. As with the previous embodiment the skin vectors in non-down-facing regions may be cured to a depth less than, equal to, or greater than the layer thickness. It has been found that if skin vectors are cured to an effective depth greater than the layer thickness, by usual curing techniques, vertical curl will be greater. Therefore, if it is desired to cure the skin vectors to such a depth it is advisable to utilize a drawing method that will help to reduce curl, such as multipass. Multipass is a method of solidifying material in at least a two step process, wherein a first exposure of material to the synergistic stimulation leads to a depth of cure less than the layer thickness and the second pass (or higher order pass) results in a net cure depth that insures adhesion. Multipass is an effective way of reducing curl. An additional enhancement of multipass scanning is described in copending patent application 429,911 regarding the use of multiple wavelengths during the multi-scanning process. A short penetration depth exposure is given on the first one or more passes to insure that substantial transformation of building material occurs prior to one or more additional exposures using long penetration depths that are used to obtain and insure adequate adhesion between cross-sections.

An additional problem that might occur with this third embodiment is that of excessive horizontal curl. In the previous embodiments horizontal curl was kept to a minimum by the exposing of cross-hatch prior to the exposing of skin, wherein the cross-hatch would act as a stabilizing frame upon which skin could be formed. Since this third embodiment doesn't contain cross-hatch it may be necessary to utilize a horizontal curl reduction technique also.

Such techniques include the use of nonconsecutive vector drawing, the use of non-overlapping fill vectors (e.g. "weave" which is the topic of embodiments to be described later), and the filling of non-consecutively drawn vectors by intermediate vectors (in many respects this is a horizontal version of the multipass technique described above). The non-consecutive ordering of vectors refers to a technique of supplying fill or hatch vectors with a particular spacing and then exposing the vectors in a nonconsecutive manner. In traditional stereolithography fill vectors are cured in a consecutive order.

An example illustrating the differences between consecutive ordering and non-consecutive ordering is depicted in FIG. 7. FIG. 7a illustrates a cross-section of boundary 200 and containing unidirectional fill vectors 201 to 209. In traditional stereolithography the order of drawing is from vector 201 to vector 209. The direction of scanning each of these vectors has generally been such that the amount of jumping between vectors is minimized. The odd numbered vectors have generally been drawn from left to right and the even numbered vectors have been drawn from right to left. Therefore the entire fill can be drawn with minimal jumping between the head of one vector and the tail of the next.

FIG. 7b illustrates a similar cross-section but wherein an example of nonconsecutive drawing order is used to minimize any horizontal curl that might have a tendency to occur. The cross-section is surrounded by boundary 220 and it is filled with vectors 221 to 229. The drawing order is from 221 to 229, therefore every other vector is skipped on a first pass of drawing and then the vectors skipped on the first pass are scanned on a second pass. This technique is especially useful for minimizing curl when two consecutively scanned vectors are separated by a distance so that the material cured by each vector individually doesn't connect to the material cured by the consecutively scanned vectors. Then on a second pass (or later pass) the gaps between the material exposed by the first pass are filled in by the additional pass which scans vectors intermediate to those of the first pass. If the width of cure of each vector is relatively wide compared to spacing between vectors it may be necessary to skip more than just every other vector. For example it may be necessary on a first pass to cure one vector and skip three vectors then cure another vector and skip the next three vectors, and so forth. On the second pass one may then cure the intermediate vector of each set of 3 vectors not drawn on the first pass, and then finally on a third pass the remaining unexposed vectors are scanned. This is illustrated in FIG. 7c. The boundary 240 is filled with vectors 241 to 249 wherein the scanning order is 241 to 249.

If the skin vectors will only be given an effective cure depth less than or equal to the layer thickness it will likely be necessary to supply additional exposure in the form of point rivets, or the like, on the portion of the present cross-section that overlaps the previous cross-section. The proper use of rivets will lead to adequate adhesion between layers but will also tend to keep vertical curl to a minimum. As with the deeper cure depth methods this approach may also require the use of horizontal curl reduction techniques.

As with the previously described methods of building, this method of building can be substantially implemented by a user by Slicing the desired CAD object file, or the like, a single time. The part is sliced with cross-hatch but without skin vectors. The crosshatch vectors are spaced with a separation typical for skin fill. One or more crosshatch types may be simultaneously used. For example, one can use both X and Y hatch with a spacing of four mils each. If the maximum cure width of cure for a single pass along one vector is equal to or greater than the spacing between vectors (e.g. 12 mil MCW) and one doesn't want consecutively cured vectors to effect one another then a drawing pattern similar to that described for FIG. 7c can be used for each type of crosshatch. This procedure will produce an object substantially like that which would be produced by the preferred methods of the third embodiment. However, there is a difference between this implementation and the desired one described above. Since the present Slice program doesn't generally separate non-down facing hatch and boundaries from down-facing hatch (except in the near-flat regions) and boundaries, there will probably be an additional cure in the down-facing regions since the crosshatch may be somewhat overcured to insure adhesion between cross-sections.

A fourth embodiment is similar to the third just described but it doesn't us boundary vectors either. Therefore, this embodiment supplies and exposes only fill type vectors. Since there are no boundaries associated with each cross-section in this embodiment, and therefore nothing other than surface tension and viscosity to hold the vectors in place as they are drawn except where there is horizontal contact to adjacent vectors and vertical contact with the previous cross-section, the vectors of this embodiment must be drawn in a highly ordered manner. The vectors must be drawn in an order and/or to a depth that assures adequate structural support to insure that each vector stays in place until the entire cross-section is drawn. If the vectors are drawn in an improper order, then it is possible that some of them will drift out of position or be distorted out of position prior to the completion of the exposure and solidification of the cross-section. Since vertical curl generally occurs between material cured on the presently drawn cross-section and material cured on the previously drawn cross-section, vectors in this region can be drawn in a nonconsecutive order and can also be cured using two pass multipass to insure minimal curl. Subsequently, the vectors that occur in down-facing regions can be cured in a non-consecutive interlaced manner with vectors from the other hatch types. For example, one or more nonconsecutive X type vectors can be scanned followed by the scanning of one or more Y type vectors and then repeating the exposure of other X type and Y type vectors until all the vectors have been scanned. In this region the direction of scanning can be just as important as the order of scanning. To insure the most appropriate positioning of vectors they may need to be scanned from the supported region towards the unsupported region.

Other embodiments, described herein next, create at least a substantial amount of fill on a cross-section in a manner more analogous to standard approach crosshatch vectors. That is by supplying and exposing vectors which are spaced such that they do not effect each other during their exposure. They are spaced at or slightly above the expected maximum cure width of the individually exposed vectors. Thereby, after exposure of all vectors a substantially transformed cross-section results with only minimal untransformed material between the vectors. The various embodiments of this approach are broadly known by the name "Weave".

The name "Weave" particularly applies to the first preferred embodiment of this concept (the fifth embodiment of this application). This embodiment is the presently most preferred embodiment of the various Skintinuous building techniques. This embodiment consists of supplying and exposing boundary vectors, next supplying and exposing at least two types of non-parallel cross-hatch, wherein the exposure of the first cross-hatch type is insufficient to produce a cure depth that results in enough adhesion to induce vertical curl to the previous cross-section and wherein the exposure of the second cross-hatch type is equivalent to the first type, thereby resulting in sufficient exposure in the overlapping regions to cause adhesion between cross-sections. The spacing of the crosshatch vectors is such that they are spaced slightly further apart than the maximum cure width of the individual vectors when given the appropriate exposure to result in the desired cure depth.

As with the previously described methods of building, this method of building can be substantially implemented by using SLA software to Slice the desired CAD object file, or the like, a single time. The part is Sliced with cross-hatch but without skin vectors. The crosshatch vectors are spaced with a separation slightly greater (e.g. 10%) than the expected maximum cure width. The presently preferred system for building parts using this embodiment is the SLA-250 manufactured by 3D Systems, Inc. of Valencia, Calif. The presently preferred building material is XB 5081 stereolithographic resin (liquid photopolymer) manufactured by Ciba-Geigy. The presently preferred system utilizes a HeCd laser operating at 325 nm which typically results in a width of cure of approximately 10–11 mils or less for a cure depth of 8–9 mils. Therefore, the crosshatch vectors are spaced at approximately 12 mils. The presently preferred fill vectors are combined X and Y crosshatch. The presently preferred SLA software is version 3.60. When using the presently preferred software, an object is built by exposing boundary and hatch vectors. As stated earlier, adhesion between cross-sections is obtained at the intersection points between the two hatch types. The cure depth of these intersection points is approximately 12 to 14 mils when parts are built with 10 mil layers. This method of building results in substantially less horizontal distortion and equivalent or less vertical distortion than when equivalent parts are built with standard techniques. Measured post cure distortion is substantially less than for parts built using conventional methods.

Figure 8A:
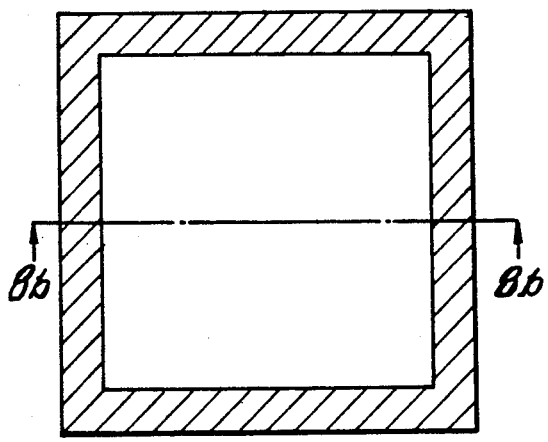
FIGS. 8a–8i collectively illustrate the vectors used and cure depths obtained, for a sample cross-section, by utilizing the "weave" building embodiment.
Figure 8B:
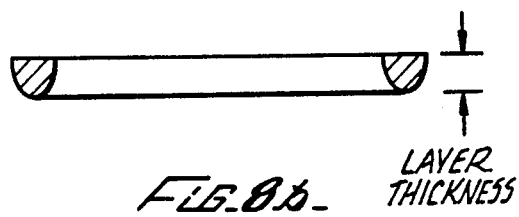
Figure 8C:
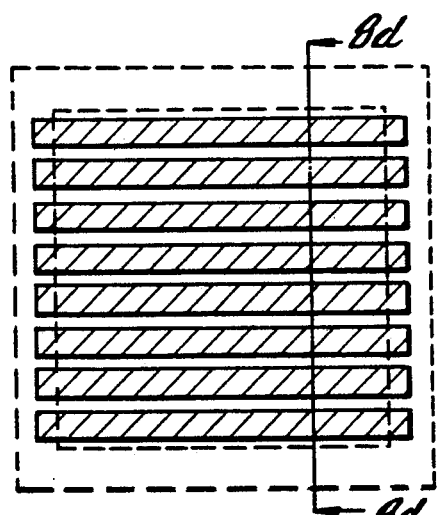
Figure 8D:
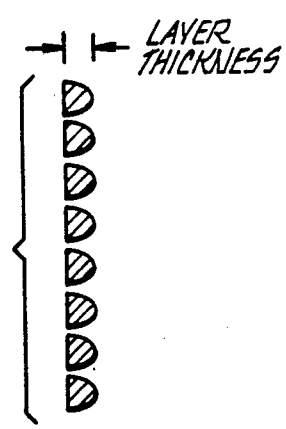

The formation of a cross-section by this fifth embodiment is depicted in FIG. 8a to 8i. FIG. 8 represents a square cross-section which is to be cured to a uniform depth. FIG. 8a depicts a top view of the material cured by scanning of the boundary vectors. FIG. 8b depicts a sectional view of the material cured in FIG. 8a along line b. The cure depth of the boundary vectors is the layer thickness plus some overcure amount (e.g. 10 mil layer thickness+6 mil overcure). FIG. 8c depicts a top view of the material cured in response to the scanning of the X cross-hatch on a dashed background of material cured in response to boundary vectors. FIG. 8d depicts a sectional view of the material cured in FIG. 8c along line d—d. The cure depth of the X crosshatch is less than one layer thickness (e.g. 8 mil cure depth for a 10 mil layer thickness). The exposed regions are relatively wide compared to the unexposed regions. That is, the spacing between hatch vectors was only slightly more than the maximum cure width of the hatch vectors (e.g. 12 mil spacing of hatch vectors and an 11 mil maximum cure width).

Figure 8E:
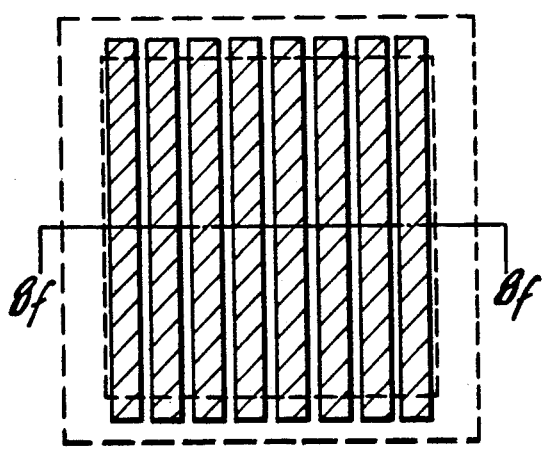
Figure 8F:
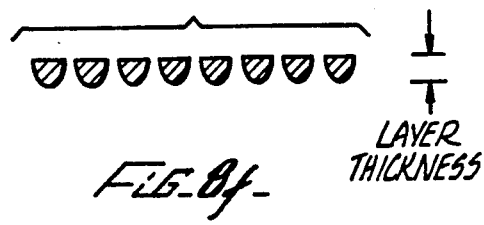
Figure 8G:
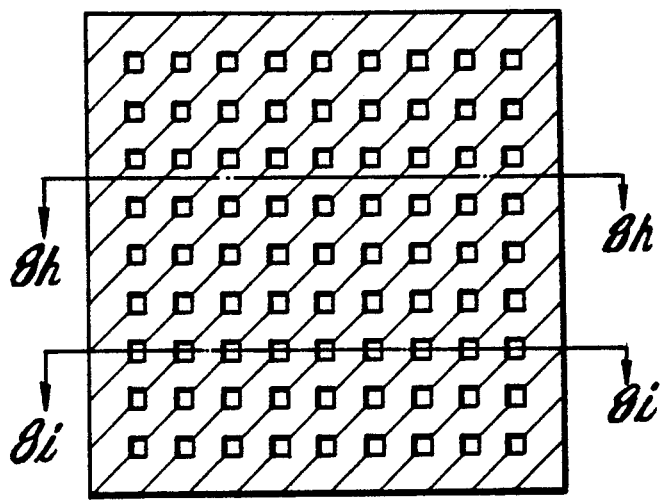
Figure 8H:
Figure 8I:

FIGS. 8e and 8f show similar cured material for Y cross-hatch vectors. FIG. 8g depicts a top view of the superposition of material cured as depicted in FIGS. 8a, 8c, and 8e. The small square zones in the FIGURE represent uncured material. The size of these squares is about 1 mil on edge or less whereas the solidified material between them is about 11 mils on edge. FIG. 8h represents a side view of the cured shape of material along the line h—h of FIG. 8g. Line h—h is directly above the maximum cure from an X hatch vector. FIG. 8i represents a side view of the cured shape of material along line i—i of FIG. 8g. The cure depth of the regions where the X and Y hatch vectors overlap has increased to something greater than the layer thickness. Line i—i is located between the cure of two adjacent X hatch vectors. Most of the area of the cross-section is more like FIG. 8h than FIG. 8i. The exposure in FIG. 8h isn't uniform but the nonuniformity is less than that produced in the traditional approach to skinning a surface during part building. The main reason for this reduction is that there isn't a super-position of discrete hatch vectors with a six mil over cure each which results in up to an 11 mil overcure, or more, at their intersection points combined with skin vectors that form a uniform layer thickness cure depth. Instead there is simply a double exposure of closely spaced hatch that produces a substantially uniform cure depth with points of approximately 5 mil overcure superimposed on it.

A variation of this fifth embodiment is to use weave in all non-down-facing regions and to use other more traditional approaches to skinning (including the uniform skinning methods described below) on the down facing features and to give these down-facing features a layer thickness cure depth.

A sixth embodiment of the present invention is similar to the fifth embodiment just described except in the sixth embodiment the crosshatch (or fill vectors) are offset or "staggered" from layer to layer. One implementation of this method is to offset the vectors on adjacent layers by ½ the hatch spacing. Therefore, the hatch vectors on every other layer overlay the same hatch paths. Other forms of layer to layer offset are possible wherein the overlaying of hatch paths (hatch paths are lines on a given cross-section that have the potential of being crosshatched) is repeated at some other period than on every other layer. For example hatch paths may not overlay each other for 3 or more layers.

Offset or "staggered" crosshatch may be utilized with standard building techniques as well as with the various embodiments of the present invention. The advantages of using offset crosshatch with standard building techniques (that is widely spaced hatch) involve the production of smoother vertical surfaces of an object, more uniform volumetric properties, and possibly less curl between layers since adhesion between layers is due to points instead of lines.

In building parts for investment casting, hollow parts lead to less structural strain on the casting molds as the building material is burned away. Hollow parts can be built with cross-hatch but without skins, thereby tending to allow untransformed material between the cross-hatches to drain from the object. Solid parts tend to expand and crack investment casting molds, whereas hollow parts have less of a tendency to do so. However, building hollow parts can be a problem even when skin fill isn't used if the hatch vectors on successive cross-sections lie on top of each other. Untransformed building material can be trapped between the cross-hatch and the boundaries. The trapped material can later become solidified, thereby losing the desired hollow part characteristics of the object. However, if the centering-to-centering distance between crosshatch vectors is greater than approximately twice the maximum cure width, then offsetting the vectors by ½ the spacing on every other layer will result in a part where substantially all of the internally untransformed material can flow through various gaps and thus can be removed prior to using the part to make an investment casting mold. This advantage of offset crosshatch is illustrated in FIGS. 9a and 9b.

Figure 9A:
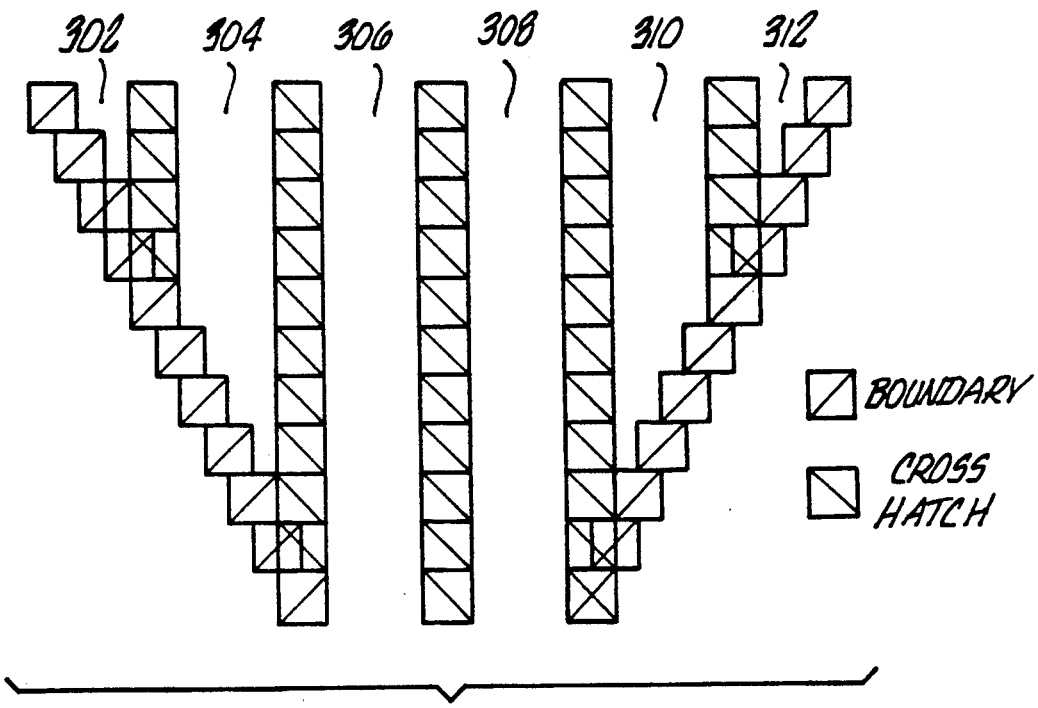
FIGS. 9a and 9b collectively show a side view indicating the difference between stacking one direction of crosshatch on top of each other from layer to layer and staggering the hatch from layer to layer.
Figure 9B:
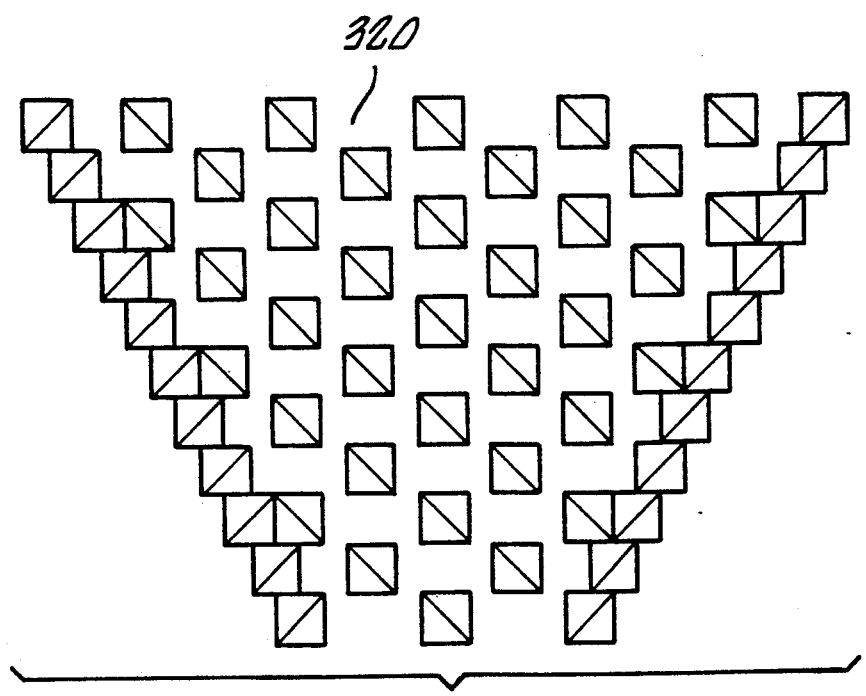

FIGS. 9a and 9b illustrate the sixth embodiment and depict side views of an object whose boundary vectors are offset from one another but are not offset sufficiently to allow drainage of untransformed material between them (these are nonvertical but steep boundaries as opposed to flat or near-flat boundaries). FIG. 9a depicts a part built with overlaying crosshatch and therefore pockets of untransformed material trapped within it. FIG. 9b depicts the part built with offset crosshatch therefore allowing pathways for removal of internal untransformed material. Assuming the top of each partially depicted object reconverges so that building material cannot be removed from the top, as shown in FIG. 9a, only pockets 306 and 308 can drain whereas 302, 304, 310, and 312 cannot drain. In FIG. 9b, the entire internal area of the part forms one interconnected pocket from which substantially all untransformed material can drain. If using a photopolymer, drainage can be enhanced by utilizing elevated temperatures to reduce resin viscosity. Since a primary principle of the present invention is to solidify as much internal material as possible this sixth embodiment of offset crosshatch diverges from the skintinuous building techniques. But it is a useful building method in its own right. Its ability to reduce post cure distortion is discussed in Example 6.

Other embodiments of the nonoverlapping approach to building can be developed from appropriate combinations with techniques discussed in conjunction with overlapping exposure techniques as well as with the additional embodiments of the present invention to be described hereinafter.

Besides the two main approaches described previously, that is overlapping fill or non-overlapping fill on at least a portion of the cross-sections, there is an additional class of embodiments that are used to increase structural integrity. This next class of skintinuous embodiments are based on the curing of discrete points of material called "Bullets" instead of the curing of overlapping or non-overlapping lines of material. The bullets are cured in association with a single cross-section as a plurality of substantially nonoverlapping exposures. The embodiments of this approach comprise methods of solidifying primarily internal regions of objects whereas the down-facing and up-facing regions of the object may be cured by the other approaches described herein.

The seventh embodiment of Skintinuous (the first embodiment of this class) involves curing the internal portions of desired cross-sections by exposing material within the boundaries of the cross-sections as a series of discrete points. The points that are exposed on a given cross-section are spaced from each other by a distance slightly greater than the maximum diameter of the cured material formed upon exposure of the material to synergistic stimulation. In other words, on a single internal cross-section a substantial portion of the material is cured in the form of point exposures with a small gap separating each point exposure from its neighbors. This separation stops the transmission of stress and therefore diminishes curl. Each point is cured to a depth equal to or slightly greater than the layer thickness to insure adhesion between cross-sections. On the next cross-section the pattern of exposure is "staggered" or shifted so that the point exposures on this next cross-section are centered above the gaps between the points on the previous cross-section. This shifting pattern of bullet exposures is continued on alternating cross-sections until the desired region of the part is complete. This allows substantial structural integrity to be developed between cross-sections while decreasing the amount of curl when building with a given layer thickness.

Figure 10A:
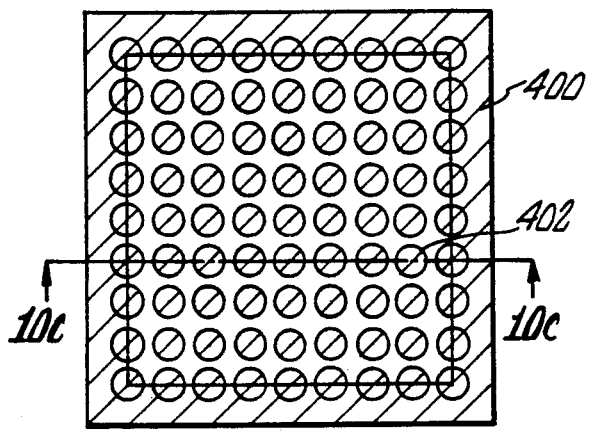
FIGS. 10a–10c collectively show the configuration of bullets cured in association with practicing the seventh embodiment of the present invention.
Figure 10B:
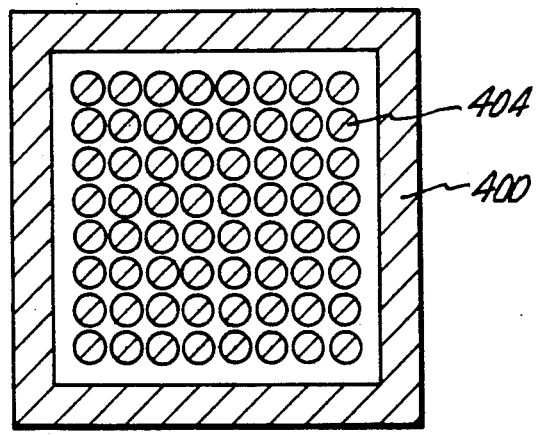
Figure 10C:
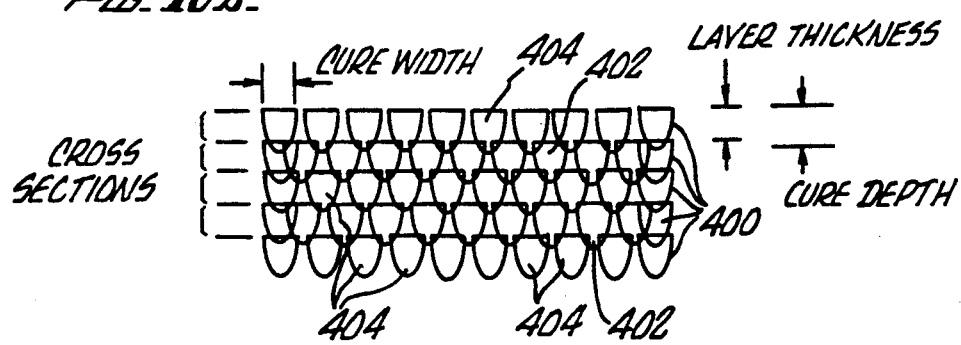

Two consecutive overlapping sample cross-sections are shown in FIGS. 10a and 10b. These sample cross-sections depict a cross-section boundary 400 enclosing a series of point exposures. FIG. 10a depicts point exposures 402 located on a particular grid while FIG. 10b depicts point exposures offset (staggered) from those in FIG. 10a. A comparison of the two FIGS. indicates that the bullets on one cross-section are centered in the middle of the space between bullets on the previous cross-section. FIG. 10c depicts substantially a side view of the combined FIGS. 10a and 10b along line c—c. This FIGURE, at least in a 2 dimensional view, illustrates how the bullets are staggered from layer to layer. The illustrations of FIG. 10a and 10b depict a particular arrangement of points on a given cross-section but other arrangements are possible. For example to get a tighter fit of bullets (higher ratio of transformed to untransformed material on a given cross-section) one could locate the points in a hexagonal pattern. This hexagonal pattern when combined with higher cross-sections could form a hexagonal close-pack structure. Therefore each bullet would have 6 nearest neighbors on the cross-section as opposed to only 4 as shown in FIGS. 10a and 10b.

This method of building with bullets can only be partially implemented from present 3D Systems software. This implementation is only partially satisfactory. Proper utilization of this embodiment requires modified software.

The implementation from the present software is done by slicing the object with a single type of crosshatch vectors (e.g. X vectors) with a spacing slightly larger than the diameter of the bullets of material that will be formed. The object is sliced a second time with the part offset by ½ the spacing along the direction perpendicular to the chosen crosshatch direction (e.g. the Y-axis). The two objects are merged together using options that shift the second file by −½ the crosshatch spacing along the perpendicular direction (e.g. Y-axis) and ½ the crosshatch spacing along the X-axis. Also the merging options used remove all the vectors from the second slice file except for the cross-hatch vectors. Then the resulting file is edited to remove the hatch vectors from alternating slice files on alternating layers.

When vectors are cured using the present software they are not cured by a continuously sweeping beam but by a beam that jumps a small distance (e.g. integer multiples of 0.3 mils) known as the stepsize or SS, and then it waits at each allowed SS position a period of time known as the step period or SP (e.g. integer multiples of 10 microseconds). The particular positioning for both timing and jumping is based on the beginning point of each vector that is drawn. When the object is built, the SS value used is equivalent to the spacing between vectors (e.g. 12 mils or approximately an SS value of 40). Since the two files were offset when they were sliced along the direction perpendicular to the hatch direction and then shifted back together during merge the Y-value associated with each bullet will be offset by ½ the crosshatch spacing on alternating layers. Since the files were merged then offset from each other by ½ the cross-hatch spacing along the direction of the crosshatch the X-value associated with each component will be offset by ½ the cross-hatch spacing between alternating layers. This method of implementation is useable but not always satisfactory since in some of the extreme values, the X-component of each vector fall slightly (½ the crosshatch spacing) outside the boundary of the cross-section. Other software based methods of implementation using the present software are based on slicing the part twice as described above but here each part is sliced with a layer thickness twice as large as desired and one of the parts is shifted by ½ the layer thickness prior to slicing and then shifted back during merging.

A useful tool for implementing this embodiment from the present software without a major change would be to include a parameter that would allow crosshatch vectors to be reduced in length at each end by a specified amount. This would allow shifting along the direction perpendicular to the hatching direction, along with the reduction of the vectors created by the second slice by ½ the crosshatch spacing, followed by the reregistration of the files during merging. Also of use would be an editing program that could read through the merged file and remove selected vector types from appropriate cross-sections.

If one is building an object with an orientation that is substantially more susceptible to curl than a perpendicular orientation, this embodiment may be modified to that of an embodiment of offset unidirectional crosshatch. Here the direction of offsetting would be the direction most susceptible to curl and the direction of the vectors would be the less susceptible direction.

Figure 11:
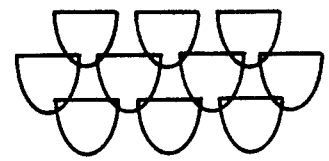
FIG. 11 illustrates a side view of the overlapping nature of the bullets formed in practicing the eighth embodiment of the present invention.

The eighth embodiment of the present invention is similar to the seventh embodiment but the bullet's are cured so as to solidify material in association with the previous cross-section as well as the present cross-section. Therefore the cure depth of each bullet is typically equal to or somewhat larger than two layer thicknesses. Accordingly, in this embodiment, it is important, when working with a particular cross-section, to know not only the internal regions of the present cross-section but to also know the internal overlapping regions of the previous cross-section. The spacing of the bullets is somewhere between what it was in the previous embodiment and the diameter of the bullet at one layer thickness below the present cross-section. The adhesion between layers is gained substantially by adhesion between the sides of the bullets on the present cross-section at a position one layer thickness below their upper surface and the sides of the bullets on the previous cross-section at their upper surface. A side view of the bullet positions on adjoining layers is depicted in FIG. 11. It is noted that the present embodiment is primarily for regions of the object two or more layers from down facing features.

In still other embodiments, transformation of material that is located on one cross-section may occur from exposures given in association cross-sections two or more layers higher up.

As discussed above, several new skinning techniques can advantageously be used in connection with this invention, based on non-consecutive ordering of skin vectors. Traditionally, skin vectors are ordered head-to-tail, such that a first vector pass is made along a fill path from one boundary to an opposing boundary, and a pass along the next vector is then made, slightly offset (e.g., typically from 1 to 4 mils from the first), from the latter boundary back to the first. However, it has been found, in accordance with some of the preferred embodiments of this invention, that distortion can be reduced by appropriate, non-consecutive scanning and therefore nonconsecutive formation order of skin fill. Specifically, the offset between vectors can be advantageously increased (e.g., doubled or tripled, or more), such that the successive skin vectors have less impact, or do not impact, upon adjacent lines of cured building material for a given series of passes across the surface of the region of the part being formed. Additionally, in one or more successive series of passes, additional skin vectors can be drawn between those that had been drawn in the earlier series of passes. These embodiments preferably have crosshatch vectors on each layer as well as skin vectors.

Yet another embodiment according to which distortion can be minimized involves skinning in different directions for different layers. For example, in a part having x- and y- hatch on each layer, odd layers can be skinned in the x-direction and even layers in the y-direction, or vice versa.

In still another embodiment, skin fill can be provided in both x- and y- directions on a given layer having x- and y-cross-hatch.

According to a most preferred embodiment, however, x, 60° and 120° cross-hatch is provided with skin fill in at least one of the x, 60°, or 120° directions, and preferably, in each of the directions. In a preferred variation of this embodiment, discussed in more detail below, the skin vectors of a given direction are not traced directly over the hatch vectors of the same direction, thereby avoiding excess exposure of any given location. Moreover, since exposure is provided in three directions over any given point in a skinned layer, the vector scanning speed can be increased by a factor of three to yield one-third of a normal exposure per vector, resulting in a uniform exposure after all three directional passes are made.

Another embodiment is that of "tiling". In this embodiment one of the previously mentioned approaches is utilized in exposing individual "tile-like" regions wherein small spacings of material between the individual tiles are left untransformed to act as stress relief zones. The size of the individual tiles can range from that of a point exposure to that of an entire cross-section.

Tiling is a method of forming a layer of an object produced by stereolithography, wherein the layer is divided into a series of area elements or tiles. Each area element is isolated from adjacent area elements by spacings. The spacings around each area element remain untransformed, at least until all neighboring area elements or tiles are transformed or solidified. The spacings between the individual tiles are left untransformed to act as stress relief zones. The width of the spacing is typically small compared to the width of the individual tiles. Individual tiles can be drawn with borders or without; however, it is presently preferred to draw tiles without individual borders.

Tiling can also be used as another technique of curl reduction when implemented on a second or higher layer above a down-facing feature. Generally no curl is generated on a down-facing feature so there is no need for tiling as a curl reduction technique on a down-facing feature. It should also be noted that tiling does not generally apply to down-facing features because there is no underlying structure to attach individual tiles to during the transformation process, i.e., tiling may be applied only to an at least partially supported area as opposed to a completely unsupported area.

Since the tiles are individual and discreet relatively small areas, the use of tiles limits shrinkage to the boundary of the tile. This reduces stress and curl on the tiled layer, an especially important consideration in the first few layers immediately above a down-facing feature. Curl generally occurs mainly in down-facing features. These features curl upwardly as a result of the formation of the next several overlying layers. On the other hand, a potential disadvantage of tiling is that it possibly provides less strength.

The spacings between the tiles can be transformed or solidified (referred to as grouting or mortar) usually after all of the tiles have been formed. An entire object can be made by tiling to reduce post treating. This grouting is usually transformed to a lesser degree than the tiles (a lower exposure is used).

By way of example, when using a presently preferred material such as XB5081 and 5 mil layers, tiling may be used in forming the first through twentieth layers above a first layer of a down-facing feature and especially to form layers 1 through 10 (assuming the first layer is supported). If 10 mil layers are used, tiling would preferably be applied in the range of the 1st through 10th layer and especially in the 1st through 5th layer above a down-facing feature.

Preferably, the tile sizes range from the width of a laser beam (about 0.010 inches, ¼ mm) up to about 0.120-0.150 inch, with the most preferred range being from ¾-2 millimeters on edge.

The spacings or gaps between the tiles should be as small as possible, within the limits of accuracy of placement and cure width of a beam of synergistic stimulation. The typical width of these gaps is in the range of 1-10 mils after exposure and cure. It is important that the material in the spacings or gaps not be transformed or solidified sufficiently to transmit stress.

After forming one or more layers with tiling and without grout it is generally desirable to start offsetting tiles from layer to layer or to begin grouting between tiles or to stop the tiling process altogether in order to insure adequate structural integrity of the part. As stated earlier, a potential problem with forming parts utilizing tiling is the tendency towards structurally weak parts. However if tiling is to be discontinued, grouted, or offset, it is important to minimize any tendency toward reintroducing curl that may result from closing the gaps. As the gaps are closed, any shrinkage of material that occurs above the gap, while the shrinking material is adhered to both ends of the gap, can cause curl distortion by tending to bring the top ends of the gap closer together (closer than the spacing between the bottom edges of the gap). Since gaps result in relatively weak axes this scenario of reintroducing curl is very likely. Additionally, it has long been suspected and recently experimentally verified that shrinkage of curing material can still be occurring several seconds after exposure of an area is suspended. This means that closing a gap with a line of curing material which is adhered to the first side, and extended from the first side to the second side, and adhered to the second side within a few seconds can induce stresses into the part which can eventually lead to distortion.

A preferred method of closing gaps, and thereby insuring adequate structural integrity of a part, while avoiding reintroduction of curl, is based on insuring that at least a substantial portion of the material cured over the gap is allowed to shrink prior to adhesion to both sides of the gap.

A first embodiment of this method slightly offsets the tiles on a second layer from the corresponding positions of tiles on the previous (first) layer, wherein the offset is such that the tiles on the second layer substantially cover the gaps between the tiles on the first layer without completely bridging the gap thereby avoiding the simultaneous adhesion of a single cured shrinking mass to both sides of the gaps on the first layer. Thereafter, allowing for sufficient time for the tiles and the tile material spanning the gaps to complete their shrinking, grouting between the tiles on the second layer is formed. This grouting completes the bridging of the gap with only minimal shrinkage of material over the ga while adhesion to both sides exists. Since this grouting is offset from the gaps on the first layer, and since shrinkage of material on the second layer over the gaps occurs before the grouting is formed substantially less curl is introduced. Any desired exposure can be used in forming the grouting, without necessarily being limited to grouting of lower exposure than that used to cure the tiles.

Figure 23A:
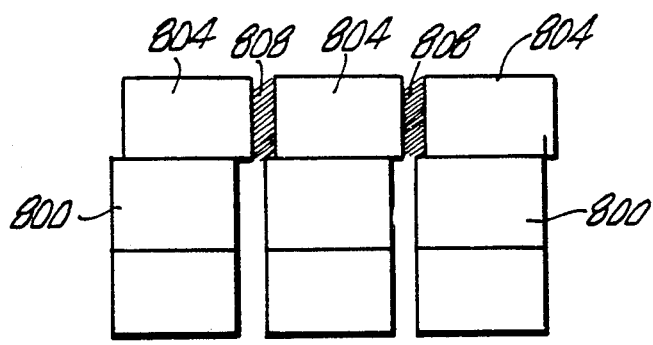
FIGS. 23a, 23b, and 23c depict the gaps between tiling on a first layer being filled in on a second layer with slightly offset tiles followed by grouting between the offset tiles.
Figure 23B:
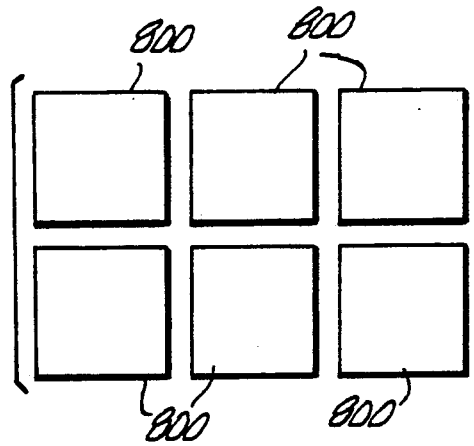
Figure 23C:
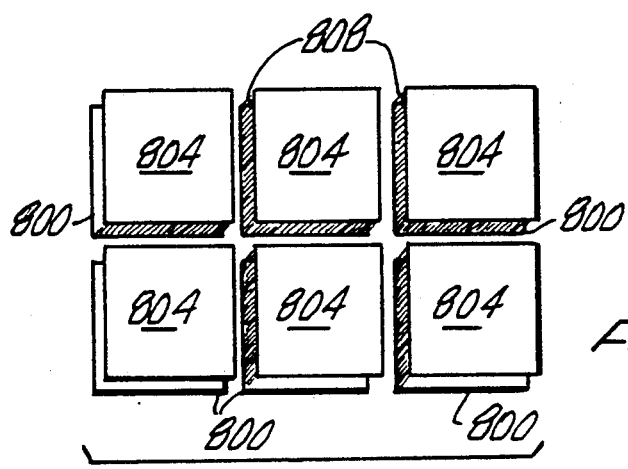

This first embodiment is depicted in FIGS. 23a to 23c. FIG. 23a depicts a side view of a portion of an object comprising a first layer which is formed with tiles and a second layer with slightly offset tiles and offset grout. The tiles of the first layer ar indicated with numeral 800. The tiles of the second layer are offset sufficiently from tiles on the first layer to substantially cover the gap area of the first layer without being offset so far as to adhere to the adjacent tiles on the first layer. These tiles of the second layer are depicted with numeral 804. The grouting between the tiles on the second layer is cured after the tiles 804 on the second layer have been allowed to shrink (e.g., generally at least a 3 to 5 second delay between completing neighboring tiles and beginning to grout). The grouting is indicated with numeral 808. FIG. 23b depicts a top view of the tiles 800 of the first layer and FIG. 23c depicts a top view with superimposed tiles 800 of the first layer and tiles 804 of the second layer and the grouting 808 of the second layer.

A second embodiment of this method forms the second layer, on which the gaps will be closed by floating at least one end of the solidified material which spans the gap until after at least a substantial portion of the shrinkage has occurred. After allowing for shrinkage to occur, the floating end(s) can be tacked down with rivets, or multipass, or the like.

Figure 24:
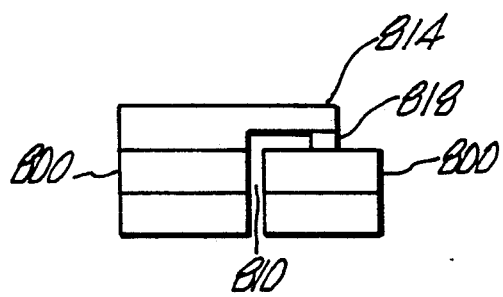
FIG. 24 depicts closing gaps between tiles on a first layer with an at least partially floating member on a second layer which floating portion is riveted to an adjacent tile on the first layer.

FIG. 24 depicts a side view of a gap 810 between tiles 800 on a first layer being closed off on a second layer by floating at least one end of bridging material 814 until the bridging material has completed shrinking. The rivet completing the closure is depicted with numeral 818

Additional embodiments of this type involve the progressive partial closure of the gaps over a plurality of layers. For example a gap can be partially narrowed from one or both sides on a second layer followed by additional narrowing or complete closure on the third or higher layer.

These methods of closing gaps between tiles are applicable to the closure of the stress relief gaps disclosed in U.S. Pat. No. 5,015,424. As will be apparent to those of skill in the art these methods can be modified or/and combined with themselves or other curl reduction techniques to effectively close gaps without reintroduction of substantial curl.

Where a scanning mirror-directed laser beam is used to transform the material, the "jumping" speed from tile to tile across the spacings must be considered. The mirror(s) directing the laser beam has a moment of inertia which limits its rate of angular acceleration. If the laser is to jump from the edge of one tile to the adjacent edge of another tile, the jumping speed is limited since there is only a very small distance in which the mirror can accelerate before it must begin to decelerate to properly direct the laser onto the edge of the next adjacent tile. Since the jumping speed is limited, the material in the gap may be inadvertently partially cured by the jumping laser beam. In tiling methods wherein the laser is frequently jumping back and forth between tiles, this can become especially problematic.

Inadvertent curing of the material in the gaps during jumping between tiles can be overcome in several ways. The mirrors can be made to accelerate faster, although a practical upper limit is quickly reached. Alternatively, a shutter can be provided t block the laser beam before reaching the scanning mirror. However, mechanical shutters also suffer from inertial lag and are considered too slow to be effective. Electrically driven crystal acousto-optic shutters can be considered. A third technique, i.e., the "long jump" technique is the most preferable. In the long jump technique, the laser is jumped from a far edge of a tile accelerating over the tile (the launch tile) then crossing the gap at maximum velocity to a distant point on the adjacent tile (the landing tile)

decelerating and beginning to transform the area of the tile near its far edge. By making the long jump, the laser has a sufficient distance in which to accelerate such that it passes over the gap at a high speed and decelerates to the landing point distant from the gap.

Tiles can be formed in various patterns and shapes. One basic way is to form square or rectangular tiles in a straight grid pattern, i.e., with the gaps or grout lines extending continuously in the two directions of the layer (x and y directions). However, with this grid pattern, the grout lines themselves are relatively long lengths of material which when cured are subject to curling. Moreover, the tiles forming the simple grid pattern are not structured to resist curling in either direction caused by shrinkage of the grout lines during curing. Thus, the straight grid tile pattern has two axes of weakness.

An improved tile pattern is an offset or staggered grid wherein the tiles are staggered in alternate rows, like bricks in a horizontal wall. With the tiles in this staggered grid pattern, the grout lines extend continuously only in one axis, rather than in two axes as with the straight grid pattern described above. In addition, in the staggered grid pattern, the grout lines meet only at "three-way" intersections rather than four-way intersections as in the straight grid pattern. Consequently, the grout lines can shrink from only one direction as th tiles block off shrinkage from one side. The staggered grid pattern has only one "weak axis" i.e., along the uninterrupted grout lines, whereas the straight grid pattern has two weak axes. The tiles in the staggered grid pattern reduce curl and also make a stronger layer by distributing weak points.

The relatively long grout lines extending in a single direction in the staggered grid pattern can shrink substantially but still cannot cause the plane of the layer to bend upward, as the alternating tiles are able to resist bending.

As the building material is cured, using preferred materials (XB 5081), there is a delay of approximately 2-3 seconds prior to shrinkage of the material. Consequently, if no grout is used, the tiles can be formed as fast as possible. However, in embodiments which include grout, the tiles must be cured first and allowed to shrink (for a few seconds) prior to laying grout. Tiles can be cured by skinning. This skinning can be formed using multi-pass, weave, rivets, as well as other techniques discussed previously or discussed in previously incorporated applications. These curl reduction techniques allow the tiles to be larger in size without incurring significant curl. The tiles can be cured by providing skin fill over the entire tile surface and then moving on to the next tile. Alternatively, the tiles can be partially cured (e.g., a one line trace) followed by partial curing of other tiles, and then returning one or more times to fully cure the previously partially cured tiles.

In the staggered grid pattern, curing of the grout lines extending unbroken in the x direction causes shrinkage in the y direction inducing some amount of y direction curl.

Triangles are another pattern shape which can be used in tiling. These patterns can be formed by replicating triangle patterns using a single triangle size and shape, or a replicating pattern using triangles of different shapes. In addition, patterns of random triangles can also be used, so long as adjacent edges match to create an acceptably narrow gap. With patterns of random triangles, the grout lines can all be made short and interrupted so as not to create any weak axes.

The hexagon is the most preferable tile shape. Hexagons can be closed packed to form solid tiles separated by thin isolating lines. A pattern of hexagon tiles has no weak axis and no long grout lines. Following the hexagon tile pattern (FIG. 17a) in declining order of preference are random order and size triangles (FIG. 17b), higher order triangles (FIG. 17c), staggered grid square tile patterns (brick wall) (FIG. 17d), straight grid tile patterns (FIG. 17e), square regular array oppositely paired triangles (FIG. 17f) and square array regular triangle patterns (FIG. 17g). Other patterns besides those depicted in FIGS. 17a-g exist which lead to regions of reasonably isotropic cure and no weak axis planes (e.g. regions fitted by two or types of polygons or close packed circular tiles.

In forming layers with tiling, it is preferable to stagger the tile positions from layer to layer, such that the tiles and adjacent layers do not align with each other. Offsetting tiles between layers improves strength without unduly increasing curl. Tiles that are aligned or non-staggered from layer to layer, (i.e., columns of tiles) may be acceptable for tiling in the first few layers above a down-facing feature. Followed by conversion to a method of building that connects the isolated tile regions together. However, if an entire object (excluding a down-facing portions of layer) is built with tiling, staggering of tiles between layers is desirable. The stagger can be intermittent, i.e., with groupings of short columns of tiles throughout the object. If grouting is provided, staggering of tiles between layers may not be required for strength, but may be preferable for homogeneity.

A significant problem addressed by tiling is the need to reduce the length of long vectors. Long vectors can cause tremendous amounts of curl if they are cured and adhered to a previous layer while they are still shrinking. This stress-inducing adhesion to the previous layer can occur along the length of the vector. In the case of a floating vector, it may occur where the ends of the vector attach to a boundary, if a retracted vector embodiment isn't being utilized.

An alternative approach for addressing this problem is known as "Interrupted Scan". In this approach, vectors are drawn with periodic breaks along their lengths. As with tiling, the exposed length is considerably longer than the gap between breaks. The breaks in the vectors can be in a random pattern over the length of a vector, (i.e. the breaks in neighboring vectors can form a random pattern). Alternatively, and presently preferred, methods utilize breaks which are formed in a regular or at least predictable manner. The individual fragmented vectors can either be cured to a depth to cause adhesion or they can be cured to a lesser depth and thereby remain floating.

One method of implementing a form of weaved-interrupted scan is to scan with a weave technique a first pass over a grid of tiles (the floating pass) followed by a second pass over a second grid of tiles to complete the weave. The second grid of tiles is offset from the first grid. This is especially favorable when using a hexagonal tile pattern. To remove the possibility of favored axes, the hexagonal grid can be rotated between passes as well as offset or alternatively the hexagonal grid can be rotated or translated from layer to layer.

Figure 18A:
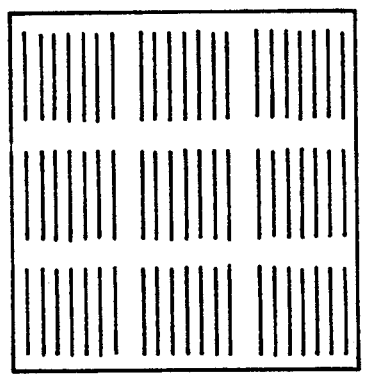
FIGS. 18a and 18b are top views of vectors scanned respectively according to a first pass of an offset weave square tiled exposure pattern and according to both passes of an offset weave square tiled exposure pattern.
Figure 18B:
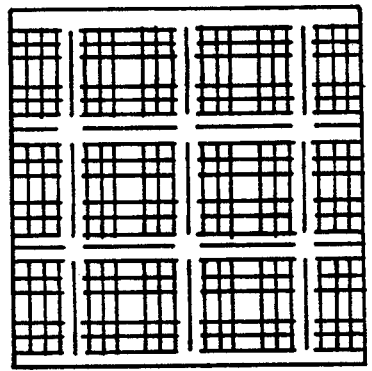

FIG. 18a depicts a top view of cured material after a first pass over a square tiling grid. FIG. 18b depicts the same top view after a second pass over an offset square tiling grid. As can be seen in FIG. 18b, this offset-weaved tile pattern still potentially contains two weak axes.

Figure 19A:
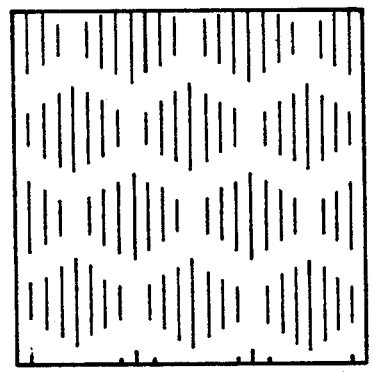
FIGS. 19a, 19b, and 19c are top views of vectors scanned respectively according to a first pass of an offset-weave hexagonal-tiled exposure pattern and according to both passes of an offset-weave hexagonal-tiled exposure pattern and according to both passes of an alternative offset-weave hexagonal-tiled exposure pattern.
Figure 19B:
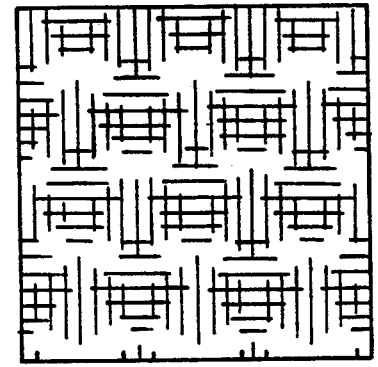
Figure 19C:
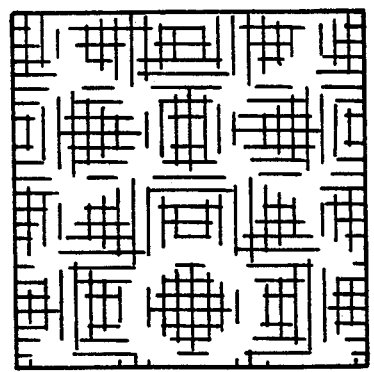

FIGS. 19a, 19b, and 19c are similar to FIGS. 18a and 18b, but they utilize a hexagonal tile grid. As can be seen in FIG. 19b, the hexagonal offset-weaved tile pattern has no long straight weak axes. FIG. 19c depicts an alternative offsetting technique wherein the hexagonal tile grid is rotated as well as offset. Since the length and width of hexagons are not equal, the method depicted in FIG. 19c does not form a simple recursive pattern.

Additional disclosure useful for implementing tiling is set forth in U.S. patent application Ser. No. 07/606,191, which application is incorporated herein by reference. This application discloses use of cross-sectional comparisons to determine down-facing and other features associated with each cross-section. These techniques can readily be extended to determine areas to be tiled. These areas to be tiled may include regions which are 1 or more layers above down-facing features. The most preferred method of implementing tiling, as well as other skintinuous methods disclosed herein, is through deviations between the object design or desired object design and the building representation, where these deviations are incorporated by a Slice or Build type program. The modifications to the Slice program for implementing tiling can include utilization of sets of alternating closely spaced and further spaced hatch paths. The area between the closely spaced paths determines the grouting or gap regions whereas the area between the further spaced paths determines the areas to be filed. A second preferred method is by formation of a vector set of skinning vectors which are continuous across the region which can be broken down into portions of vectors to be cured and portions to be left uncured. This process of determining portions for curing and portions for not curing can be made in the process computer as part of a Build program or the like. Of course, other methods of implementation exist.

An additional method of improving stereolithographically produced parts is known as "Alternate Sequencing" or "Reciprocal Sequencing". This technique is applicable to the various methods of skintinuous building, to the cross-hatched building styles, and to the original methods of building completely solid parts. In conventional stereolithography, the vector drawing sequence is substantially identical from layer to layer. This is especially true when considering fill and hatch vectors. The filling vectors on each layer are processed according to the same rules and output in the same order on every layer. For example, this conventional approach may scan a first set of X-hatch vectors starting with the X-hatch vector which is closest to the X-axis (and the origin) followed by scanning successive X-hatch vectors which are further from the axis. After all the X-hatch vectors are processed, then the Y-hatch vectors may be scanned starting with th Y-hatch vector closest to the Y-axis (and the origin) and followed by those vectors which are successively further away. This conventional approach leads to the same curing and shrinking forces reinforcing each other as successive layers are drawn. This is especially true for identical or nearly identical layers. Therefore, if there are imbalanced forces associated with a particular order of curing, even if these forces are minor, reinforcement from layer to layer can eventually cause enough build up to induce significant levels of distortion in a part. This distortion may be seen in a partially completed part as it builds up or it may be seen shortly after post-curing or after allowing the part to settle after post-curing.

This problem is well known in the art. For example, some symmetrical parts tend to curl in the same region, for no previously explainable reason. An example of this is a part called a SLAB-6. This is a 6-inch by 6-inch by ¼-inch tall square diagnostic part. On repeated buildings of this part utilizing conventional sequencing rules, the same corner of the part tends to pull away from the supports. The primary difference between the corners of the part is in the order in which they are formed.

A solution to this problem is Alternate Sequencing. Alternate Sequencing is a method of scanning wherein the scanning pattern is intentionally altered from layer to layer thereby leading to more uniform dispersion of stresses that can build up during the curing process. The pattern of alternate sequencing may be random or predictable. It may be periodic or non-periodic.

Figure 20:
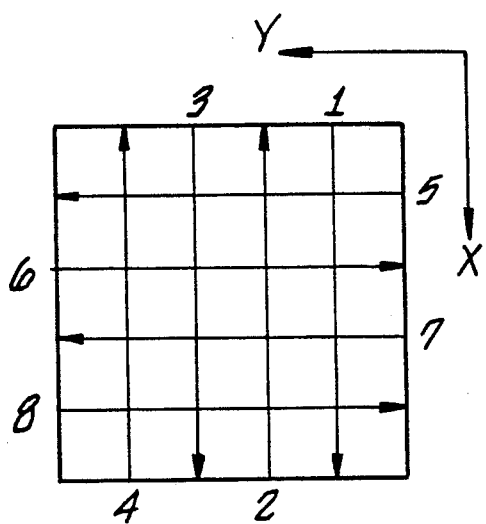
FIG. 20 depicts the currently utilized conventional scanning order for fill and hatch vectors.
Figure 21A:
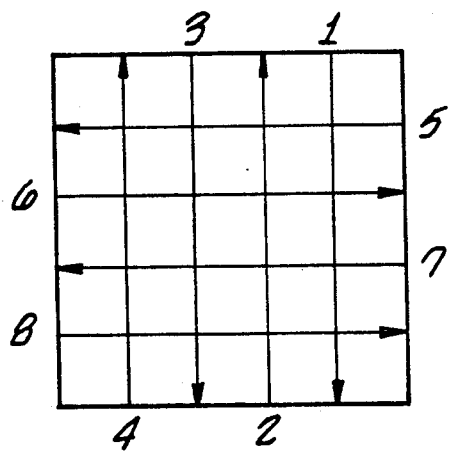
FIGS. 21a and 21d depict respectively each of the scanning patterns of a four-layer sequence of cross-sections utilizing the drawing order of alternate sequencing example #2.
Figure 21B:
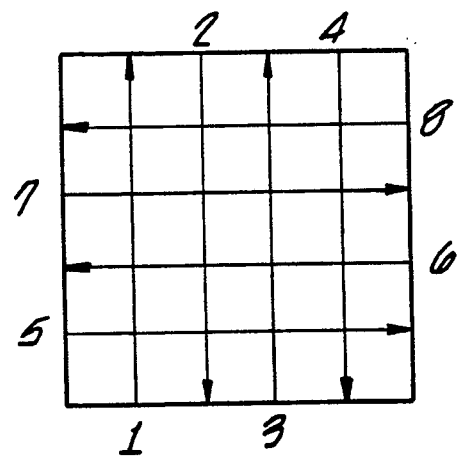
Figure 21C:
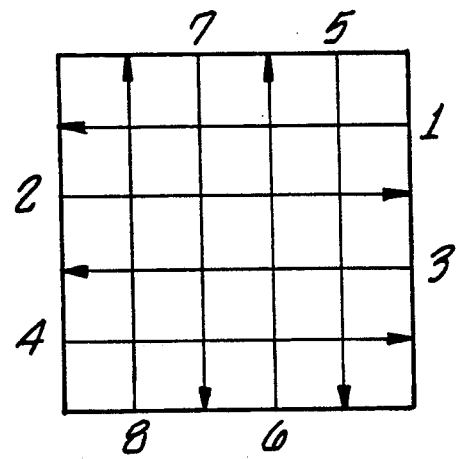
Figure 21D:
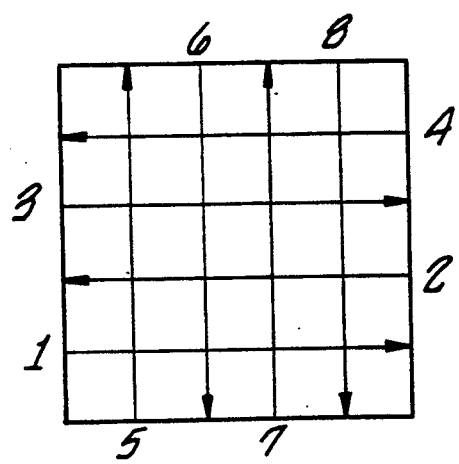
Figure 22A:
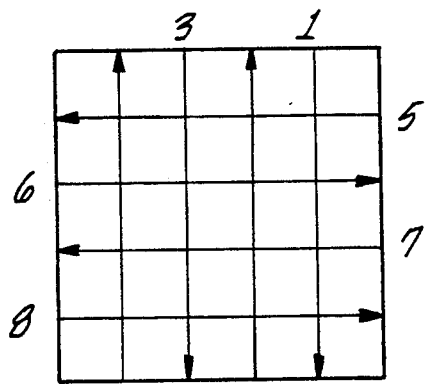
FIGS. 22a to 22h depict respectively each of the scanning patterns for an eight-layer sequence of cross-sections utilizing the drawing order of alternate sequencing example #3.
Figure 22D:
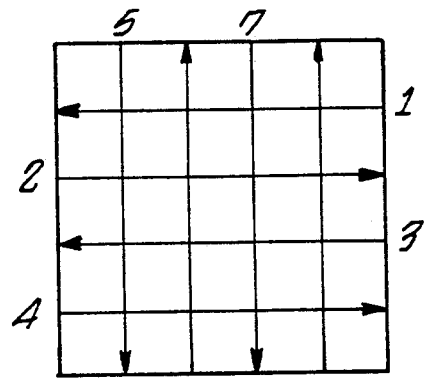
Figure 22B:
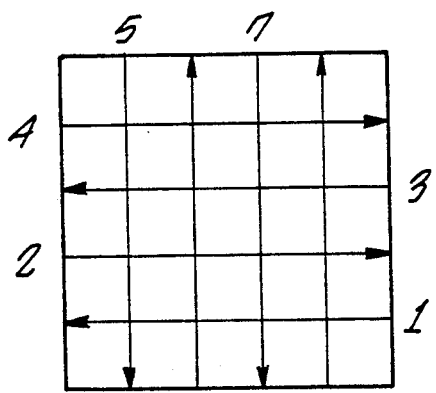
Figure 22E:
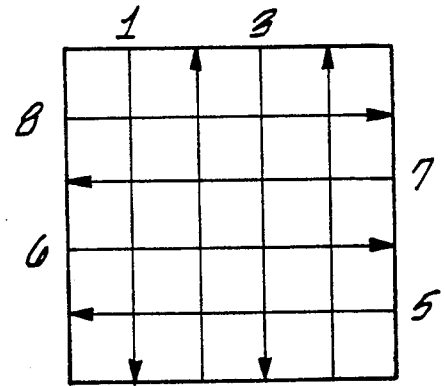
Figure 22C:
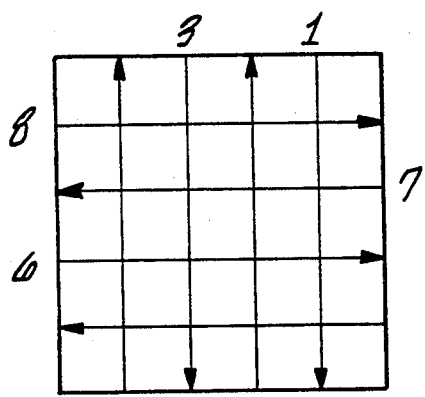
Figure 22F:
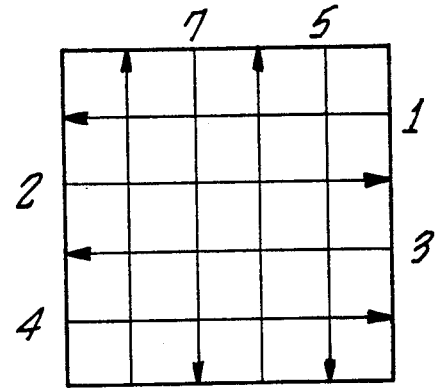
Figure 22G:
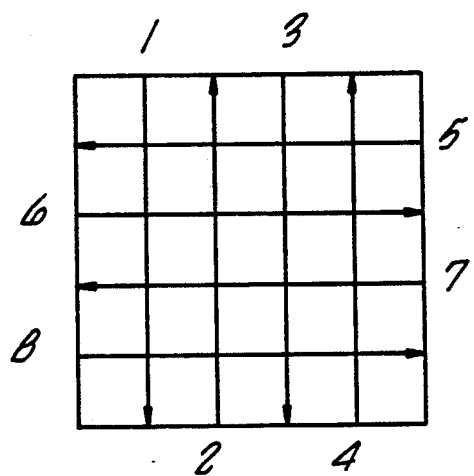
Figure 22H:
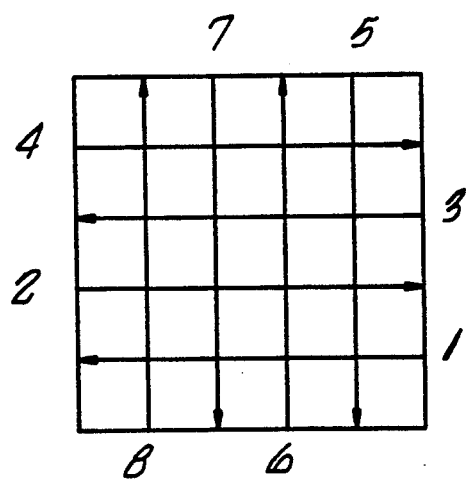

Presently preferred stereolithographic apparatuses, in particular the SLA250 by 3D Systems, Inc. of Valencia, Calif., use a conventional sequencing pattern. At present, the conventional sequencing pattern scans all hatch and fill vectors on all Slice layers in the same sequence. For convenience of description, we assume the machine is oriented so that the front of the vat is considered South and the back of the vat is considered North, and while facing the front of the vat the right side of the vat is East and the left side is West. Specifically in current SLAs, Y vectors are drawn first (they run north and south), starting at the East side of the vat and proceeding towards the West side of the vat. The X-vectors are drawn second (they run east and west) and propagate from North to South. This drawing pattern is depicted in FIG. 20 wherein the numbers 1 through 8 indicate the drawing order of the vectors.

A first example of alternate sequencing uses X-hatch and Y-hatch wherein the X-hatch vectors are scanned followed by scanning the Y-hatch vectors on a first layer and then scanning the Y-hatch vectors followed by scanning the X-hatch vectors on a second layer and repeating this pattern on alternating layers.

A second example expands the two-layer pattern of the first example into a four-layer pattern. On the first layer, X-hatch is scanned first starting with the vectors closest to the X-axis (and the origin) followed by scanning the Y-hatch vectors starting with the vectors closest to the Y-axis (and the origin). On the second layer, X-hatch vectors are drawn first starting with the vectors furthest from the X-axis (and the origin) followed by scanning the Y-hatch vectors starting with the vectors furthest from the Y-axis (and the origin). On the third layer, the Y-hatch vectors are scanned first starting with those closest to the Y-axis (and the origin) followed by scanning the X-hatch vectors starting with those closest to the X-axis (and the origin). On the fourth and final layer, before repeating the pattern, the Y-hatch vectors are scanned first by starting with those farthest from the Y-axis (and the origin) followed by scanning of the X-hatch vectors by starting with those vectors which are furthest from the X-axis (and the origin). An example of this drawing order for the four characteristic layers of the pattern is depicted in FIG. 21a to 21d, wherein the numbers 1 through 8 indicate the relative drawing order of the vectors.

A third example is described by the following table and is depicted in FIGS. 22a to 22h, wherein the numbers 1 through 8 indicate the relative drawing order of the vectors:

Example 3

An 8-Layer X/Y Reciprocal Sequencing Pattern

| FIG. # | Layer Number | Vector Type | Propagation Direction |
|---|---|---|---|
| 22a | 1 | Y | East to West |
|  |  | X | North to South |
| 22b | 2 | X | South to North |
|  |  | Y | West to East |
| 22c | 3 | Y | East to West |
|  |  | X | South to North |
| 22d | 4 | X | North to South |
|  |  | Y | West to East |
| 22e | 5 | Y | West to East |
|  |  | X | South to North |
| 22f | 6 | X | North to South |
|  |  | Y | East to West |
| 22g | 7 | Y | West to East |
|  |  | X | North to South |
| 22h | 8 | X | South to North |
|  |  | Y | East to West |

Similar scanning patterns can be developed based on X/60/120 hatch, or other hatch and fill types and other alternative sequences will be apparent to those of skill in the art. Similarly, drawing order can be based on part geometry, wherein a fixed drawing order can be used to emphasize or deemphasize the tendency of an object feature to curl or not to curl along a particular axis. Alternate Sequencing is a powerful tool which leads to more uniform internal stress distributions, reduced distortions during building, and improved overall part accuracy.

Presently, the most preferred building method is to use "STAR" WEAVE. This embodiment uses an X/Y WEAVE technique, wherein the WEAVE pattern is STaggered from layer to layer utilizing the above described 8-layer pattern of Alternate sequencing along with the hatch vectors being Retracted from the boundary at their termination points. These STAR WEAVE parameters generically discussed previously are more specifically discussed below.

In conventional WEAVE, X and Y hatch vectors on the nth layer having a cured linewidth, L, are drawn with their respective centerlines a distance H from the centerlines of their nearest neighbors. The cured lines are separated from one another by a distance S=H-L. On the next layer, the procedure is repeated with the centerline of a vector on the (n+1)th layer lying directly above the centerline of a corresponding vector on the nth layer. This procedure is then continued on all layers. The result is that at the intersections of the X and Y vectors, the doubly cured points sit directly above one another and the spaces between the doubly cured points sit directly above one another. Thus, conventional WEAVE is analogous to building a wall with bricks stacked directly on top of one another. On the other hand, the method of STAGGERED WEAVE has the centerline of a given vector on the (n+1)th layer offset or staggered with respect to the corresponding vector on the nth layer. Furthermore, the amount of offset, from layer to layer, is approximately H/2. Thus, a doubly exposed point on the (n+1)th layer is positioned midway between the four neighboring doubly exposed points on the nth layer. Therefore, STAGGERED WEAVE is analogous to building a wall with the positions of the bricks offset from those on the previous layer. When using WEAVE, with some photopolymeric resins, microcracks have been observed between adjacent vector lines. These microcracks have been eliminated by use of STAGGERED WEAVE. Of course other patterns of STAGGERING are possible including for example 3 or 4 layer patterns.

The retracted hatch used with STAR WEAVE involves drawing vectors so that each is attached to only the border at its initiation point, and is retracted by a small distance, R, from the border on its opposite or termination end. The optimum retraction distance may be building material (e.g., resin) dependent but can readily be determined by building several diagnostic parts with different amounts of retraction with a given building material and thereafter determining which retraction values are associated with the most accurately formed parts. Furthermore, the retraction itself should alternate between adjacent vectors and possibly between layers. For example, the first X vector might be attached at a right border, and retracted by an appropriate amount (e.g., 0 to 50 mils, and preferably 15 to 30 mils, and more preferably approximately 20 mils) from the left border. As previously noted, the adjacent vector (or some alternating pattern of vectors) will be attached to the left border and retracted from the right border. A similar retraction technique is used for the Y-vectors. Advantages of retracted hatch include reduced internal stresses during part building, reduced stresses on supports with a corresponding reduction in likelihood of catastrophic support failure, reduced time dependent after post-cure distortion, known as "creep", and improved overall part accuracy.

A main thrust of several of the above mentioned embodiments is achieving maximum solidification with minimum distortion prior to attachment of adjacent layers. Complete unattachment for too long a period of time can lead to drifting of solidified material out of its designated position. One method of maintaining the positioning of floating solidified material without inducing curl into a preceding layer is to attach only one point of each vector (e.g. each hatch vector of the first pass of hatch when using the weave approach) to the preceding layer (which will tend to fix the vector in place). Then the one point anchored vectors, which have been floating, are scanned by an additional pass to complete the curing process and to insure adequate adhesion between boundaries and hatch.

Generically, multiscan techniques can be used with many of the above embodiments to help reduce curl. Multiscan may be done in the form of multiple passes over individual vectors or it may be done by crossing of vectors or by riveting areas together, or the like.

The use of Smalley's and other curl reduction techniques may also be readily used in conjunction with many of the above embodiments to reduce various distortions.

An additional approach to minimizing curl in the various skintinuous embodiments is called "Strong Arm". In this approach the first layer of an unsupported region is given extra cure to make it stronger and therefore better able to resist the curl that the weaker, thinner upper layers will attempt to induce in it.

Other distortion reduction techniques defined in the definition section of this application can also be used.

An additional aspect of the present invention involves improved stereolithographic exposure techniques which involve a combination of a fast shutter (e.g. an acousto-optic shutter) and creative scanning techniques. This aspect of the present invention has several advantages over the conventional scanning techniques of stereolithography: 1) improved generation of sharp object features, 2) ability to use less expensive scanners to generate high resolution parts, 3) improved part accuracy by improved exposure, 4) smaller laser beam spot size at the working surface, 5) longer scanner life time, and 6) improved part accuracy by improved positional accuracy of a scanner-encoder system due to more nearly constant mirror rotational velocities during part exposure.

Disadvantages of conventional stereolithography exposure systems involve limited maximum angular acceleration of the scanning mirror systems. The first disadvantage involves the inability to uniformly expose a line of material if the laser scanning system must accelerate or decelerate during the exposure process. This need for acceleration during exposure and limits on the actual acceleration obtainable lead to a maximum scanning speed. This maximum scanning speed is based on the necessity of maintaining a relatively uniform exposure over the length of a vector, thereby limiting one to periods of, and lengths of acceleration that are relatively short.

The second disadvantage with conventional scanning techniques involve the ability to form sharp features. When drawing sharp features with a vector scanning system, the maximum angular acceleration capability and/or the ability of the servo/scanner system limit the accuracy of the sharp feature. These features exhibit some finite radius, and sometimes, some overshoot or ringing behavior beyond the sharp feature which corresponds to unwanted exposure. In order to limit these inaccuracies, scanners with high acceleration capability must be used, and elaborate servo-drivers must be developed and optimized for both regular and sharp feature performance. Higher acceleration scanning systems are more costly and dual role servo optimization (for both regular and sharp features) limits performance with regular features.

Spot size is also compromised as the rotating inertia (moment of inertia) of the mirror must be reduced to maintain necessary system acceleration capability. This precludes the use of larger mirrors with existing scanners that would allow a larger beam size (smaller f/number) and allow a smaller focused spot size at the resin surface.

Scanner lifetime is also compromised by the peak bearing loads which are generated during these sharp-feature maneuvers.

A primary feature of this aspect of the invention involves shuttering the beam when the beam needs to make a significant change in scanning direction or velocity or needs to travel over a region which isn't supposed to be exposed. By shuttering the beam when these target points of non-exposure, change of direction, or change of velocity are reached, the scanning system is allowed to overshoot the target point and decelerate or accelerate (including constant velocity changes of scanning direction) while beyond the target point and outside the area to be exposed. After bringing the scanning system and therefore beam up to or down to the appropriate exposure speed along the appropriate exposure path and passing the beam across the target point the shutter is reopened so the beam can expose the working surface to properly expose the building medium.

A particular embodiment of this aspect of the invention involves the following steps:

1) While drawing vector n, at a particular drawing speed and direction, evaluate vector n+1 to determine any necessary modifications to the scanning parameters that will need to be made. These scanning parameter changes involve the determination of whether or not vector n and vector n+1 meet head to tail, whether vector n and n+1 are to be exposed utilizing the same scanning speed, and whether or not there is a change in scanning direction between the two vectors which requires a significant acceleration. If vector n and n+1 meet head to tail proceed to step 2a, if they do not meet head to tail proceed to step 2b.

2a) With regard to vectors that meet head to tail, an approximate laser path radius at an up-coming sharp feature is computed. This computation may involve the scanning velocity, or change thereof, and the change in scanning direction (angle). The purpose of the computation is to predict a radius based on the desire to keep potential scanning inaccuracies at a tolerable level. This inaccuracies include velocital inaccuracies as well as positional inaccuracies at this junction.

3a) Determine whether the predicted radius is less than or greater than a preset maximum radius limit. If less than the preset radius limit the transition from vector n to vector n+1 is made by the conventional method of scanning. If the predicted radius is greater than the preset maximum limit, the shutter is closed at the sharp corner junction. And the scanning system continues scanning across the junction in the same direction as that scanned for vector n. While approaching the junction or heading away from it a trajectory is determined which will bring the scanning direction and velocity in line with the desired scanning direction and velocity for vector n+1. When the scanners repoint the beam toward the junction point, while traveling along the desired path at the desired velocity the shutter is opened and vector n+1 is scanned. The determined trajectory can be such as to minimize the arc of rotation with which the beam would scan on the working surface if it were not shuttered.

4a. Continue this process by exposing vector n+1 and evaluating vector n+2. Therefore in the above steps replace n+1 with n+2 and replace n with n+1.

2b. With regard to vectors that do not meet head to tail, the shutter is closed as the junction point is crossed. The scanning system continues scanning across the junction in the same direction as that scanned for vector n. While approaching the junction or heading away from it, a trajectory is determined which will bring the scanning direction and velocity in line with the desired scanning direction and velocity for vector n+1. When the scanners point the beam toward the beginning point of vector n+1, while traveling along the desired path at the desired velocity the shutter is opened and vector n+1 is scanned.

3b. Continue this process by exposing vector n+1 and evaluating vector n+2. Therefore, in the above step replace n+1 with n+2 and replace n with n+1.

Figure 25A:
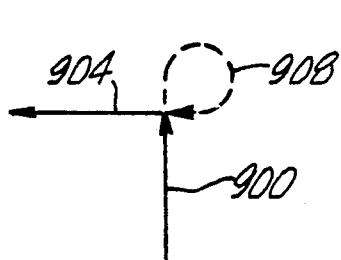
FIGS. 25a to 25g depict various orientations of vectors n and n+1 along with various virtual scanning paths that can be followed to scan from vector n to vector n+1.
Figure 25B:
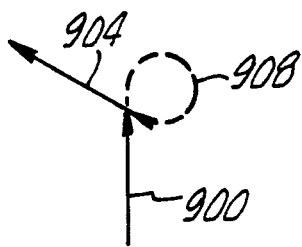
Figure 25C:
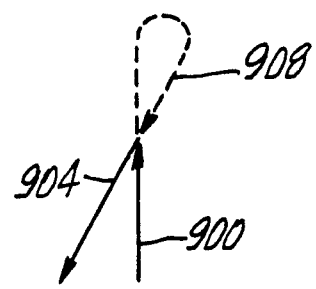
Figure 25D:
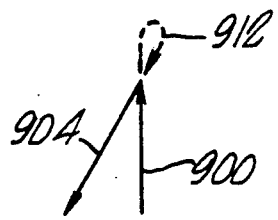
Figure 25E:
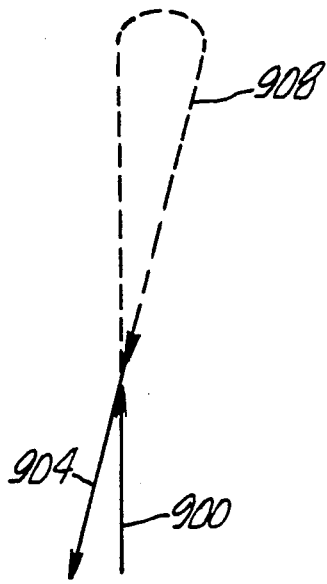
Figure 25F:
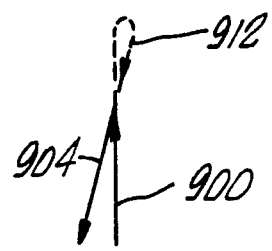

FIGS. 25a to 25g depict various orientations of vector n and vector n+1, 900 and 904 respectively, along with shuttered (virtual) scanning paths while maintaining a constant scanning speed and implementing a maximum tolerable acceleration which is indicated by 908. Alternatively these shuttered paths 912 can be modified by allowing for a change in scanning speed before and after the change in scanning direction (angular acceleration of the beam on the working surface). The scanning speed can be reduced after shuttering occurs and before the attempted angular acceleration and then increased prior to reopening the shutter. As indicated this may allow for shorter virtual scanning paths by allowing for a tighter turning radius. FIGS. 25a, b, c, and e depict constant speed virtual paths for different types of junctions using a maximum allowed value of angular acceleration. FIGS. 25d and 25f depict virtual paths wherein the scanning speed is linearly decelerated and accelerated prior to the angular acceleration involved in changing directions (smaller turning radii). Alternatively, FIGS. 25d and e can be view as depicting virtual paths in which their is a change in speed during the virtual scan to accommodate a desired change in scanning velocity between the two vectors.

Figure 25G:
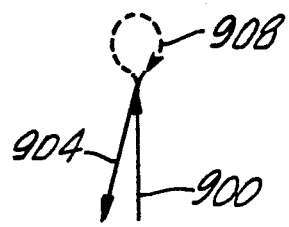

Other alternative approaches include:

1) Any combination of moves beyond the junction that reduce the maximum mirror acceleration. For example, as indicated above, as a sharp feature gets sharper and approaches a 180 degree turn, the technique of constant velocity and minimum turning may result in unacceptable time delays (e.g. FIG. 25e). Therefore a computationally more complex embodiment can be implemented where there isn't an attempt to minimize the magnitude of the angular rotation. An example of this type of embodiment is depicted in FIG. 25g, wherein the virtual scan begins with a slight angular acceleration in the direction opposite to that which would directly bring the scanning path parallel to the appropriate direction. This type of virtual scan is known as an "airplane style" turn. The benefit of this use of opposite angular acceleration is in the reduced scanning path length and therefore reduced virtual scanning time. This airplane type of turn is appropriate for scanning hatch and fill type vectors wherein there is a short gap between the vectors and a required 180 degree turn.

2) Use of two stage scanning, wherein coarse scanners are limited to some preset acceleration, while limited range fast scanners "sharpen up" the corners. Acousto-optic crystal modulators act as frequency controlled diffraction gratings, by varying standing waves within the crystal, and as such can be used to deflect a beam slightly for fine position adjustments or to deflect it sufficiently into a beam trap, thereby acting as a shutter. Therefore, a pair of acousto optic modulators or the like can function as both shutters and fine adjust scanners. An example of another candidate for fine adjustment scanners are piezoelectric crystal mirrors that can be mounted in front of or on the course of scanning mirrors.

PREFERRED METHODS OF OBTAINING UNIFORM EXPOSURE

Turning to FIGS. 1 and 2, it will be seen that multiple exposure of boundaries 10, hatch lines 12, and skin fill 14 will likely cause cure depth variations as depicted in FIG. 2.

To obtain a smooth down-facing region, the net exposure over all the area elements must be the same. While uniform cure depth is necessary for smooth down-facing features, it is not necessary to achieve smooth up-facing features. These up-facing features attain their smooth surface finish from the smoothness of the building material working surface (e.g. resin surface), and from adequate strength of skins preventing their collapse from various forces including shrinkage during post-curing.

There are three main approaches that are exemplified herein to attain uniform exposure, particularly of down-facing regions. While the third approach is most preferred, the other two are within the scope of the invention, as are variations of all three that will be apparent to one of ordinary skill in the art in light of the following description.

A first approach to avoid differential exposure is to avoid the use of both boundary and hatch vectors, and only use fill vectors to cure down-facing regions, using uniformly exposed skin fill that results in an appropriate skin depth. This is a viable method of obtaining uniform exposure and therefore cure depth, but can suffer from distortion problems, as a relatively rigid frame (boundary and cross-hatch) is generally required to keep the skin from distorting as it is drawn. As described previously, if special attention is paid to the drawing order of the vectors, this method can be made viable.

A second approach is to draw boundary and modified hatch vectors to the full desired depth. First, hatch vectors must not be permitted to cross other hatch or boundary vectors to avoid extra depth being added to these solidified crossover regions. The remaining pockets are filled in with small skin fill vectors that do not cross any of the cured boundary or hatch lines.

This second approach can be implemented, for example, by either of two methods.

The first method is based on a single direction of hatch being drawn as uninterrupted vectors with hatch that runs in other directions "jumping" the points where they cross the first hatch type and where they cross each other. These hatch vectors are broken into their required components and stored in an output file for controlling the movement of the scanning mirrors (sometimes referred to as an .SLI file). In addition to hatch vectors that are drawn part of the time and jump the other part of the time, individual skin fill vectors can be created to fill each pocket that is formed by intersecting hatch and/or boundary vectors. These fill vectors are stored in the .SLI file.

The second method is based on standard hatch and skin fill vectors being stored in the SLI file along with a system (e.g., as part of the mirror driving system) that uses slice, beam profile, vector intersect direction, and cure depth parameters to break down vectors into drawing and jumping elements depending on whether they cross a hatch vector, boundary vector, or whether a hatch vector is underneath the vectors being analyzed.

These two methods falling within the second approach require definition of what it means for hatch and skin fill vectors to cross or lay on top of hatch or boundary vectors. This definition can be based on a determination of how closely an exposed vector (both skin and hatch) can approach a hatch or boundary vector without causing an increase in maximum cure depth in that region.

The first method of this second approach may result in creating large .SLI files and large associated vector loading times. Accordingly, the second method of the second approach is currently more preferred, when used in conjunction with a look-up table. The contents of such a table in each instance will vary, depending upon the slice parameters used, beam profile characteristics, and desired cure depth to be obtained, and can be routinely formulated for any required set of parameters by one of ordinary skill in the art. This system can optionally be adapted to account for approach angles between vectors.

Figure 1A:
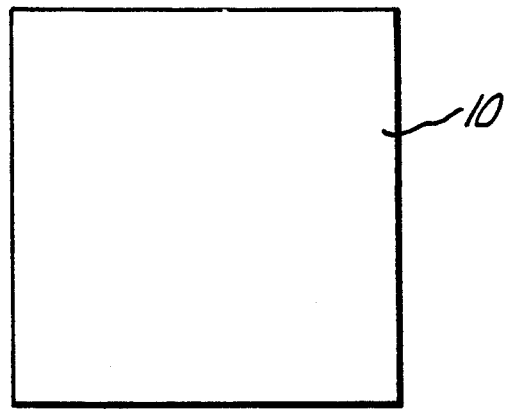
FIGS. 1a-1d collectively show a top view of a layer showing boundaries, hatch and skin without compensation for multiple exposures of building material at the various regions of the cross-section.
Figure 1B:
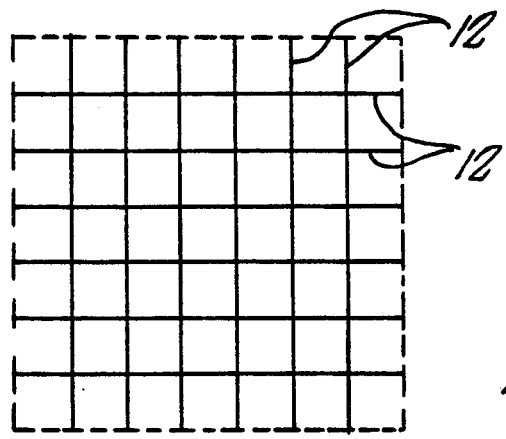
Figure 1C:
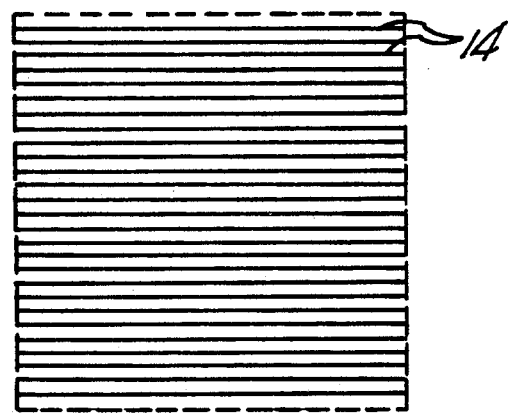
Figure 1D:
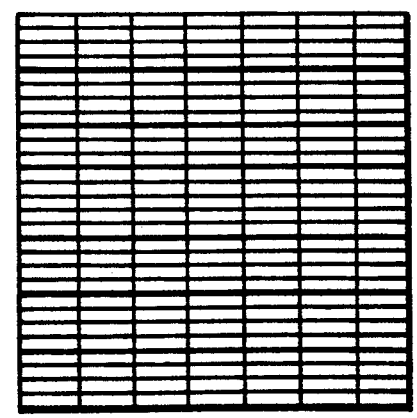
Figure 3A:
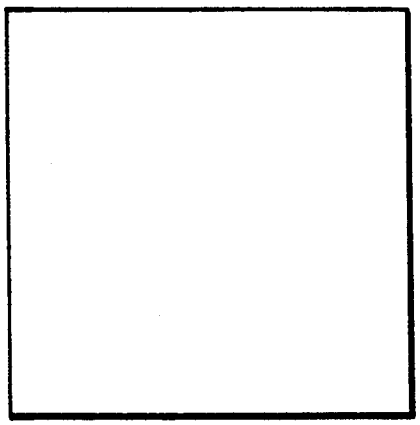
FIGS. 3a-3e collectively illustrate a top view of a layer showing boundaries, hatch and skin as created by a presently preferred technique.
Figure 3B:
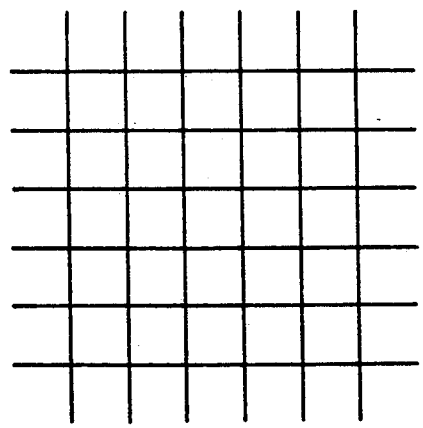
Figure 3D:
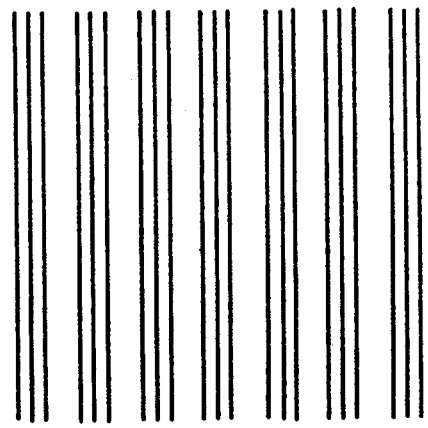
Figure 3C:
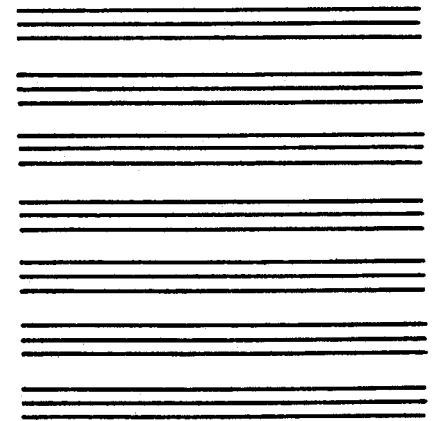
Figure 3E:
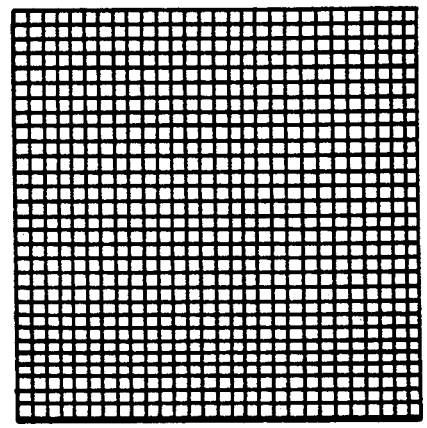
Figure 4A:
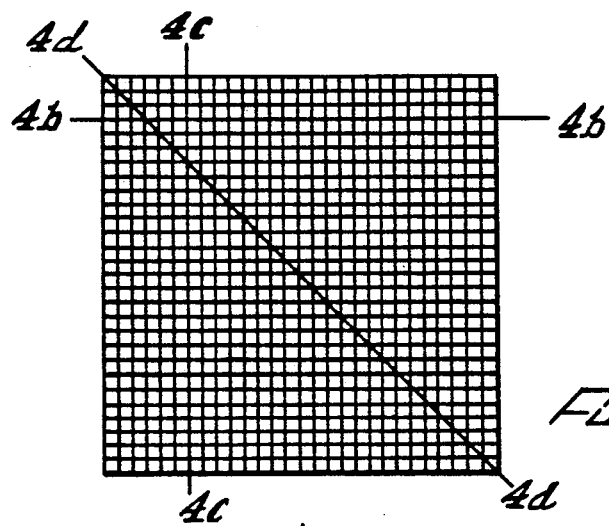
FIGS. 4a-4d collectively show a side view of FIG. 3e as intersected by three different vertical planes.
Figure 4B:
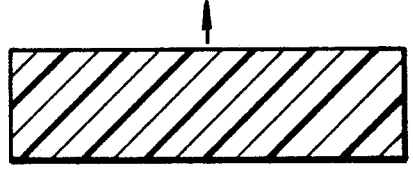
Figure 4C:
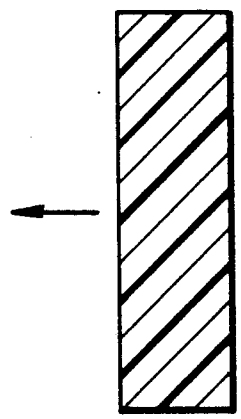
Figure 4D:
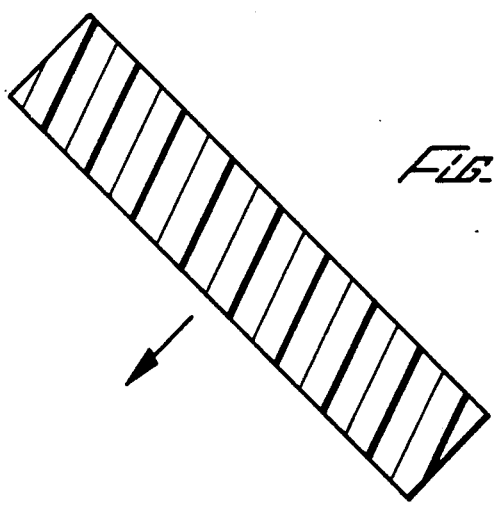

The third, and currently most preferred, approach is based upon matching skin parameters to hatch parameters, to avoid duplicate exposure by skin vectors of regions cured by hatch vectors. The duplicate exposure could result from skin vectors running parallel or antiparallel to the hatch vector regions. While certain embodiments of this aspect of the invention have been presented other embodiments will be apparent to those of skill in the art after reviewing and understanding the disclosure herein. This approach differs from the above-described approaches in that the skin vectors are drawn over the cross-hatch, giving additional exposure to hatch vectors that are not parallel to the skin vectors as drawn. This continuation of skin fill vectors will keep the .SLI file size from becoming too large. This approach is collectively illustrated in FIG. 3. It will be noted that the skin fill in FIGS. 3c and 3d is discontinuous in areas corresponding to the x- and y- hatch running parallel thereto. The uniformity of the resulting cure depth is illustrated in FIG. 4.

A down-facing skin area, or "region," can be divided into categories or "subregions," based upon the nature of the exposure, i.e., whether and to what extent there is overlap between different vector exposures, as follows:
  subregion 1—skin exposure only;
  subregion 2—skin and hatch overlapping exposure;
  subregion 3—skin and boundary overlapping exposure;
  subregion 4—hatch and boundary overlapping exposure;
  and subregion 5—skin, hatch and boundary overlapping exposure.

Several approaches are suitable for exposing subregions 1 through 5 such that each region will be given the same net exposure. In the presently most preferred embodiments, three criteria are paramount.

First, to provide a suitably rigid frame to support the skin fill, the following drawing order is preferred: first, boundary vectors, then hatch vectors, and finally fill vectors are drawn.

Second, the fill vectors and the hatch vectors preferably begin and end short of the boundary vectors by ½ the ECW of the boundary vectors (taking into account the angle of approach). This reduces subregions 3, 4, and 5 to regions that contain boundary vectors only, such that the boundary vectors should be given the full exposure required in order to attain the desired cure depth.

Finally, a set of fill vectors are preferably drawn parallel to each type of hatch vector used, and all fill vector types are preferably given the same exposure, with the exception that fill vectors should not be allowed to contribute to further exposure in the regions exposed by their parallel hatch type. For example, if x- and y-hatch are used, then x- and y-fill are also used. Also x-fill vectors will only be created that are spaced at least ½ the ECW of the hatch lines away from the x-hatch vectors. A similar relationship should be maintained for y- fill and y-hatch.

This means that subregion 1 will have an exposure equivalent to the combined exposure of each fill type. Using the same example of x- and y-hatch and fill, each fill type should be exposed to ½ the exposure required to obtain the desired cure depth. Limiting fill vector exposure in this manner has a profound effect on subregion 2, which can be considered to consist of two microregions: a) a microregion containing overlapping of the various hatch types as well as the various fill types, and b) a microregion containing a single hatch type and the various fill types. Fill vectors will be absent from this first microregion since they have been excluded to avoid re-exposing hatched areas. Accordingly, the first microregion receives its total exposure from that of the combined hatch types. Thus, for x- and y-hatch, each hatch type will contribute ½ the needed exposure. For the second microregion, part of the exposure will be provided by the single hatch line, and the remainder by fill types that are nonparallel to it. This results in the total exposure being given by the exposure of one hatch line plus the exposure from all but one of the skin types. Therefore, the number of exposure sources is equal to the number of cross hatch types, and hence, to the number of skin fill types. Using x- and y-hatch, for example, ½ the exposure in a region of x-hatch is provided by this hatch and the other ½ is provided by the y-fill and vice-a-versa.

This most preferred approach can be summarized as follows: The preferred curing order begins with boundary vectors, followed by hatch vectors, and finally by fill vectors. The boundary vectors provide the desired cure depth. The skin and hatch vectors are shortened due to the ECW of the boundaries (shortened by the EEP). The fill vectors are not allowed to contribute to the exposure (be created) within ½ the ECW of either side of a parallel hatch vector. Each combination of hatch type with its parallel skin type is used to achieve a uniform cure depth. Each hatch vector and net exposure of its corresponding fill type is given the same exposure. Therefore, the individual fractional exposure (IFE), a dimensionless fraction of the needed exposure, given to each type is the reciprocal of the number of different hatch types (NHT), i.e.,

*IFE=1/NHT.*

A preferred embodiment of the above is based on the use of the presently preferred cross hatching method. This preferred hatching technique utilizes x and 60/120 hatch instead of x- and y-hatch While the foregoing discussion relates to generally preferred methods of reducing "waffle" appearance, it is most preferred to use this method of waffle reduction/removal in connection with these presently preferred hatch types, i.e., equally-spaced x, 60° and 120° hatch. The resulting hatch vectors form equilateral triangles. Accordingly, there will be regions where there is one hatch vector, and regions where three hatch vectors overlap, but never, assuming accurate scanning, regions where only two vectors overlap. The corresponding skin fill will be in the X, 60°, and 120° directions. These fill vectors will again not be allowed to produce additional exposure within the ½ the ECW of either side of their parallel hatch vectors and within ½ the ECW (taking into account the angle of incident) of the boundary vectors. The order of curing will again be boundaries first then hatch and then fill. The boundaries will be given a full exposure to bring them to the desired cure depth. The hatch and fill vectors will again be shortened on each end by the EEP of the boundary vectors. The hatch vectors will each be given ½ the required exposure necessary to achieve the final desired cure depth. The fill vectors will be scanned such that the net exposure in the "skin only" region will also be given by ½ of this exposure.

Except in regions of boundary vectors, to reach full exposure, each point must be scanned by three vector types of ½ exposure from each type. In the region of skin alone, if all three skin types of equal (½) and overlapping exposures are used, a net exposure of 1 will be attained. Similarly, for a region of hatch and skin, one hatch type is used, along with the two skin types not parallel to it. Each is given an equal exposure of ⅓ to obtain a region of net exposure 1. If the hatch vectors form equilateral triangles, it follows that each time any two hatch vectors overlap, the third hatch vector will also be present. If each hatch vector is given an exposure of ⅓, then the net exposure in this region will be 1.

In regions where boundaries occur, an imbalanced situation exists due to the presence of a boundary vector as well as the other vector types described above. The possibilities include the presence of: 1 boundary+3 hatch vectors; 1 boundary+1 hatch+2 fill vectors; or 1 boundary+3 skin vectors. These combinations can be addressed, for example, in one of two ways: 1) have all hatch and fill vectors stop short of the boundary (at ½ the effective cure width) and then give the boundary itself an exposure of one; or 2) select two of the hatch types and the same two skin types to cure completely up to the boundary and stop the other hatch and skin type short of the boundary at ½ the ECW of the boundary. If the boundary vectors are given a ⅓ cure, as are the other vectors, this combination results in a net exposure of 1 in the boundary region. The first of the above two options is presently the most preferred.

Yet another embodiment is based on the use of x and y hatch along with the second option described above. In this case, the exposure in the boundary region would be due to the boundary vectors, one hatch and its corresponding fill type with the other hatch and fill type stopping short. This embodiment has the advantage of insuring better adhesion between the boundary vectors and the fill and hatch vectors.

Still another embodiment is based on the use of x and 60/120 hatch along with the net exposure in the boundary areas being made up of exposing boundary vectors along with exposing two of the three types of hatch and the corresponding fill vectors.

Other additional embodiments are conceivable. For example, where a different cure is given to a hatch type and its corresponding fill type as compared to the exposure given to the other hatch and fill types, wherein the net resulting exposure still produces the desired skin depth. It is also possible to extend this approach to include other sources of print through, such as that due to crosshatch from the layer above the one that contains the down-facing feature. The cross hatch on this higher layer can actually print through the lower layer. Using a particular material, this print through effect is reduced when larger layer thicknesses are used and increased when smaller layer thicknesses are used. Using experimental or analytical methods, the amount of print through can be determined, and the cross hatch on the layer containing the down-facing feature can be given a correspondingly lower cure. After the exposure of this layer and the following layer, the down-facing feature will have a uniform cure. In most cases, there are crosshatch vectors on the layer immediately following the down-facing feature where the above compensation method would be useful. However, on rare occasions, an up-facing feature may be on the same layer as a down-facing feature (therefore the feature is only one layer in thickness), requiring the hatch and fill to be perfectly matched based on the one layer thickness of cure. On layers that have both up- and down- facing features in the same area, it is important to insure that only the down-facing skin is cured, so as not to use more exposure than desired.

In the above description, only one effective cure width has been exemplified to describe the proximity with which vectors can approach one another, but more than one ECW and EEP can be used in appropriate circumstances.

The methods described herein have been implemented and verified experimentally using x- and y-hatch and fill without need of modified software. An object can be sliced using x- and y- hatch and x- and y- skin fill. The SLI file created can then be edited by hand, removing the skin fill vectors that are within a specific distance of their parallel hatch vectors (this distance is the ECW). This SLI file can then be merged with a support file. The range file can then be prepared giving an equal cure to the x- and y- hatch, and an appropriate single line exposure given to the fill vectors in order to produce an equivalent total exposure as that from the x and y hatch.

Alternatively, the software can be modified:
1) by creating a skin type corresponding to 60° cross hatch and another corresponding to 120° cross hatch,
2) by creating a Slice option (or in some other appropriate program) to allow an offset for skin vectors to not be produced (or not drawn) in the vicinity of hatch paths, and
3) creating an option to allow reduction of cross hatch and fill vectors on each end by a required amount.

Another preferred embodiment of the portion of the present invention dealing with obtaining uniform skin depth is based on the idea of using the same exposure for both the hatch vectors and the skin vectors. The hatch vectors and skin vectors are drawn at the same scanning speed. In the previous embodiment, the net area exposures where the same not the individual vector exposures. In this embodiment there is no need to produce separate crosshatch. Instead, periodically spaced skin vectors are pulled from the skin list and put into a hatch list for exposure prior to exposing the remaining skin vectors. These initially exposed skin vectors function as crosshatch and as such this method no longer requires the computation of the ECW for crosshatch and skin vectors. For the hatch vectors to have adequate strength in order to form a frame for supporting the skin vectors, it may be useful to space the skin vectors at a maximum spacing (but still able to form an adequately uniform cure depth) so that the individual skin/hatch vectors will be relatively strong.

PREFERRED METHODS OF SELECTING AND DETERMINING CURE DEPTH

To make a theoretical determination of skin thickness, by one or more methods of calculation, one would ordinarily consider the parameters of velocity [step period (SP) and step size (SS)], laser power, beam profile, building material, working curve cure depth and associated maximum cure width, and vector offset. However, if a skin is formed that is several times wider than the laser beam, and a step size and an offset are used that are several times smaller than the laser beam width, the energy distribution over the skinned area will be substantially uniformly distributed. If the energy is uniformly distributed, the area will be uniformly cured to a particular depth depending on the exposure. Thus, the exposure is defined as, Energy per unit area=Laser Power×Step Period/(Step Size×Offset). This above relationship can be equated to a particular thickness by plotting thickness versus log of exposure which, if the resin absorption obeys Beer's law will result in a linear relationship. From this relationship, one can determine the slope and intercept of this plot. Since the above relationship does not explicitly contain focus, profile, and machine working curve parameters, the constants determined for one machine should be directly usable on another machine as long as the parameters of material, wavelength, and distance from the scanning mirrors to the surface of the resin are the same (or accounted for).

The foregoing detailed description an following Examples should be understood as being illustrative rather than limiting, as routine variations and modifications are within the scope of the invention as will be appreciated by one of ordinary skill in the art. Accordingly, it is intended that the invention be limited only by the appended claims, and all equivalents thereof.

EXAMPLES

Example I

An experiment was conducted to determine whether skinning every layer of a part gives any advantage with regard to minimizing distortion as compared to building techniques based on trapping substantially untransformed material within the limits of the part.

Figure 12:
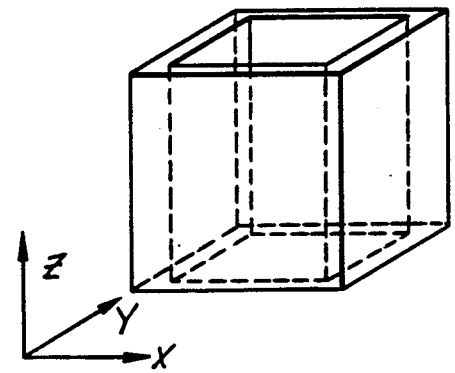
FIG. 12 depicts the three-dimensional object used in Example 1 to test the improvements of "skintinuous" building.

In this experiment, eight parts were built, in groups of two. Each group included an object built on an elevator platform in front of the midpoint of the platform and an object built on the elevator platform behind its midpoint, the objects were identical except for their locations on the building platform. A sample object is depicted in FIG. 12. Each object was a one inch cube with no top and no bottom but with a wall thickness of 100 mils. Various slicing and merging options were used to create four different groups:

| Grp Name | Description |
| --- | --- |
| Skntin01 - | Front object has skin on every layer.<br>Rear object has skin only on top and bottom layers. |
| Skntin02 - | Front object has skin only on top and bottom layers.<br>Rear object has skin on every layer. |
| Skntin03 - | Front object has skin on every layer.<br>Rear object has skin on every layer. |
| Skntin04 - | Front object has skin only on top and bottom layers.<br>Rear object has skin only on top and bottom layers. |
| All (8 parts) | 4 groups were built with the following parameters:<br>Layer thickness - 20 mils<br>Cure thickness for layer boundaries - 26 mils<br>Cure thickness for layer hatch - 26 mils.<br>Hatch vectors ran parallel to the x-axis and the y-axis spaced at 50 mils and skin vectors ran parallel to the X-axis. |

Cure thickness for skin fill was not specified as thickness but as ½ the step period (SP) for a 26 mil cure (with an SS of 2) and step size (SS) of 16. All skin fill vectors ran parallel to the x-axis with a 2 mil offset between them. (As a side note, measurement of skin thickness under similar cure conditions indicated that the cure thickness was approximately 20 mils. The building material was SLR 800, manufactured by DeSoto Chemical.) Measurements were made on each part to determine the resulting structural accuracy of the part. No attempt was made to compensate for cure shrinkage. A series of measurements were made near the top of each part. The measurements are depicted in FIG. 3. They are labeled 501 to 506. Measurements 501 to 503 measure distances parallel to the X axis, while measurements 504 to 506 measure distances parallel to the Y axis. The amount of distortion of the part along the X-axis is defined as $$\text{Distortion (X)} = (501+503)/2 - 502,$$

similarly distortion along the Y-axis is defined as $$\text{Distortion (Y)} = (504+506)/2 - 505.$$

The parts were skinned in the X-direction, the X-distortion is the distortion of the wall perpendicular to the skinning direction and the Y-distortion is the distortion of the wall parallel to the direction of skinning.

The results are summarized as follows:

Skntin01

Front Object, all layers skinned along the X-direction
 distortion of wall perpendicular to direction of skinning = 3.6 mils
 distortion of wall parallel to direction of skinning = 9.4 mils
Rear Object, Standard building, skinned only top & bottom
 distortion of wall perpendicular to direction of skinning = 9.6
 distortion of wall parallel to direction of skinning = 9.7

Skntin02

Rear Object, all layers skinned along the X direction
 distortion of wall perpendicular to direction of skinning = 1.2 mils
 distortion of wall parallel to direction of skinning = 8.2 mils
Front Object, Standard building, skinned only top & bottom
 distortion of wall perpendicular to direction of skinning = 9.1 mils
 distortion of wall parallel to direction of skinning = 7.0 mils

Skntin03

Rear Object, all layers skinned along the X direction
 distortion of wall perpendicular to direction of skinning = 1.5 mils
 distortion of wall parallel to direction of skinning = 7.9 mils
Front Object, all layers skinned along the X direction
 distortion of wall perpendicular to direction of skinning = 2.0 mils
 distortion of wall parallel to direction of skinning = 7.7 mils

Skntin04

Front Object, Standard building, skinned only top & bottom
 distortion of wall perpendicular to direction of skinning = 11.0 mils
 distortion of wall parallel to direction of skinning = 9.7 mils
Rear Object, Standard building, skinned only top & bottom
 distortion of wall perpendicular to direction of skinning = 9.5 mils distortion of wall parallel to direction of skinning = 7.9 mils In summary, skinning each layer in the x-direction reduced distortion in dimensions measured parallel, but not perpendicular, to the X-axis.

Example II

In a second experiment, parts were built by skinning each layer with skin that was perpendicular to the direction of the skin on the previous layer. In other words parts were built with X-type skin fill on every other layer and Y-type skin on the other layers. The parts were the same as those described for Example I, except for the differences in skinning.

Skntin05

Front Object, Every layer skinned, alternating X and Y types
 Distortion (X) = 4.9 mils
 Distortion (Y) = 4.4 mils
Rear Object, Standard building, skinned only top & bottom
 Distortion (X) = 4.0 mils
 Distortion (Y) = 5.3 mils

Skntin06

Front Object, Standard building, skinned only top & bottom
 Distortion (X) = 3.1 mils
 Distortion (Y) = 7.4 mils
Rear Object, Every layer skinned, alternating X and Y types
 Distortion (X) = 5.0 mils
 Distortion (Y) = −2.7 mils

Skntin07

Front, Standard building, skinned only top & Bottom
 Distortion (X) = 5.3 mils
 Distortion (Y) = 6.2 mils
Rear, Standard building, skinned only top & Bottom
 Distortion (X) = 9.4 mils
 Distortion (Y) = 6.8 mils

Skntin08

Front Object, Every layer skinned, alternating X and Y types
 Distortion (X) = 2.5 mils
 Distortion (Y) = 3.0 mils
Rear Object, Every layer skinned, alternating X and Y types
 Distortion (X) = 1.9 mils
 Distortion (Y) = 4.1 mils

Skntin09

Front Object, Skinned on every layer, all skin of the Y-type
 Distortion (X) = 6.0 mils
 Distortion (Y) = 1.0 mils
Rear Object, Skinned on every layer, all skin of the X-type
 Distortion (X) = 1.5 mils
 Distortion (Y) = 7.5 mils In summary, this data has substantial scatter but one can conclude that skinning in x- and y- directions on opposite layers appear to generally reduce distortion to some extent in each direction.

Example III

Similar experiments to those set forth in Examples I and II tended to show that providing both x- and y- skin fill on each layer generally reduced distortion in both x- and y- directions.

Similar experiments to those set forth in Examples I and II showed that providing X- skin fill along with X, 60, and 120 degree hatch on each cross-section substantially reduced distortion in both directions.

Example IV

Four 1"×1" squares were built in a single build process on a stereolithographic apparatus. Each square consisted of six 20 mil layers. The structural support for each layer was based on x- and y- cross hatch, spaced at a 50 mil separation. Each square was supported by a grid of webs placed at a spacing of ¼". The webs consisted of ten 20 mil layers. On the top surface of each square a standard skinning technique was applied. Therefore, the top surface was given x skin fill spaced at 2 mils on top of a grid of x- and y- crosshatch. The supporting web structures were numbered 1 through 4 while the square patches were numbered 5 through 8 (based on the merge order).

On the first layer of each square, x- and y- hatch were applied using a particular exposure along with a particular skinning technique and associated exposure. The second through sixth layers were given the standard 26 mil cure depth for boundaries and hatch. On the first layer the boundary vectors were given the full desired cure depth, without factoring in any reduction in hatch and skin vectors for the purpose of minimizing multiple exposures in boundary regions. The skinning/exposure technique was varied for the first layer of each patch.

Square Patch 5: "Standard Approach to Down-Facing Skins"
 boundary = 26 mil cure (SP 65, SS 2)
 x- and y- cross hatch = 26 mil cure (SP 65, SS 2)
 x- skin fill = half the SP of a 26 mil exposure if SS = 2 (SP 33, SS 16); fill vectors spaced at 2 mils with no gaps except exact duplicates of hatch.
 y- skin fill = None Square Patch 6: "Down-Facing Skins with Skin Slightly Under-Exposed"
 x- and y- cross hatch = 20 mil cure (SP 29, SS 2)
 boundary = 20 mil cure (SP 29, SS 2)
 x- skin fill = SP for a 16 mil cure if SS = 2 (SP 17, SS 16); fill vectors spaced at 2 mils with vectors removed that are 2 mils and 4 mils from parallel hatch vectors (this means the skin fill vectors that are closest to the hatch are 6 mils away).
 y- skin fill = SP for a 16 mil cure if SS = 2 (SP 17, SS 16); fill vectors spaced at 2 mils with vectors removed that are 2 mils and 4 mils from parallel hatch vectors.

Square Patch 7: "Down-Facing Skins with Skin Exposure Closely Matched to Cross Hatch Exposure"
 boundary = 20 mil cure (SP 29, SS 2)
 x- and y- cross hatch = 20 mil cure (Sp 29, SS 2)
 x- skin fill = SP for a 20 mil cure if SS = 2 (SP 29, SS 16); fill vectors spaced at 2 mils with vectors removed that are 2 mils and 4 mils from parallel hatch vectors.
 y- skin fill = SP for a 20 mil cure if SS = 2 (SP 29, SS 16); fill vectors spaced at 2 mils with vectors removed that are 2 mils and 4 mils from parallel hatch vectors.

Square Patch 8: "Down-Facing Skins with the Skin Slightly Over-Exposed"

boundary=20 mil cure (SP 29, SS 2)

x- and y- cross hatch=20 mil cure (SP 29, SS 2)

x- skin fill=SP for a 26 mil cure if SS=2 (SP 65, SS 16);

fill vectors spaced at 2 mils with vectors removed that are 2 and 4 mils from parallel hatch vectors.

y- skin fill=SP for a 26 mil cure if SS=2 (SP 65, SS 16);

fill vectors spaced at 2 mils with vectors removed that are 2 and 4 mils from parallel hatch vectors.

After building these four square patches they were examined, and none of the parts showed any signs of distortion. Part 5 had the typical large waffle with cross hatch protruding beyond the skin. Part 6 had a smaller waffle with cross hatch protruding beyond the skin. Part 7 had cross hatch and skin fill cured down to approximately the same level. However, there were slight protrusions along the sides of the cross hatch and a slight depression in the center of the cross hatch indicating that the skin was slightly overcured and maybe that the skin was not cured within the proper effective cure width of the cross hatch. Part 8 seemed to have cross hatch whose center line was depressed as compared to the skin and to a raised overlapping edge where skin and cross hatch joined. The size of the discontinuities in Part 8 were larger than those in Part 7. See FIGS. 6a-6d for a sketch of each of these cases.

A scratch test indicated that Part 7 was almost smooth, Part 8 was slightly rougher, Part 6 was much rougher, and finally Part 5 was the roughest of all. A visual inspection indicated that Part 7 looked best, followed by Part 8 or 6, then finally by Part 5.

The results of this experiment showed that the technique disclosed herein reduced waffle considerably. With the parameters used in this test, hatch strength appeared to be sufficient to support the skin without distortion.

Example V

Experiments were done to test the usefulness of "Weave" for building parts without increasing the vertical distortion of the parts or the need for adding additional supports.

In a first experiment 8 parts were built with the purpose of determining the most appropriate cure depths to use with the first pass of crosshatch in a weave building technique. The parts were built with 10 mil layers, using XB-5081 stereolithography resin, with a HeCd laser of 14.8 mW, and a beam diameter of 8.7 to 9.0 mils. The parts were built with boundaries and with X and Y hatch according to the "Weave" embodiment described earlier. That is, the spacing between crosshatch vectors was somewhat greater than the cure width associated with curing the vectors. The boundary vectors were given a 16 mil cure and the cure depth for the first pass of the crosshatch was varied from part to part. Adhesion between layers was obtained by the overcure of the boundaries and the net cure depth (overcure) of the intersection points of 2 equally exposed intersecting crosshatch vectors. The cure depths for the first pass of the crosshatch for different parts were 7, 8, 9, 10, 11, 12, 13, and 14 mils. It was found that the parts that used initial crosshatch exposures to obtain initial cure depths of 7, 8, and 9 mils showed no sign of curl but they did demonstrate adequate adhesion. The parts built with 10 mils and greater initial crosshatch cure depth demonstrated unacceptable curl. Therefore, it is concluded that the first exposure of crosshatch in the preferred weave embodiment should be based on a cured depth less than the layer thickness. It is possible that a cure depth somewhat greater than the layer thickness would be acceptable for certain materials that wouldn't show significant bonding between layers for small overcures.

A second experiment similar to the above was done to look at the most appropriate hatch spacing to use with the "Weave" building method. The material used was XB 5081, the layer thickness was 10 mils, the cure depth for boundaries was 12 mils, the cure depth for the first pass of crosshatch was 8 mils, and the beam diameter was 8.8 mils (maximum cure width=10 mils). The hatch spacing for the different parts were 3, 5, 7, 9, 11, 13, 15, and 17 mils. It was found that the parts built with spacings of 15 and 17 mils didn't have adequate structural integrity. The parts built with spacings of 3, 5, 7, and 9 mils showed unacceptable curl. Finally, the parts built with a spacing of 11 and 13 mils (as well as the parts built with spacings of 15 and 17 mils) showed no signs of excessive curl.

EXAMPLE VI

An experiment was done to compare the post cure distortion of parts built using the preferred "Weave" building method, the standard building method, and the standard spacing but staggered hatch building method.

This experiment consisted of building a series of parts with different building parameters. The parts were then cleaned and measured on a coordinate measuring machine (CMM). A first set of measurements measured the green (only partially cured) part. The parts were then identically postcured followed by another set of measurements of the parts on the CMM. This second set of measurements measured the fully cured part.

Figure 15A:
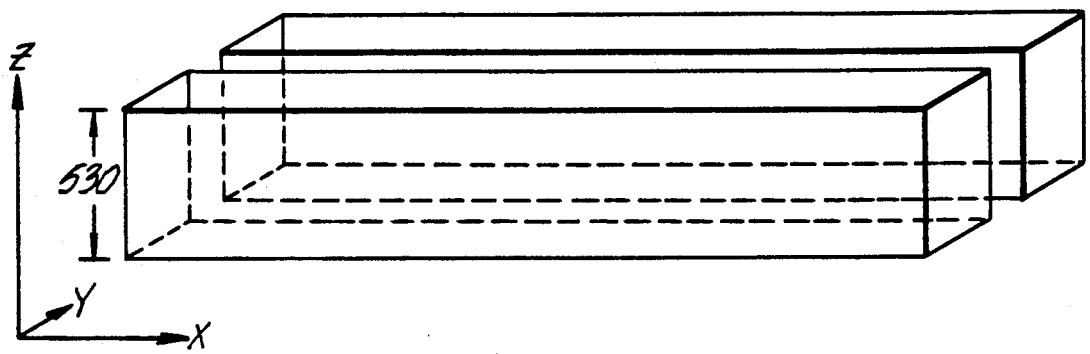
FIGS. 15a, 15b, and 15c collectively depict the part used in the experiment of Example VI.
Figure 15B:
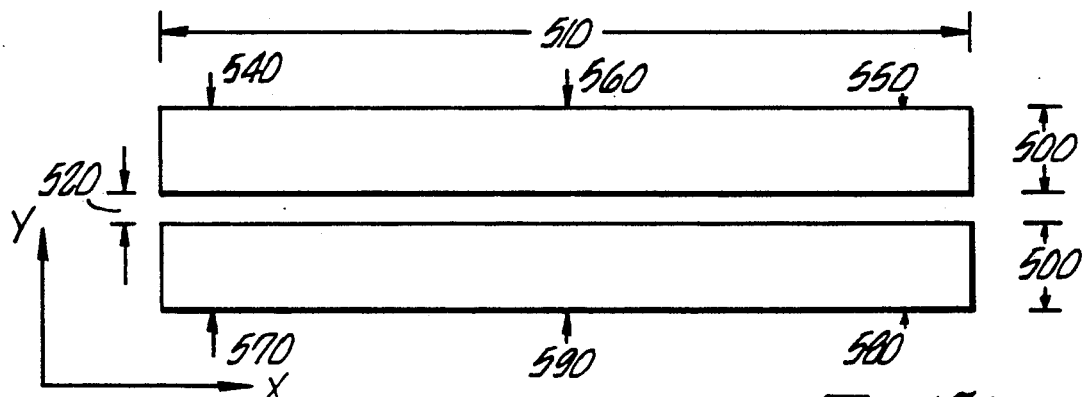

The parts used in this experiment are depicted in FIG. 15. FIG. 15a depicts two vertical walls built side by side with a small separation between them. The height of each wall 530 was 1.000 inch. The parts were built and measured while attached to Web Supports that were attached to the building platform (not shown). FIG. 15b depicts a top view of the two walls. The length of the walls 510 was 4.000 inches. The width of each wall 500 was 0.100 inches and the separation of the walls 520 was 0.050 inches. Building two substantially back to back walls allowed each wall to be post cured by synergistic stimulation coming from substantially one side of the wall. This one sided curing results in a predictable nonuniform cure of the object and therefore results in a predictable direction of distortion. The measurements made by the CMM on each wall are also depicted in FIG. 15b. Measurements 540, 550, 570, and 580 were made at approximately 50 mils (0.050 inches) from the edge of the wall and approximately 100 mils below the upper surface of the wall. Measurements 560 and 590 were made along the same edge of the wall and approximately 100 mils below the upper surface of the wall. Measurements 560 and 590 were made along the same edge of the wall and at the same vertical position as measurements 540 and 550 and measurements 570 and 580 respectively. They were made at the horizontal center of the edge of the wall.

Figure 15C:
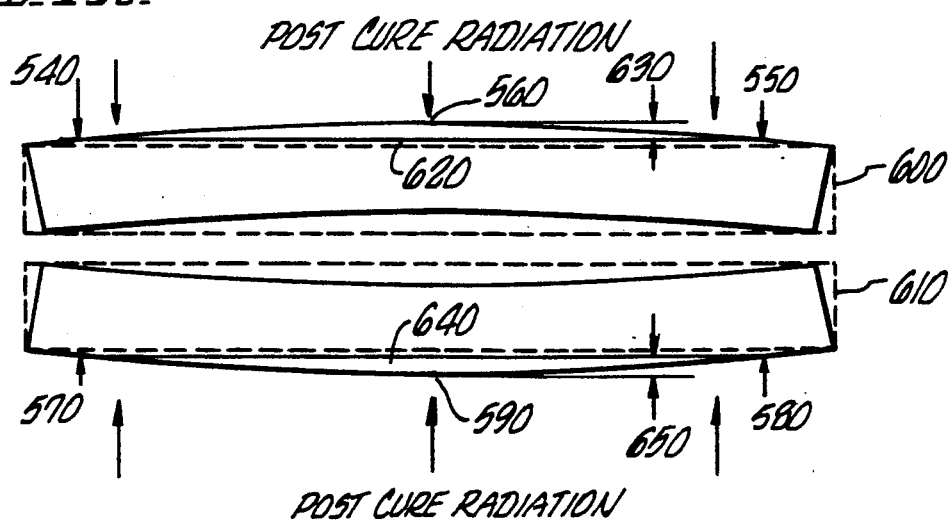

FIG. 15c depicts distortion of the walls induced by post curing. FIG. 15c depicts a top view of the walls. The dashed lines 600 and 610 represent the desired shape of the walls. Whereas the solid lines represent the actual shape of the walls. To determine the distortion of the first wall, the measurements of points 540 and 550 are connected by a straight line. The amount of distortion 630 is the length along the perpendicular distance between the line and point 560. To determine the distortion of the second wall, the measurements of points 570 and 580 are connected by a straight line. The amount of distortion 650 is the length along the perpendicular distance between the line and point 590.

The parts were built with 10 mil layers on a standard SLA-250, manufactured by 3D Systems, using a HeCd laser and building material "XB-5081", manufactured by Ciba-Geigy. The post curing was done in a PCA using 10–40 watt black light lamps. The cleaning of the parts was done ultrasonically in an alcohol bath for 2 minutes. Eight pairs of parts were built using the standard building technique (that is skinning only the up-facing and down-facing features of the object along with using widely spaced crosshatch to form the internal structure of the part). Four pairs of parts were built using the standard building technique with the modification of staggering the hatch from layer to layer. Two sets of parts were built using the weave approach.

It was found, from the green part measurements, that all the parts had practically no distortion after being removed from the vat and cleaned. The distortion of each part, at this stage, was less than 1 mil. Therefore to study post cure distortion we need only look at the post cure distortion data.

The results of the experiment are summarized below.

| Building Method | Average Distortion |
| --- | --- |
| Regular Hatch | 12.52 mils |
| Staggered Hatch | 8.11 mils |
| Weave | 1.76 mils |

From this table we see that both the Staggered hatch and Weave building techniques lead to a substantial decrease in post cure distortion. Weave is seen to be especially useful minimizing this distortion.

While several embodiments have been shown and described, it will be apparent to those skilled in the art that various modifications are possible without departing from the spirit and scope of the invention.

We claim:

1. In a stereolithographic method for constructing an object from a medium solidifiable upon exposure to synergistic stimulation, comprising the successive formation of layers of the medium applied to previously formed layers of the medium, each layer of the medium having a desired thickness, and selectively exposing the layers to synergistic stimulation in a pattern corresponding to cross-sections of the three-dimensional object, to build up the three-dimensional object layer by layer, the pattern including paths of exposure defined by vectors, with the exposure of the vectors resulting in a cure depth and a cure width, the improvement comprising the steps of:

partially solidifying a portion of a first layer according to a first set of vectors, the vectors of the first set being substantially parallel to each other with their exposure specified such that the resulting cure depth of the vectors of the first set is less than the desired thickness of the first layer of the medium and with adjacent vectors of the first set spaced apart from each other by at least the cure width; and at least partially solidifying the portion of the first layer with a second set of vectors with adjacent vectors of the second set spaced apart from each other by at least the cure width, the vectors of the second set being substantially parallel to each other and not parallel to the vectors of the first set, such that at least some of the vectors of the second set intersect at least some of the vectors of the first set, the vectors of the second set having exposure specified such that their resulting cure depth achieves adhesion to the previously formed layer only at points where vectors of the second set overlap vectors of the first set, with no adhesion occurring at points where vectors of the first set and second set do not overlap.

2. The method of claim 1 wherein the vectors of at least one of the first set and second set are spaced apart as closely as possible without inducing curl into adjacent vector or having curl induced in them by adjacent vectors.

3. The method of claim 2 wherein the separation between centers of adjacent vectors of the first set are within the range of the cure width plus 1 mil to the cure width plus 3 mils.

4. The method of claim 1 wherein the vectors of the first set have an exposure less than the exposure necessary to cause adhesion between the vectors of the first layer and the previously formed layer.

5. The method of claim 4 wherein the depth of cure of vectors of the first set is in the range of 1 to 3 mils less than the layer thickness.

6. The method of claim 1 further comprising the steps of repeating the steps of claim 7 on a second layer overlying the first layer, with the first set of vectors on the second layer offset from the first set of vectors on the first layer.

7. The method of claim 6 wherein the second set of vectors on the second layer is offset from the second set of vectors on the first layer.

8. The method of claim 7 wherein the offset of the vectors of the first and second set is perpendicular to the direction of the vectors of the first and second set respectively and the length of offset is approximately half the distance between adjacent vectors.

9. In a stereolithographic method for constructing an object from a medium solidifiable upon exposure to synergistic stimulation, comprising the successive formation of layers of the medium applied to previously formed layers of the medium, each layer of the medium having a desired thickness, and selectively exposing the layers to synergistic stimulation in a pattern corresponding to cross-sections of the three-dimensional object, to build up the three-dimensional object layer by layer, the pattern including paths of exposure defined by vectors, the improvement comprising the steps of:

providing a first boundary on at least a portion of a layer; and at least partially solidifying an area within the first boundary with a set of vectors, with at least one of the vectors of the set having at least one retracted end spaced apart from the first boundary such that the retracted end does not adhere to the first boundary.

10. The method of claim 9 further comprising the step of providing a second boundary offset from the first boundary and within the first boundary, with the second boundary adhering to the at least one retracted end.

11. The method of claim 9 wherein at least one end of a substantial number of the vectors are retracted and do not adhere to the boundary.

12. The method of claim 9 wherein a substantial number of the vectors have both ends retracted from and do not adhere to the boundary.

13. In a stereolithographic method for constructing an object from a medium solidifiable upon exposure to synergistic stimulation, comprising the successive formation of layers of the medium applied to previously formed layers of the medium, each layer of the medium having a desired thickness, and selectively exposing the layers to synergistic stimulation in a pattern corresponding to cross-sections of the three-dimensional object including at least one down-facing region, to build up the three-dimensional object layer by layer, the pattern including paths of exposure defined by vectors, with the exposure of the vectors resulting in a cure depth, the improvement comprising the step of:
providing sufficient synergistic stimulation to cause the thickness of the downfacing region to be cured to a depth substantially greater than the cure depth used to cause layer to layer adhesion.

14. In a stereolithographic method for constructing an object from a medium solidifiable upon exposure to synergistic stimulation, comprising the successive formation of layers of the medium above previously formed layers of the medium, each layer of the medium having a desired thickness, and selectively exposing the layers to synergistic stimulation in a pattern corresponding to cross-sections of the three-dimensional object, to build up the three-dimensional object layer by layer, the pattern including paths of exposure defined by vectors, with the exposure of the vectors resulting in a cure depth, the improvement comprising the step of:
identifying a downfacing region of the three-dimensional object on a first layer having a first layer thickness;
providing sufficient synergistic stimulation to the identified downfacing region to solidify the identified downfacing region to a first thickness of solidified material;
forming a second layer of medium over and adjacent to the first layer having a second layer thickness; and
solidifying at least a portion of the second layer by exposure to synergistic stimulation resulting in a second thickness of solidified medium at least partially above and at least indirectly adhered to the identified downfacing region, wherein the first thickness of solidified material is substantially greater than the second thickness.

15. The method of claim 14 wherein the first thickness of solidified material is approximately equal to the first layer thickness.

16. In a stereolithographic method for constructing an object from a medium solidifiable upon exposure to synergistic stimulation, comprising the successive formation of layers of the medium applied to previously formed layers of the medium, each layer of the medium having a desired thickness, and selectively exposing the layers to synergistic stimulation in a pattern corresponding to cross-sections of the three-dimensional object, to build up the three-dimensional object layer by layer, the pattern including paths of exposure defined by vectors, with the exposure of the vectors resulting in a cure depth and a cure width, the improvement comprising the steps of:
partially solidifying a portion of a first layer according to at least two sets of vectors wherein vectors in each set are approximately parallel to each other and wherein at least some of the vectors in each set intersect at least some of the vectors in any other set;
partially solidifying a portion of a second layer partially overlying the portion of the first layer according to sets of vectors comprising sets with parallel vectors to those vectors in the sets on the portion of the first layer wherein the vectors in the sets on the second layer are offset from vectors in the sets on the first layer.

17. The method of claim 16 wherein the vectors in the sets of vectors on the second layer are offset perpendicular to their lengths by approximately one half the separation of parallel adjacent vectors.

18. In a stereolithographic method for constructing an object from an medium solidifiable upon exposure to synergistic stimulation, comprising the successive formation of layers of the medium applied to previously formed layers of the medium and a down facing region, each layer of the medium having a desired thickness, and selectively exposing the layers to synergistic stimulation in a pattern corresponding to cross-sections of the three-dimensional object, to build up the three-dimensional object layer by layer, the pattern including paths of exposure defined by vectors, with the exposure of the vectors resulting in a cure depth, the improvement comprising the step of:
at least partially solidifying a portion of the first layer with a first set of vectors with at least one floating vector of the first set of vectors adhered to the previously formed layer at one anchor point;
at least partially solidifying the portion with a second set of vectors which adhere at least one floating vector, which is adhered at one anchor point, to the previously formed layer at multiple anchor points.

* * * * *